United States Patent
Yamazaki

(10) Patent No.: US 11,211,499 B2
(45) Date of Patent: Dec. 28, 2021

(54) SEMICONDUCTOR DEVICE AND MANUFACTURING METHOD THEREOF

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/973,835

(22) Filed: May 8, 2018

(65) Prior Publication Data
US 2018/0261699 A1    Sep. 13, 2018

Related U.S. Application Data

(63) Continuation of application No. 12/880,259, filed on Sep. 13, 2010, now abandoned.

(30) Foreign Application Priority Data

Sep. 16, 2009 (JP) .................................. 2009-214485

(51) Int. Cl.
H01L 29/10      (2006.01)
H01L 29/786    (2006.01)
H01L 27/12      (2006.01)

(52) U.S. Cl.
CPC ...... H01L 29/7869 (2013.01); H01L 27/1225 (2013.01); H01L 2924/0002 (2013.01)

(58) Field of Classification Search
CPC ............... H01L 27/225; H01L 29/7869; H01L 27/1225; H01L 27/124; H01L 27/1248;
(Continued)

(56) References Cited

U.S. PATENT DOCUMENTS 5,155,564 A    10/1992  Hishida et al.
5,383,041 A     1/1995  Yamazaki et al.
(Continued)

FOREIGN PATENT DOCUMENTS

CN    101533857 A    9/2009
EP      0989614 A    3/2000
(Continued)

OTHER PUBLICATIONS

Jung et al., "Effect of Heat Treatment on Electrical Properties of Amorphous Oxide Semiconductor In—Ga—Zn—O Film as a Function of Oxygen Flow Rate," Japanese Journal of Applied Physics 48 (2009) 08HK02.*

(Continued)

Primary Examiner — Jay C Kim
(74) Attorney, Agent, or Firm — Robinson Intellectual Property Law Office; Eric J. Robinson

(57) ABSTRACT

It is an object to provide a semiconductor device with less power consumption as a semiconductor device including a thin film transistor using an oxide semiconductor layer. It is an object to provide a semiconductor device with high reliability as a semiconductor device including a thin film transistor using an oxide semiconductor layer. In the semiconductor device, a gate electrode layer (a gate wiring layer) intersects with a wiring layer which is electrically connected to a source electrode layer or a drain electrode layer with an insulating layer which covers the oxide semiconductor layer of the thin film transistor and a gate insulating layer interposed therebetween. Accordingly, the parasitic capacitance formed by a stacked-layer structure of the gate electrode layer, the gate insulating layer, and the source or drain electrode layer can be reduced, so that low power consumption of the semiconductor device can be realized.

2 Claims, 27 Drawing Sheets

(58) Field of Classification Search
CPC ... H01L 29/04; H01L 29/06; H01L 29/78606; H01L 29/78696

See application file for complete search history.

(56) References Cited

U.S. PATENT DOCUMENTS

| | | | | |
|---|---|---|---|---|
| 5,478,766 | A | 12/1995 | Park et al. | |
| 5,500,538 | A | 3/1996 | Yamazaki et al. | |
| 5,731,856 | A | 3/1998 | Kim et al. | |
| 5,744,864 | A | 4/1998 | Cillessen et al. | |
| 5,808,595 | A | 9/1998 | Kubota et al. | |
| 5,847,410 | A | 12/1998 | Nakajima | |
| 6,144,082 | A | 11/2000 | Yamazaki et al. | |
| 6,294,274 | B1 | 9/2001 | Kawazoe et al. | |
| 6,359,320 | B1 | 3/2002 | Yamazaki et al. | |
| 6,380,558 | B1 | 4/2002 | Yamazaki et al. | |
| 6,459,124 | B1 | 10/2002 | Zhang et al. | |
| 6,528,360 | B2 | 3/2003 | Zhang et al. | |
| 6,532,045 | B2 | 3/2003 | Chung et al. | |
| 6,563,174 | B2 | 5/2003 | Kawasaki et al. | |
| 6,586,346 | B1 | 7/2003 | Yamazaki et al. | |
| 6,645,826 | B2 | 11/2003 | Yamazaki et al. | |
| 6,727,522 | B1 | 4/2004 | Kawasaki et al. | |
| 6,730,550 | B1 | 5/2004 | Yamazaki et al. | |
| 6,737,717 | B2 | 5/2004 | Yamazaki et al. | |
| 6,744,479 | B2 | 6/2004 | Hasegawa | |
| 6,784,032 | B2 | 8/2004 | Lee et al. | |
| 6,784,413 | B2 | 8/2004 | Sasaki et al. | |
| 6,825,497 | B2 | 11/2004 | Lai | |
| 6,960,812 | B2 | 11/2005 | Yamazaki et al. | |
| 7,015,505 | B2 | 3/2006 | Yamazaki et al. | |
| 7,033,951 | B2 | 4/2006 | Kido | |
| 7,049,190 | B2 | 5/2006 | Takeda et al. | |
| 7,061,014 | B2 | 6/2006 | Hosono et al. | |
| 7,064,346 | B2 | 6/2006 | Kawasaki et al. | |
| 7,098,088 | B2 | 8/2006 | Yamazaki et al. | |
| 7,105,868 | B2 | 9/2006 | Nause et al. | |
| 7,132,686 | B2 | 11/2006 | Yamazaki et al. | |
| 7,211,825 | B2 | 5/2007 | Shih et al. | |
| 7,245,297 | B2 | 7/2007 | Kimura et al. | |
| 7,282,782 | B2 | 10/2007 | Hoffman et al. | |
| 7,297,977 | B2 | 11/2007 | Hoffman et al. | |
| 7,301,211 | B2 | 11/2007 | Yamazaki et al. | |
| 7,323,356 | B2 | 1/2008 | Hosono et al. | |
| 7,371,625 | B2 | 5/2008 | Yamazaki et al. | |
| 7,385,224 | B2 | 6/2008 | Ishii et al. | |
| 7,402,506 | B2 | 7/2008 | Levy et al. | |
| 7,410,847 | B2 | 8/2008 | Yamazaki et al. | |
| 7,411,209 | B2 | 8/2008 | Endo et al. | |
| 7,411,215 | B2 | 8/2008 | Hayakawa et al. | |
| 7,439,086 | B2 | 10/2008 | Yamazaki et al. | |
| 7,443,202 | B2 | 10/2008 | Kimura et al. | |
| 7,453,065 | B2* | 11/2008 | Saito | H01L 27/14601 250/338.4 |
| 7,453,087 | B2 | 11/2008 | Iwasaki | |
| 7,462,862 | B2 | 12/2008 | Hoffman et al. | |
| 7,468,304 | B2 | 12/2008 | Kaji et al. | |
| 7,476,577 | B2 | 1/2009 | Yamazaki et al. | |
| 7,501,293 | B2 | 3/2009 | Ito et al. | |
| 7,601,984 | B2 | 10/2009 | Sano et al. | |
| 7,622,371 | B2* | 11/2009 | Pan | B82Y 10/00 438/500 |
| 7,663,404 | B2 | 2/2010 | Kimura et al. | |
| 7,666,764 | B2* | 2/2010 | Ho | H01L 29/66969 438/483 |
| 7,674,650 | B2 | 3/2010 | Akimoto et al. | |
| 7,687,802 | B2 | 3/2010 | Kang et al. | |
| 7,732,819 | B2 | 6/2010 | Akimoto et al. | |
| 7,737,442 | B2 | 6/2010 | Yamazaki et al. | |
| 7,749,825 | B2 | 7/2010 | Honda | |
| 7,760,921 | B2 | 7/2010 | Sawano | |
| 7,791,072 | B2* | 9/2010 | Kumomi | H01L 29/7869 257/57 |
| 7,804,088 | B2 | 9/2010 | Tanaka et al. | |
| 7,807,999 | B2 | 10/2010 | Kim et al. | |
| 7,829,444 | B2* | 11/2010 | Yabuta | H01L 29/78618 257/E21.497 |
| 7,859,187 | B2 | 12/2010 | Yamazaki et al. | |
| 7,868,326 | B2* | 1/2011 | Sano | H01L 29/51 257/58 |
| 7,872,259 | B2* | 1/2011 | Den | G03G 5/08 257/59 |
| 7,884,360 | B2* | 2/2011 | Takechi | H01L 29/4908 257/52 |
| 7,910,490 | B2 | 3/2011 | Akimoto et al. | |
| 7,932,521 | B2 | 4/2011 | Akimoto et al. | |
| 7,935,964 | B2 | 5/2011 | Kim et al. | |
| 7,961,006 | B2 | 6/2011 | Kimura et al. | |
| 7,977,151 | B2* | 7/2011 | Shieh | H01L 29/66969 438/104 |
| 7,998,372 | B2 | 8/2011 | Yano et al. | |
| 8,063,421 | B2 | 11/2011 | Kang et al. | |
| 8,071,985 | B2 | 12/2011 | Sakurai et al. | |
| 8,084,307 | B2 | 12/2011 | Itagaki et al. | |
| 8,129,719 | B2* | 3/2012 | Yamazaki | H01L 21/02323 257/43 |
| 8,134,154 | B2 | 3/2012 | Gosain et al. | |
| 8,134,156 | B2 | 3/2012 | Akimoto | |
| 8,149,346 | B2 | 4/2012 | Kimura | |
| 8,168,544 | B2 | 5/2012 | Chang | |
| 8,178,884 | B2* | 5/2012 | Ha | H01L 29/7869 257/72 |
| 8,193,045 | B2 | 6/2012 | Omura et al. | |
| 8,202,365 | B2* | 6/2012 | Umeda | H01L 21/02565 117/9 |
| 8,207,530 | B2* | 6/2012 | Kim | H01L 29/7869 257/43 |
| 8,207,756 | B2 | 6/2012 | Shionoiri et al. | |
| 8,222,098 | B2 | 7/2012 | Honda | |
| 8,236,635 | B2 | 8/2012 | Suzawa et al. | |
| 8,242,494 | B2 | 8/2012 | Suzawa et al. | |
| 8,253,134 | B2* | 8/2012 | Kim | H01L 29/78696 257/43 |
| 8,274,077 | B2 | 9/2012 | Akimoto et al. | |
| 8,283,671 | B2 | 10/2012 | Kim et al. | |
| 8,288,768 | B2* | 10/2012 | Kim | H01L 29/7869 257/43 |
| 8,304,765 | B2* | 11/2012 | Yamazaki | G02F 1/13458 257/43 |
| 8,304,773 | B2 | 11/2012 | Shimada | |
| 8,309,961 | B2 | 11/2012 | Yamazaki et al. | |
| 8,319,215 | B2 | 11/2012 | Yamazaki et al. | |
| 8,324,629 | B2* | 12/2012 | Jeong | H01L 51/5215 257/72 |
| 8,339,031 | B2* | 12/2012 | Tchakarov | H01L 51/5203 313/503 |
| 8,343,799 | B2 | 1/2013 | Ito et al. | |
| 8,343,800 | B2* | 1/2013 | Umeda | H01L 21/02667 438/104 |
| 8,354,674 | B2 | 1/2013 | Kimura | |
| 8,384,077 | B2* | 2/2013 | Yano | H01L 29/78603 257/43 |
| 8,384,082 | B2* | 2/2013 | Kim | H01L 21/02118 257/40 |
| 8,399,274 | B2 | 3/2013 | Kang et al. | |
| 8,421,083 | B2 | 4/2013 | Yamazaki et al. | |
| 8,426,937 | B2 | 4/2013 | Otani et al. | |
| 8,431,927 | B2* | 4/2013 | Kim | H01L 29/7869 257/43 |
| 8,436,342 | B2* | 5/2013 | Park | H01L 27/1229 257/40 |
| 8,466,463 | B2 | 6/2013 | Akimoto et al. | |
| 8,466,465 | B2 | 6/2013 | Jeong et al. | |
| 8,471,596 | B2 | 6/2013 | Kimura et al. | |
| 8,570,468 | B2 | 10/2013 | Moon et al. | |
| 8,618,543 | B2* | 12/2013 | Lee | H01L 21/02554 257/43 |
| 8,618,545 | B2 | 12/2013 | Gosain et al. | |
| 8,629,069 | B2 | 1/2014 | Akimoto et al. | |
| 8,641,932 | B2* | 2/2014 | Yano | C04B 35/453 204/192.15 |
| 8,669,550 | B2 | 3/2014 | Akimoto et al. | |

(56) References Cited

U.S. PATENT DOCUMENTS

| | | | |
|---|---|---|---|
| 8,785,240 B2* | 7/2014 | Watanabe | H01L 27/1214 438/104 |
| 8,785,990 B2 | 7/2014 | Honda | |
| 8,790,959 B2 | 7/2014 | Akimoto et al. | |
| 8,796,069 B2 | 8/2014 | Akimoto et al. | |
| 8,884,272 B2 | 11/2014 | Hama et al. | |
| 9,099,562 B2 | 8/2015 | Akimoto et al. | |
| 9,153,635 B2 | 10/2015 | Tateishi et al. | |
| 9,209,311 B2* | 12/2015 | Ueda | B82Y 10/00 |
| 9,306,078 B2* | 4/2016 | Shieh | H01L 29/04 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0134981 A1 | 9/2002 | Nakamura et al. | |
| 2002/0197544 A1 | 12/2002 | Iwasaki | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0247961 A1* | 11/2005 | Zhou | G01N 27/4146 257/213 |
| 2005/0276912 A1 | 12/2005 | Yamamoto et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0157855 A1 | 7/2006 | Kamakura | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0087487 A1 | 4/2007 | Honda | |
| 2007/0090365 A1 | 4/2007 | Hayashi et al. | |
| 2007/0093002 A1 | 4/2007 | Maekawa et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0231974 A1 | 10/2007 | Chiu et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0032431 A1 | 2/2008 | Hsu et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0265254 A1 | 10/2008 | Nishiura | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008638 A1 | 1/2009 | Kang et al. | |
| 2009/0008639 A1 | 1/2009 | Akimoto et al. | |
| 2009/0061721 A1 | 3/2009 | Isa | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0081826 A1 | 3/2009 | Cowdery-Corvan et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0250695 A1* | 10/2009 | Tanaka | H01L 27/124 257/43 |
| 2009/0278122 A1 | 11/2009 | Hosono et al. | |
| 2009/0280600 A1 | 11/2009 | Hosono et al. | |
| 2009/0295699 A1* | 12/2009 | Korenari | H01L 27/1214 345/92 |
| 2009/0315026 A1* | 12/2009 | Jeong | H01L 29/45 257/43 |
| 2009/0321731 A1* | 12/2009 | Jeong | H01L 29/7869 257/43 |
| 2009/0321732 A1* | 12/2009 | Kim | H01L 29/78606 257/43 |
| 2010/0025678 A1 | 2/2010 | Yamazaki et al. | |
| 2010/0051933 A1 | 3/2010 | Kim et al. | |
| 2010/0051949 A1 | 3/2010 | Yamazaki et al. | |
| 2010/0053041 A1* | 3/2010 | Abe | G09G 3/325 345/76 |
| 2010/0065839 A1 | 3/2010 | Yamazaki et al. | |
| 2010/0065840 A1 | 3/2010 | Yamazaki et al. | |
| 2010/0065844 A1 | 3/2010 | Tokunaga | |
| 2010/0072467 A1 | 3/2010 | Yamazaki et al. | |
| 2010/0084648 A1 | 4/2010 | Watanabe | |
| 2010/0084650 A1 | 4/2010 | Yamazaki et al. | |
| 2010/0092800 A1 | 4/2010 | Itagaki et al. | |
| 2010/0102312 A1 | 4/2010 | Yamazaki et al. | |
| 2010/0105163 A1 | 4/2010 | Ito et al. | |
| 2010/0109002 A1 | 5/2010 | Itagaki et al. | |
| 2010/0117075 A1 | 5/2010 | Akimoto et al. | |
| 2010/0123136 A1 | 5/2010 | Lee et al. | |
| 2010/0136775 A1 | 6/2010 | Choi et al. | |
| 2010/0167464 A1 | 7/2010 | Yamazaki | |
| 2010/0176394 A1 | 7/2010 | Park et al. | |
| 2010/0193785 A1 | 8/2010 | Kimura | |
| 2010/0264420 A1 | 10/2010 | Honda | |
| 2010/0295042 A1* | 11/2010 | Yano | H01L 29/7869 257/43 |
| 2010/0301329 A1 | 12/2010 | Asano et al. | |
| 2011/0006297 A1* | 1/2011 | Inoue | H01L 29/7869 257/43 |
| 2011/0062436 A1 | 3/2011 | Yamazaki et al. | |
| 2011/0104851 A1 | 5/2011 | Akimoto et al. | |
| 2011/0117698 A1 | 5/2011 | Suzawa et al. | |
| 2011/0121290 A1 | 5/2011 | Akimoto et al. | |
| 2015/0340513 A1 | 11/2015 | Akimoto et al. | |
| 2019/0051759 A1 | 2/2019 | Akimoto et al. | |
| 2019/0157314 A1 | 5/2019 | Kimura | |

FOREIGN PATENT DOCUMENTS

| | | |
|---|---|---|
| EP | 1737044 A | 12/2006 |
| EP | 1770788 A | 4/2007 |
| EP | 1995787 A | 11/2008 |

(56) References Cited

FOREIGN PATENT DOCUMENTS

| | | | |
|---|---|---|---|
| EP | 1998373 A | 12/2008 | |
| EP | 1998374 A | 12/2008 | |
| EP | 1998375 A | 12/2008 | |
| EP | 2226847 A | 9/2010 | |
| EP | 2453480 A | 5/2012 | |
| EP | 2453481 A | 5/2012 | |
| EP | 2455975 A | 5/2012 | |
| JP | 60-198861 A | 10/1985 | |
| JP | 63-208896 A | 8/1988 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 03-231472 A | 10/1991 | |
| JP | 04-220627 A | 8/1992 | |
| JP | 05-251705 A | 9/1993 | |
| JP | 08-264794 A | 10/1996 | |
| JP | 10-107293 A | 4/1998 | |
| JP | 10-209463 A | 8/1998 | |
| JP | 11-505377 | 5/1999 | |
| JP | 2000-044236 A | 2/2000 | |
| JP | 2000-150900 A | 5/2000 | |
| JP | 2000-156504 A | 6/2000 | |
| JP | 2000-269510 A | 9/2000 | |
| JP | 2002-076356 A | 3/2002 | |
| JP | 2002-131783 A | 5/2002 | |
| JP | 2002-289859 A | 10/2002 | |
| JP | 2003-086000 A | 3/2003 | |
| JP | 2003-086808 A | 3/2003 | |
| JP | 3488590 | 1/2004 | |
| JP | 2004-103957 A | 4/2004 | |
| JP | 2004-273614 A | 9/2004 | |
| JP | 2004-273732 A | 9/2004 | |
| JP | 2005-165300 A | 6/2005 | |
| JP | 2005-190992 A | 7/2005 | |
| JP | 2006-215086 A | 8/2006 | |
| JP | 2007-096055 A | 4/2007 | |
| JP | 2007-115902 A | 5/2007 | |
| JP | 2007-123861 A | 5/2007 | |
| JP | 2007-134687 A | 5/2007 | |
| JP | 2007-150158 A | 6/2007 | |
| JP | 2007-250983 A | 9/2007 | |
| JP | 2008-009418 A | 1/2008 | |
| JP | 2008-040492 A | 2/2008 | |
| JP | 2008-130814 A | 6/2008 | |
| JP | WO 2008/096768 * | 8/2008 | ........... H01L 21/336 |
| JP | 2008-219008 A | 9/2008 | |
| JP | WO 2008/126879 * | 10/2008 | ............. H01L 27/32 |
| JP | 2008-281988 A | 11/2008 | |
| JP | 2009-021612 A | 1/2009 | |
| JP | 2009-033145 A | 2/2009 | |
| JP | 2009-141001 A | 6/2009 | |
| JP | 2009-224354 A | 10/2009 | |
| KR | 2007-0090182 A | 9/2007 | |
| KR | 2009-0002841 A | 1/2009 | |
| TW | 538304 | 6/2003 | |
| WO | WO-2004/057411 | 7/2004 | |
| WO | WO-2004/114391 | 12/2004 | |
| WO | WO-2005/048221 | 5/2005 | |
| WO | WO-2005/048353 | 5/2005 | |
| WO | WO-2006/051993 | 5/2006 | |
| WO | WO-2007/043493 | 4/2007 | |
| WO | WO-2007/058231 | 5/2007 | |
| WO | WO-2007/119386 | 10/2007 | |
| WO | WO-2008/062720 | 5/2008 | |
| WO | WO-2008/126879 | 10/2008 | |
| WO | WO-2008/149873 | 12/2008 | |
| WO | WO-2009/072533 | 6/2009 | |
| WO | WO-2009/093625 | 7/2009 | |

OTHER PUBLICATIONS

Kim et al., "Effect of indium composition ratio on solution-processed nanocrystalline InGaZnO thin film transistors,"Applied Physics Letters 94 (2009) 233501.*

Hossain et al., "Modeling and simulation of polycrystalline ZnO thin-film transistors," (2003).*

Jayaraj et al., "Optical and electrical properties of amorphous zinc tin oxide thin films examined for thin film transistor application", Journal of Vacuum Science & Technology B 26 (2008) pp. 495-501.*

Park et al., "Novel ZrInZnO Thin-film Transistor with Excellent Stability,"Advanced Materials 21 (2009) pp. 329-333.*

Kim et al., "Formation Mechanism of Solution-Processed Nanocrystalline InGaZnO Thin Film as Active Channel Layer in Thin-Film Transistor," Journal of The Electrochemical Society, 156 (2009) pp. H7-H9.*

Kim et al., "Growth of Transparent nc-InGaO3(ZnO)2 Thin Films with Indium mol Ratios Using Solution Process,"Journal of The Electrochemical Society, 155 (2008) pp. H848-H851.*

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for Amoled Backplane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09, Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

International Search Report (Application No. PCT/JP2010/064543) dated Nov. 22, 2010.

Written Opinion (Application No. PCT/JP2010/064543) dated Nov. 22, 2010.

Korean Office Action (Application No. 2013-7019003) dated Apr. 24, 2014.

Taiwanese Office Action (Application No. 102126284) dated Jan. 22, 2015.

Taiwanese Office Action (Application No. 105135953) dated May 18, 2017.

* cited by examiner

FIG. 1A1
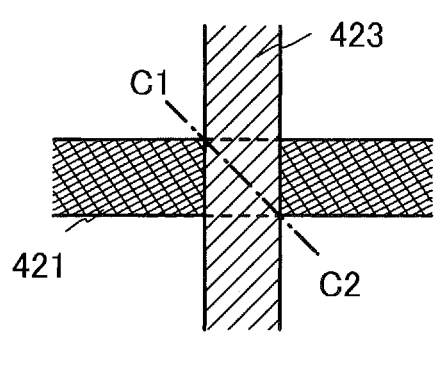
FIG. 1A2
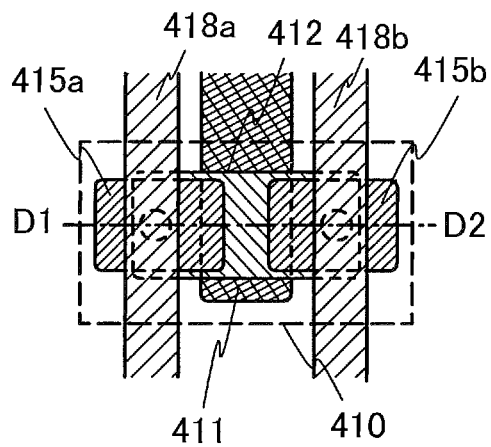
FIG. 1B
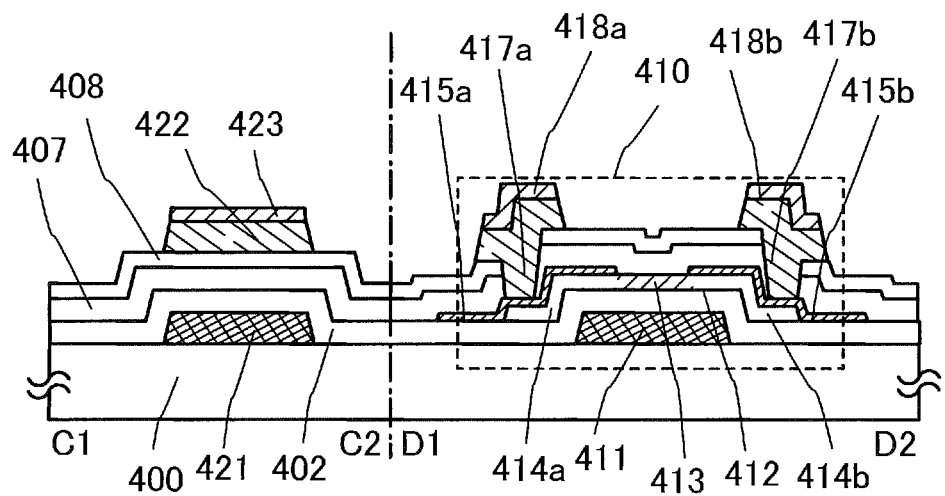

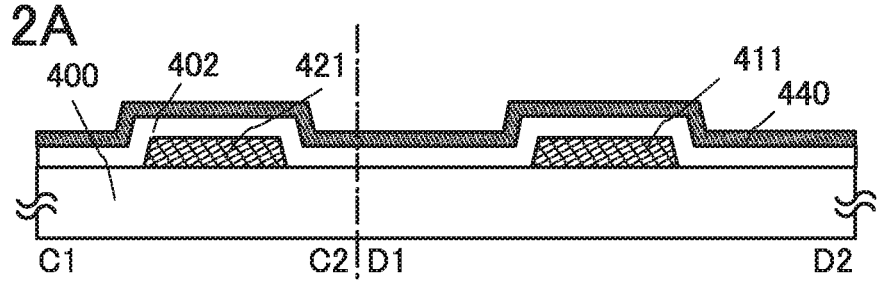
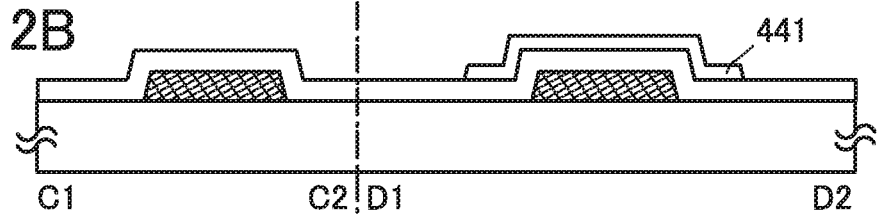
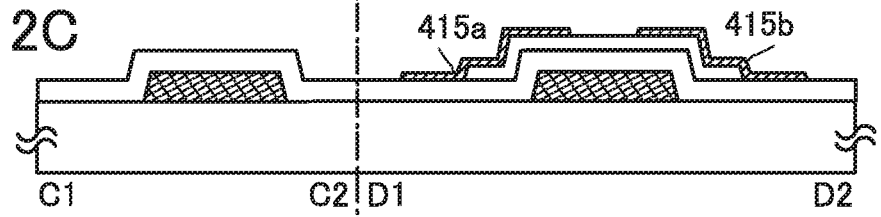
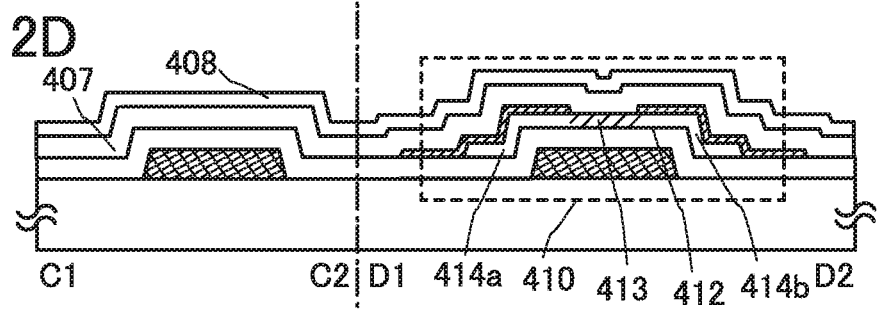
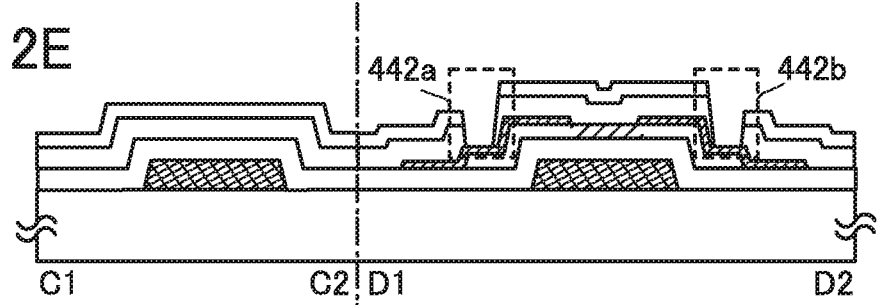
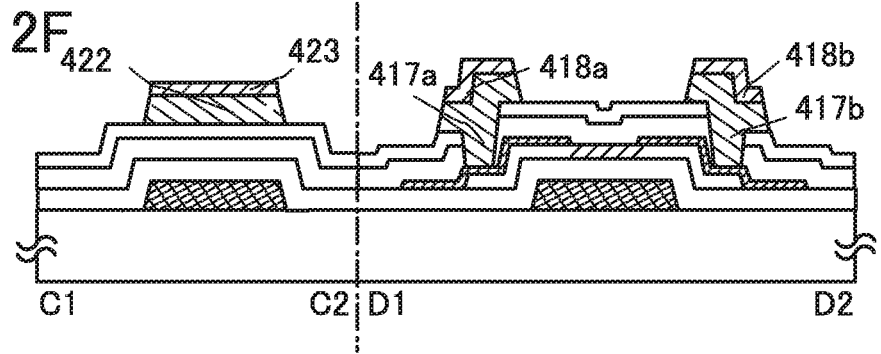

FIG. 3A1
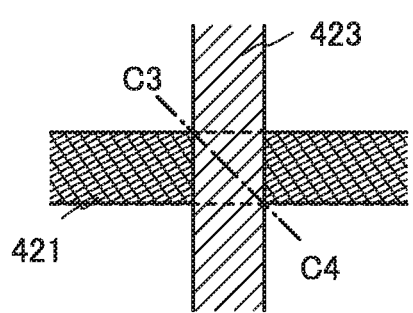
FIG. 3A2
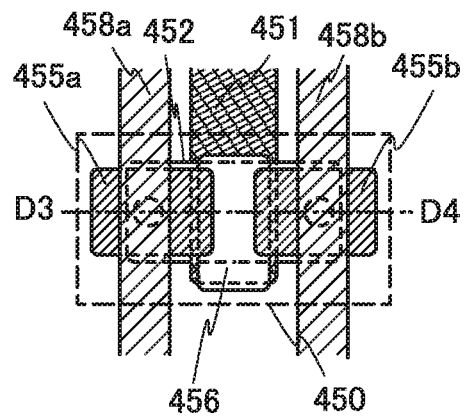
FIG. 3B
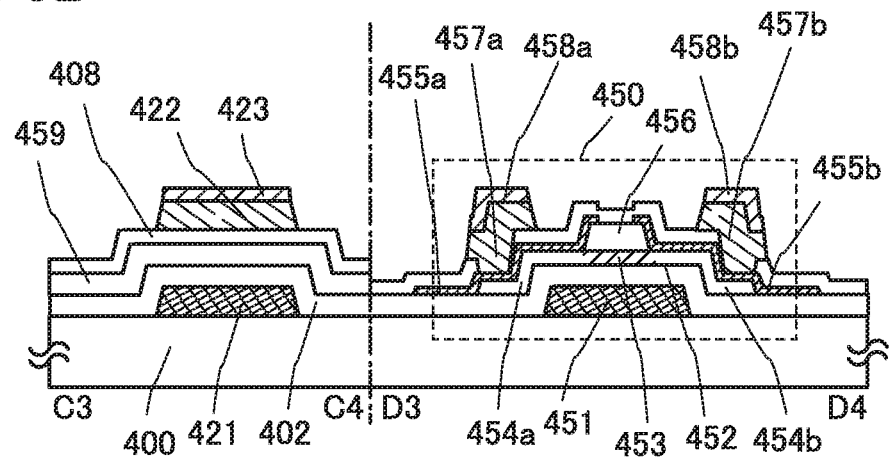

FIG. 25A
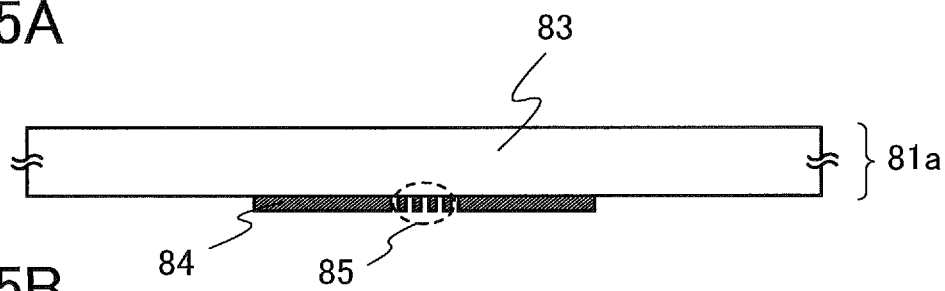
FIG. 25B
Light transmittance
FIG. 25C
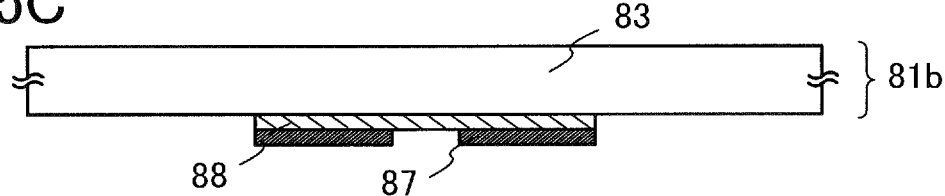
FIG. 25D
Light transmittance

SEMICONDUCTOR DEVICE AND MANUFACTURING METHOD THEREOF

TECHNICAL FIELD

The present invention relates to a semiconductor device including an oxide semiconductor and a manufacturing method thereof.

In this specification, a semiconductor device means any device which can function by utilizing semiconductor characteristics; an electrooptical device, a semiconductor circuit, and an electronic appliance are all semiconductor devices.

BACKGROUND ART

In recent years, a technique for forming a thin film transistor (TFT) by using a semiconductor thin film (having a thickness of about several nanometers to several hundred nanometers) formed over a substrate having an insulating surface has attracted attention. Thin film transistors are applied to a wide range of electronic devices such as ICs or electrooptical devices, and particularly, prompt development of thin film transistors that are to be used as switching elements in image display devices is being pushed. Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, zinc oxide, and the like. Thin film transistors in which a channel formation region is formed using such metal oxides having semiconductor characteristics are known (see Patent Documents 1 and 2).

As examples of electronic devices using thin film transistors, mobile devices such as mobile phones or laptop computers can be given. Power consumption that affects the continuous operation time is a serious concern for such a mobile electronic device. Further, also for a television set which has grown in size, it is necessary to suppress the increase of power consumption by the increase in size.

REFERENCE

Patent Document 1

Japanese Published Patent Application No. 2007-123861

Patent Document 2

Japanese Published Patent Application No. 2007-096055

DISCLOSURE OF INVENTION

It is an object of the present invention to provide a semiconductor device with less power consumption as a semiconductor device including a thin film transistor using an oxide semiconductor layer.

It is an object of the present invention to provide a semiconductor device with high reliability as a semiconductor device including a thin film transistor using an oxide semiconductor layer.

In a semiconductor device, a gate electrode layer (a gate wiring layer) intersects with a wiring layer which is electrically connected to a source electrode layer or a drain electrode layer with an insulating layer which covers an oxide semiconductor layer of a thin film transistor and a gate insulating layer interposed therebetween. Except that the gate electrode layer of the thin film transistor partly overlaps the source and drain electrode layers over the oxide semiconductor layer, a stacked-layer structure of the gate electrode layer, the gate insulating layer, and the source or drain electrode layer is not formed.

Accordingly, the parasitic capacitance formed by the stacked-layer structure of the gate electrode layer, the gate insulating layer, and the source or drain electrode layer can be reduced, so that low power consumption of the semiconductor device can be realized.

One embodiment of the present invention is a semiconductor device which includes: a gate electrode layer, a gate insulating layer over the gate electrode layer, an oxide semiconductor layer over the gate insulating layer, a source and drain electrode layers over the oxide semiconductor layer, an oxide insulating layer over the source and drain electrode layers, which is in contact with the oxide semiconductor layer, and a wiring layer over the oxide insulating layer, which is electrically connected to the source or drain electrode layer. An opening is formed in the oxide insulating layer so as to reach the source or drain electrode layer, the wiring layer is in contact with the source or drain electrode layer in the opening, and the gate electrode layer and the wiring layer overlap each other with the gate insulating layer and the oxide semiconductor layer interposed therebetween.

It is preferable that the source and drain electrode layers are as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced.

It is preferable that the source and drain electrode layers are formed using a material including a metal with high oxygen affinity. It is preferable that the metal with high oxygen affinity be one or more materials selected from titanium, aluminum, manganese, magnesium, zirconium, beryllium, and thorium. In this embodiment, a titanium film is used as each of the source and drain electrode layers.

When thermal treatment is performed while the oxide semiconductor layer and the metal layer with high oxygen affinity are in contact with each other, oxygen atoms move from the oxide semiconductor layer to the metal layer, so that the carrier density in the vicinity of the interface therebetween is increased. A low-resistance region is formed in the vicinity of the interface therebetween, thereby reducing the contact resistance between the oxide semiconductor layer and the source and drain electrode layers.

A heat-resistant conductive material may be used in the source and drain electrode layers. By using the heat-resistant conductive material, the change of properties or degradation of the source and drain electrode layers can be prevented even when thermal treatment is performed after the formation of the source and drain electrode layers.

As the heat-resistant conductive material, an element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. A conductive film in which a low-resistant conductive material such as aluminum (Al) or copper (Cu) is combined with the above-described heat-resistant conductive material may be used.

The source and drain electrode layers may include a metal oxide layer. For example, a structure in which a titanium oxide film is provided between an oxide semiconductor layer and a titanium film, or a structure in which a titanium oxide film (for example, having a thickness greater than or equal to 1 nm and less than or equal to 20 nm) is provided between a titanium film (for example, having a thickness greater than or equal to 0.1 nm and less than or equal to 5 nm) and an oxide insulating layer may be employed.

When the source and drain electrode layers are as thin as light is transmitted, the source and drain electrode layers have light-transmitting properties.

The wiring layer is formed using a conductive film having a resistance lower than that of the source and drain electrode layers. In particular, the wiring layer can be formed to have a single-layer or stacked-layer structure using a metal material such as aluminum, copper, chromium, tantalum, molybdenum, tungsten, titanium, neodymium, or scandium, or an alloy material which contains any of these materials as its main component. In this embodiment, an aluminum film and a titanium film are used as a first wiring layer and a second wiring layer to form a stacked-layer structure as the wiring layer.

One embodiment of the present invention is a method for manufacturing a semiconductor device, in which a gate electrode layer is formed, a gate insulating layer is formed over the gate electrode layer, an oxide semiconductor layer is formed over the gate insulating layer, the oxide semiconductor layer is subjected to dehydration or dehydrogenation and then is prevented from being exposed to air so that entry of water or hydrogen is prevented, a source and drain electrode layers are formed over the oxide semiconductor layer, an oxide insulating layer which is in contact with part of the oxide semiconductor layer is formed over the oxide semiconductor layer and the source and drain electrode layers, an opening which reaches the source or drain electrode layer is formed in the oxide insulating layer, and a wiring layer which is in contact with the source or drain electrode layer and partly overlaps the gate electrode layer with the gate insulating layer and the oxide insulating layer interposed therebetween is formed in the opening. The wiring layer is thinner than the source and drain electrode layers and has lower resistance than the same.

With each of the above-described structures, at least one of the above-described objects can be achieved.

The oxide semiconductor layer is a thin film of $InMO_3(ZnO)_m$ (m>0). A thin film transistor is formed using the thin film as an oxide semiconductor layer. Note that M denotes one or a plurality of metal elements selected from Ga, Fe, Ni, Mn, and Co. For example, M may be Ga or may include the above-described metal element in addition to Ga, for example, M may be Ga and Ni or M may be Ga and Fe. In the above-described oxide semiconductor, a transition metal element such as Fe or Ni or an oxide of the transition metal may be included as an impurity element in addition to the metal element included as M. In this specification, an oxide semiconductor layer whose composition formula is represented as $InMO_3(ZnO)_m$ (m>0) where at least Ga is included as M is referred to as an In—Ga—Zn—O-based oxide semiconductor, and a thin film thereof is also referred to as an In—Ga—Zn—O-based non-single-crystal film.

As other examples of the metal oxide applicable to the oxide semiconductor layer, any of the following metal oxides can be applied: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be included in the oxide semiconductor layer formed using the above-described metal oxide.

The dehydration or dehydrogenation is heat treatment performed in an atmosphere of an inert gas such as nitrogen or a rare gas (such as argon or helium) at a temperature greater than or equal to 400° C. and less than or equal to 750° C., preferably greater than or equal to 425° C. and less than the strain point of a substrate, so that impurities such as moisture included in the oxide semiconductor layer are reduced. Further, entrance of water ($H_2O$) can be prevented.

The thermal treatment for dehydration or dehydrogenation is preferably performed in a nitrogen atmosphere with an $H_2O$ concentration of 20 ppm or lower. Alternatively, the thermal treatment may be performed in ultra-dry air with an $H_2O$ concentration of 20 ppm or lower.

For the heat treatment for dehydration or dehydrogenation, a heating method using an electric furnace, a rapid heating method such as a gas rapid thermal anneal (GRTA) method using a heated gas or a lamp rapid thermal anneal (LRTA) method using lamp light, or the like can be used.

The thermal treatment condition is set such that at least one of two peaks of water, which appears at around 300° C. is not detected even when TDS (Thermal Desorption Spectroscopy) measurement is performed on the oxide semiconductor layer after being dehydrated or dehydrogenated, to 450° C. Therefore, even when TDS measurement is performed on a thin film transistor including the dehydrated or dehydrogenated oxide semiconductor layer to 450° C., the peak of water which appears at around 300° C. is not detected.

After that, slow cooling is performed from the heat temperature T at which the oxide semiconductor layer is dehydrated or dehydrogenated to a temperature low enough to prevent entry of impurities such as water or hydrogen, specifically to a temperature which is lower than the heating temperature T by 100° C. It is important that the same furnace used for the dehydration or dehydrogenation is used without exposure to air and entry of impurities such as water or hydrogen is prevented. The dehydration or dehydrogenation is performed to make an oxide semiconductor layer a less-resistive type layer, that is, an n-type (such as $n^-$- or $n^+$-type) layer, and after that, the oxide semiconductor layer is made to be a high-resistive so as to be an i-type oxide semiconductor layer. In the case where a thin film transistor is manufactured using such an oxide semiconductor layer, the threshold voltage of the thin film transistor is positive and a so-called normally-off switching element can be obtained. It is preferable for a display device that a channel be formed with a threshold voltage that is a positive value as close to 0 V as possible. If the threshold voltage of the thin film transistor is negative, the thin film transistor tends to be a so-called normally-on TFT, in which current flows between the source electrode and the drain electrode even when the gate voltage is 0 V. In an active-matrix display device, electric characteristics of thin film transistors included in a circuit are important and affect the performance of the display device. Among the electric characteristics of thin film transistors, in particular, a threshold voltage (Vth) is important. When the threshold voltage value is high or a negative value even when the field effect mobility is high, it is difficult to control the circuit. When a thin film transistor has a high threshold voltage value with a large absolute value, the thin film transistor cannot perform switching function as a TFT and may be a load when the transistor is driven at a low voltage. In the case of an n-channel thin film transistor, it is preferable that a channel is formed and drain current begins to flow after a positive voltage is applied as a gate voltage. A transistor in which a channel is not formed unless the driving voltage is high and a transistor in which a channel is formed and drain current flows even at a negative voltage are unsuitable as thin film transistors used in a circuit.

A gas atmosphere in which the temperature is decreased from the heat temperature T may be switched to a gas atmosphere different from that in which the temperature is increased to the heat temperature T. For example, the slow cooling is performed in the same furnace as the furnace for the dehydration or dehydrogenation, which is filled with a high-purity oxygen gas or $N_2O$ gas, or an ultra-dry air (with a dew point of −40° C. or less, preferably −60° C. or less) without exposure to air.

Using the oxide semiconductor film, which is formed by the heat treatment for dehydration or dehydrogenation so as to reduce moisture contained in the film and then the slow cooling (or cooling) in an atmosphere (with a dew point of −40° C. or less, preferably −60° C. or less) in which moisture is not contained, the electric characteristics of the thin film transistor is improved and mass productivity and high performance can be provided for the thin film transistor.

In this specification, heat treatment in an inert gas atmosphere of nitrogen or a rare gas (such as argon or helium) is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

In the case where the heat treatment is performed in the inert gas atmosphere of nitrogen or a rare gas (such as argon or helium), the heat treatment makes an oxide semiconductor layer an oxygen-depleted type layer to reduce the resistance thereof, so that the oxide semiconductor layer is turned into an n-type (such as $n^−$-type) oxide semiconductor layer.

Further, a high-resistance drain region (also referred to as an HRD region) which overlaps the drain electrode layer and is an oxygen-depleted type is formed. In addition, a high-resistance source region (also referred to as an HRS region) which overlaps the source electrode layer and is an oxygen-depleted type is formed.

Specifically, the carrier concentration of the high-resistance drain region is greater than or equal to $1\times10^{18}/cm^3$ and is at least higher than the carrier concentration of the channel formation region (less than $1\times10^{18}/cm^3$). The carrier concentration in this specification refers to a value of carrier concentration obtained by Hall effect measurement at room temperature.

Further, at least part of the dehydrated or dehydrogenated oxide semiconductor layer is made into an oxygen-excess state to have higher resistance, i.e., to be an i-type, so that the channel formation region is formed. As the treatment for making the dehydrated or dehydrogenated oxide semiconductor layer into an oxygen-excess state, the following treatment is performed: deposition of an oxide insulating film which is in contact with the dehydrated or dehydrogenated oxide semiconductor layer by a sputtering method (also referred to as sputtering); heat treatment after the deposition of the oxide insulating film; heat treatment in an atmosphere including oxygen after the deposition of the oxide insulating film; or cooling treatment in an oxygen atmosphere or ultra-dry air (having a dew point of −40° C. or lower, preferably −60° C. or lower) after the heat treatment in an inert gas atmosphere, after the deposition of the oxide insulating film; or the like.

Further, in order to make at least part of the dehydrated or dehydrogenated oxide semiconductor layer (a portion overlapping the gate electrode layer) the channel formation region, the oxide semiconductor layer is selectively made into an oxygen-excess state, thereby being high-resistance, that is, an i-type. The channel formation region can be formed in such a manner that a source and drain electrode layers formed using a metal electrode of Ti or the like are formed on and in contact with the dehydrated or dehydrogenated oxide semiconductor layer and an exposed region that does not overlap the source and the drain electrode layers is selectively made into an oxygen-excess state. In the case where the exposed region is selectively made into an oxygen-excess state, a high-resistance source region which overlaps the source electrode layer and a high-resistance drain region which overlaps the drain electrode layer are formed, by which the channel formation region is formed between the high-resistance source region and the high-resistance drain region. That is, the channel length of the channel formation region is self-aligned with the source and drain electrode layers.

In this manner, a semiconductor device including a thin film transistor having high electrical characteristics and high reliability can be provided.

By forming the high-resistance drain region in the oxide semiconductor layer overlapping the drain electrode layer, the reliability can be improved in the case where a driver circuit is formed. Specifically, by forming the high-resistance drain region, the conductivity can vary stepwise from the drain electrode layer to the channel formation region through the high-resistance drain region. Therefore, in the case where the thin film transistor operates with the drain electrode layer connected to a wiring for supplying a high power supply potential VDD, the high-resistance drain region serves as a buffer and a high electric field is not applied locally even if a high electric field is applied between the gate electrode layer and the drain electrode layer, so that the withstand voltage of the thin film transistor can be improved.

In addition, by forming the high-resistance drain region and the high-resistance source region in the oxide semiconductor layer overlapping the drain electrode layer and the source electrode layer, reduction in leakage current can be achieved in the channel formation region in the case where the driver circuit is formed. Specifically, by forming the high-resistance drain region, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In that case, in the channel formation region, leakage current flowing from the high-resistance drain region on the drain electrode layer side to the channel formation region can be concentrated on the vicinity of the interface between the channel formation region and the gate insulating layer which has high resistance when the transistor is off; thus, the amount of leakage current in a back channel portion (part of a surface of the channel formation region, which is apart from the gate electrode layer) can be reduced.

Further, the high-resistance source region which overlaps the source electrode layer and the high-resistance drain region which overlaps the drain electrode layer, although depending on the width of the gate electrode layer, overlap each other with part of the gate electrode layer and the gate insulating layer interposed therebetween, and the intensity of the electric field in the vicinity of an end portion of the drain electrode layer can be reduced more effectively.

Further, an oxide conductive layer may be formed between the oxide semiconductor layer and the source and drain electrode layers. It is preferable that the oxide conductive layer contains zinc oxide as a component and do not contain indium oxide. For example, zinc oxide, zinc aluminum oxide, zinc aluminum oxynitride, gallium zinc oxide, or the like can be used. The oxide conductive layer also functions as a low-resistance drain (LRD, also referred to as an LRN (low-resistance n-type conductivity)) region. Specifically, the carrier concentration of the low-resistance drain region is higher than that of the high-resistance drain region (HRD region), and is preferably in the range of $1 \times 10^{20}/cm^3$ to $1 \times 10^{21}/cm^3$ inclusive, for example. Provision of the oxide conductive layer between the oxide semiconductor layer and the source and drain electrode layers can reduce the contact resistance and realize higher speed operation of the transistor. Accordingly, frequency characteristics of a peripheral circuit (a driver circuit) can be improved.

The oxide conductive layer and the metal layer for forming the source and drain electrode layers can be formed successively.

The above-described first wiring and second wiring may be formed using a wiring that is formed by stacking a metal material and the same material as that of the oxide conductive layer which functions as an LRN region or an LRD region. By stacking the metal and the oxide conductive layer, coverage at the step such as a portion for overlapping a lower wiring or an opening can be improved; thus, wiring resistance can be lowered. Furthermore, the local increase in resistance of a wiring due to migration or the like and disconnection of a wiring can be expected to be prevented; accordingly, a semiconductor device having high reliability can be provided.

Also with respect to the above-described connection between the first wirings and the second wirings, an oxide conductive layer may be provided therebetween, by which increase in the contact resistance due to formation of an insulating oxide on a metal surface in the connection portion (contact portion) can be expected to be prevented; accordingly, a semiconductor device having high reliability can be provided.

Since a thin film transistor is easily broken due to static electricity or the like, it is preferable that a protection circuit for protecting a thin film transistor included in a pixel portion be provided for a gate line or a source line, over the same substrate as a substrate for the pixel portion. It is preferable that the protection circuit be formed using a nonlinear element using an oxide semiconductor layer.

Note that the ordinal numbers such as "first" and "second" in this specification are used for convenience and do not denote the order of steps or the stacking order of layers. In addition, the ordinal numbers in this specification do not denote particular names which specify the present invention.

Thin film transistors using oxide semiconductor layers can be used for electronic devices or optical devices. For example, a thin film transistor using an oxide semiconductor layer can be used as a switching element of a liquid crystal display device, a light-emitting device, an electronic paper, or the like.

Without being limited to display devices, insulated-gate semiconductor devices for high power control, particularly a semiconductor device called a power MOS device can be manufactured. As examples of the power MOS device, a MOSFET, an IGBT, and the like can be given.

A semiconductor device with less parasitic capacitance and low power consumption can be provided as a semiconductor device including a thin film transistor using an oxide semiconductor layer.

A semiconductor device with high reliability can be provided as a semiconductor device including a thin film transistor using an oxide semiconductor layer.

BRIEF DESCRIPTION OF DRAWINGS

FIGS. 1A1 and 1A2 and FIG. 1B illustrate a semiconductor device.

FIGS. 2A to 2F illustrate a method for manufacturing a semiconductor device.

FIGS. 3A1 and 3A2 and FIG. 3B illustrate a semiconductor device.

FIGS. 25A to 25D illustrate multi-tone masks.

BEST MODE FOR CARRYING OUT THE INVENTION

Figure 4A:
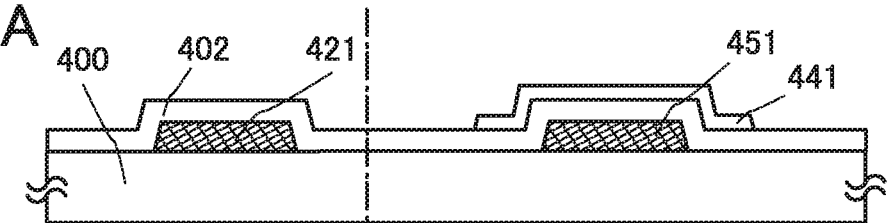
FIGS. 4A to 4F illustrate a method for manufacturing a semiconductor device.
Figure 4B:
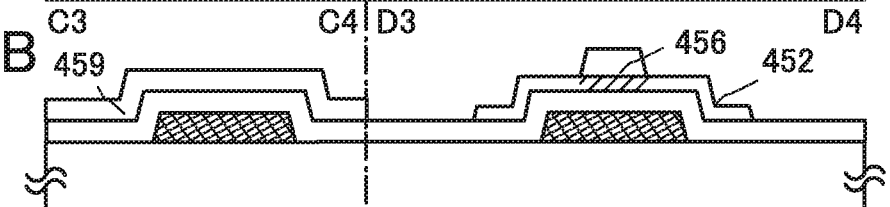
Figure 4C:
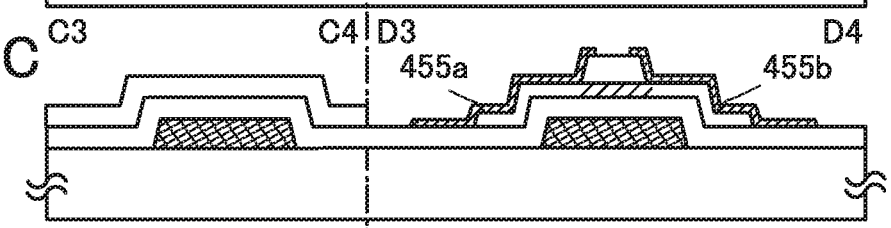
Figure 4D:
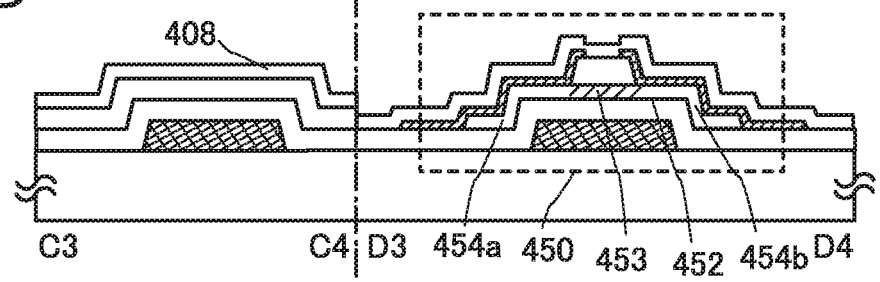

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. Therefore, the present invention is not construed as being limited to description of the embodiments.

Embodiment 1

In Embodiment 1, one embodiment of a semiconductor device and a manufacturing method of the semiconductor device will be described with reference to FIGS. 1A1 and 1A2 and FIG. 1B, FIGS. 2A to 2F, and FIGS. 6A and 6B.

FIGS. 1A1 and 1A2 illustrate an example of a plane surface structure of a semiconductor device, and FIG. 1B illustrates an example of a cross-sectional structure of the same. A thin film transistor 410 shown in FIGS. 1A2 and 1B is a kind of bottom-gate structure called a channel-etched type and is also called an inverted staggered thin film transistor.

FIG. 1A1 is a plane view of an intersection between a gate wiring layer (formed by the same step as a gate electrode layer) and a source wiring layer (formed by the same step as a wiring layer); FIG. 1A2 is a plane view of the channel-etched thin film transistor 410; and FIG. 1B is a cross-sectional view along line C1-C2 and line D1-D2 in FIGS. 1A1 and 1A2.

The thin film transistor 410, which is a channel-etched thin film transistor, includes a gate electrode layer 411, a gate insulating layer 402, an oxide semiconductor layer 412 including at least a channel formation region 413, a high-resistance source region 414a, and a high-resistance drain region 414b, a source electrode layer 415a, and a drain electrode layer 415b over a substrate 400 having an insulating surface. Further, an oxide insulating layer 407 which covers the thin film transistor 410 and is in contact with the channel formation region 413 is provided, and a protective insulating layer 408 is provided thereover.

Openings (Contact holes) are formed to reach the source electrode layer 415a and the drain electrode layer 415b, in the oxide insulating layer 407 and the protective insulating layer 408. Wiring layers 417a and 418a are formed in one of the openings and wiring layers 417b and 418b are formed in the other of the openings. In the intersection, a gate wiring layer 421 and source wiring layers 422 and 423 are stacked with the gate insulating layer 402, the oxide insulating layer 407, and the protective insulating layer 408 interposed therebetween.

In this manner, the gate electrode layer (gate wiring layer) intersects with the wiring layer which is electrically connected to the source electrode layer or the drain electrode layer, with the insulating layer which covers the oxide semiconductor layer of the thin film transistor and the gate insulating layer interposed therebetween. Except that the gate electrode layer of the thin film transistor partly overlaps the source and drain electrode layers over the oxide semiconductor layer, a stacked-layer structure of the gate electrode layer, the gate insulating layer, and the source or drain electrode layer is not formed.

Accordingly, the parasitic capacitance formed by the stacked-layer structure of the gate electrode layer, the gate insulating layer, and the source or drain electrode layer can be reduced, so that low power consumption of the semiconductor device can be realized.

Although the thin film transistor 410 is described as a single-gate thin film transistor, a multi-gate thin film transistor including a plurality of channel formation regions can be formed when needed.

A process for forming the thin film transistor 410 over a substrate is described below with reference to FIGS. 2A to 2F.

First, a conductive film is formed over the substrate 400 having an insulating surface, and a first photolithography step is performed thereon, so that the gate electrode layer 411 and the gate wiring layer 421 are formed. A resist mask may be formed by an inkjet method. A photomask is not used when the resist mask is formed by an inkjet method, which results in reducing manufacturing costs.

There is no particular limitation on a substrate that can be used as the substrate 400 having an insulating surface as long as it has heat resistance to withstand heat treatment performed later. A glass substrate of barium borosilicate glass, aluminoborosilicate glass, or the like can be used.

When the temperature of the heat treatment performed later is high, it is preferable that a substrate having a strain point of 730° C. or higher be used as the glass substrate. As a material of the glass substrate, a glass material such as aluminosilicate glass, aluminoborosilicate glass, or barium borosilicate glass is used, for example. By containing a larger amount of barium oxide (BaO) than that of boric acid, a glass substrate is heat-resistant and of more practical use. Therefore, it is preferable to use a glass substrate containing BaO and $B_2O_3$ such that the amount of BaO is larger than that of $B_2O_3$.

Instead of the glass substrate described above, a substrate formed using an insulator such as a ceramic substrate, a quartz substrate, or a sapphire substrate may be used as well. Alternatively, crystallized glass or the like may be used.

An insulating film serving as a base film may be provided between the substrate 400 and the gate electrode layer 411 and the gate wiring layer 421. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

The gate electrode layer 411 and the gate wiring layer 421 can be formed to have a single-layer structure or a stacked-layer structure using a metal material such as molybdenum, titanium, chromium, tantalum, tungsten, aluminum, copper, neodymium, or scandium, or an alloy material which contains any of these materials as its main component.

Next, the gate insulating layer 402 is formed over the gate electrode layer 411 and the gate wiring layer 421.

The gate insulating layer 402 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed using $SiH_4$, oxygen, and nitrogen as deposition gases by a plasma CVD method. The thickness of the gate insulating layer 402 is greater than or equal to 100 nm and less than or equal to 500 nm; in the case of a stacked layer, a first gate insulating layer having a thickness greater than or equal to 50 nm and less than or equal to 200 nm and a second gate insulating layer having a thickness greater than or equal to 5 nm and less than or equal to 300 nm are stacked.

In this embodiment, a silicon nitride layer having a thickness less than or equal to 200 nm is formed as the gate insulating layer 402 by a plasma CVD method.

Next, an oxide semiconductor film 440 is formed to a thickness greater than or equal to 2 nm and less than or equal to 200 nm over the gate insulating layer 402. It is preferable that the oxide semiconductor film 440 be as thin as a thickness greater than or equal to 50 nm so as to keep an amorphous state even when heat treatment for dehydration or dehydrogenation is performed after the oxide semiconductor film 440 is formed. Owing to the thickness of the oxide semiconductor film, the oxide semiconductor film can be prevented from being crystallized when heat treatment is performed after the formation of the oxide semiconductor layer.

Before the oxide semiconductor film 440 is formed by a sputtering method, it is preferable that dust on a surface of the gate insulating layer 402 be removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to change the qualities of the surface. Instead of an argon atmosphere, nitrogen, helium, oxygen, or the like may be used.

The oxide semiconductor film 440 is formed using an In—Ga—Zn—O-based non-single-crystal film; or an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film.

In this embodiment, the oxide semiconductor film 440 is formed by a sputtering method with the use of an In—Ga—Zn—O-based oxide semiconductor target. A cross-sectional view of this stage corresponds to FIG. 2A. Further, the oxide semiconductor film 440 can be formed by a sputtering method in a rare gas (typically argon) atmosphere, an oxygen atmosphere, or an atmosphere of a rare gas (typically argon) and oxygen. In the case of using a sputtering method, it is preferable that deposition is performed with the use of a target containing $SiO_2$ at greater than or equal to 2 wt % and less than or equal to 10 wt %, so that $SiO_x$ (x>0) which hinders crystallization is contained in the oxide semiconductor film 440; in this way, the oxide semiconductor film 440 can be prevented from being crystallized in heat treatment for dehydration or dehydrogenation performed later.

In this embodiment, film deposition is performed using an oxide semiconductor target containing In, Ga, and Zn ($In_2O_3$:$Ga_2O_3$:ZnO=1:1:1 [mol %] and In:Ga:Zn=1:1:0.5 [at %]). The deposition condition is set as follows: the distance between the substrate and the target is 100 mm, the pressure is 0.2 Pa, the direct current (DC) power supply is 0.5 kW, and the atmosphere is a mixed atmosphere of argon and oxygen (argon:oxygen=30 sccm:20 sccm and the oxygen flow rate is 40%). It is preferable to use a pulsed direct current (DC) power supply because dust can be reduced and the film thickness can be uniform. The In—Ga—Zn—O-based non-single-crystal film is formed to a thickness of greater than or equal to 5 nm and less than or equal to 200 nm. In this embodiment, as the oxide semiconductor film, an In—Ga—Zn—O-based non-single-crystal film with a thickness of 20 nm is formed using an In—Ga—Zn—O-based oxide semiconductor target by a sputtering method. Alternatively, as an oxide semiconductor target containing In, Ga, and Zn, a target having such composition ratio that In:Ga:Zn=1:1:1 [at %] or In:Ga:Zn=1:1:2 [at %] can be used.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is used mainly in the case of forming an insulating film, and a DC sputtering method is used mainly in the case of forming a metal film.

A multi-source sputtering apparatus in which a plurality of targets of different materials can be set can be used. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Next, the oxide semiconductor film 440 is processed into an island-shaped oxide semiconductor layer by a second photolithography step. A resist mask for forming the island-shaped semiconductor layer may be formed by an inkjet method. A photomask is not used when the resist mask is formed by an inkjet method, which results in reducing manufacturing costs.

Next, the oxide semiconductor layer is subjected to dehydration or dehydrogenation. The temperature of the first heat treatment for dehydration or dehydrogenation is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In this manner, the oxide semiconductor layer 441 is obtained (see FIG. 2B).

An example of a mechanism of water elimination in an oxide semiconductor film was analyzed along the reaction pathway below (reaction of not only water but also OH or H in the oxide semiconductor film). As the oxide semiconductor film, an In—Ga—Zn—O-based amorphous film was used.

In addition, the optimal molecular structure of the simulation model in the ground state was calculated using the density functional theory (DFT). In the DFT, the total energy is represented as the sum of potential energy, electrostatic energy between electrons, electronic kinetic energy, and exchange-correlation energy including all the complicated interactions between electrons. Also in the DFT, an exchange-correlation interaction is approximated by a functional (that is, a function of another function) of one electron potential represented in terms of electron density to enable high-speed and highly-accurate calculations. In this embodiment, B3LYP which was a hybrid functional was used to specify the weight of each parameter related to exchange-correlation energy. In addition, as a basis function, LanL2DZ (a basis function in which a split valence basis is added to the effective core potential of the Ne shell) was applied to indium atoms, gallium atoms, and zinc atoms, and 6-311 (a basis function of a triple-split valence basis set using three contraction functions for each valence orbital) was applied to the other atoms. By the above basis functions, for example, orbits of 1s to 3s are considered in the case of hydrogen atoms while orbits of 1s to 4s and 2p to 4p are considered in the case of oxygen atoms. Furthermore, to improve calculation accuracy, the p function and the d function as polarization basis sets were added to hydrogen atoms and oxygen atoms, respectively.

Gaussian 03 was used as a quantum chemistry computational program. A high performance computer (manufactured by SGI Japan, Ltd., Altix 4700) was used for the calculations.

Figure 26:
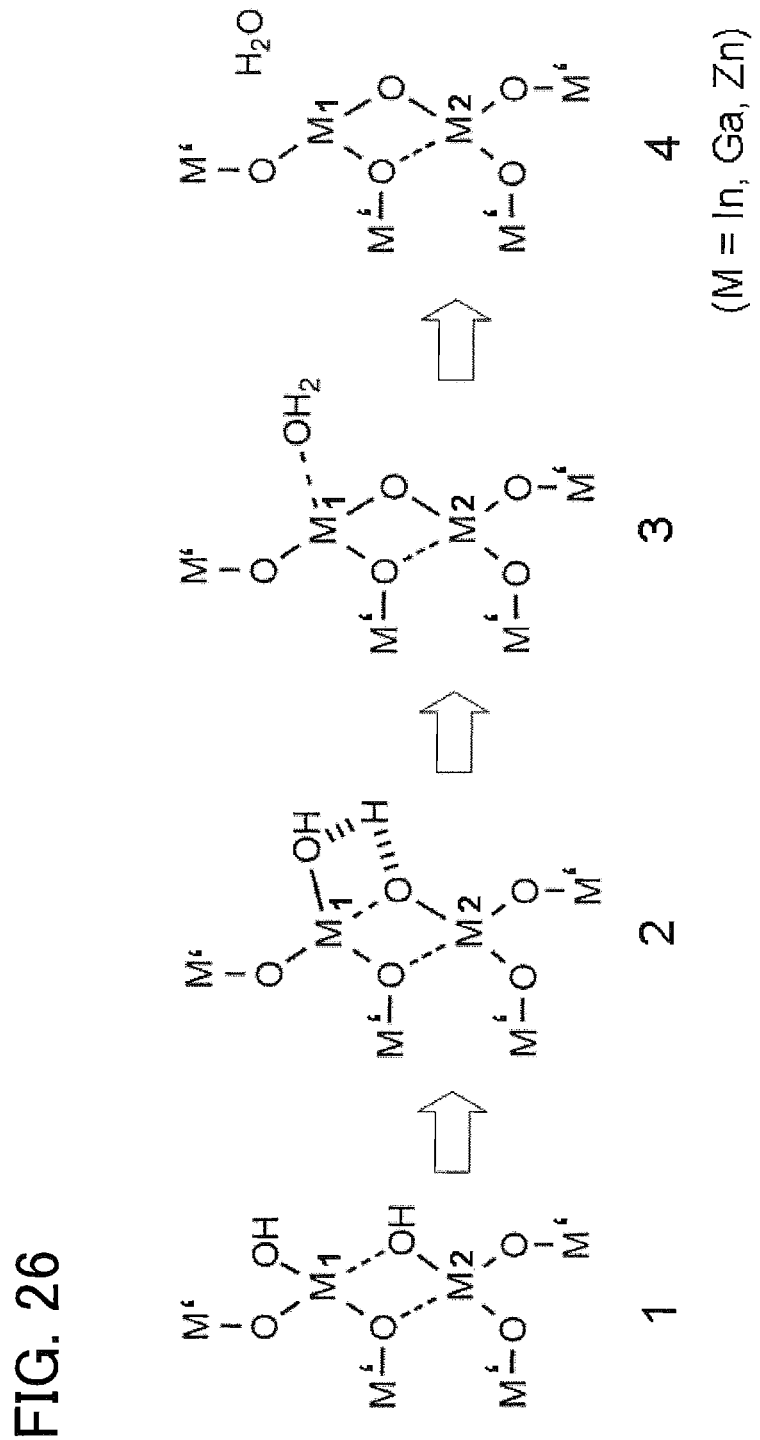
FIG. 26 illustrates results of simulation.

It is assumed that heat treatment for dehydration or dehydrogenation causes —OH groups included in the oxide semiconductor film to react with each other and thus to generate $H_2O$. Therefore, the mechanism of generation and elimination of water was analyzed as shown in FIG. 26. In FIG. 26, since Zn is divalent, in the case where M is Zn, one M-O bond is deleted in FIG. 26.

In FIG. 26, M represents a metal atom and is any of the following three kinds: In, Ga, and Zn. At the starting state 1, —OH forms a coordinate bond to cross-link $M_1$ to $M_2$. At the transition state 2, H of the —OH is dislocated to the other —OH. At the intermediate 3, the generated $H_2O$ molecule forms a coordinate bond with the metal atom. At the end state 4, the $H_2O$ molecule is detached and moves away to infinity.

There are the following six combinations of ($M_1$-$M_2$): 1, In—In; 2, Ga—Ga; 3, Zn—Zn; 4, In—Ga; 5, In—Zn; and 6, Ga—Zn. Simulation was performed for all the combinations. In this simulation, cluster computing was employed using a simulation model in which M' is replaced with H for simplifying the simulation.

In the simulation, the energy diagram corresponding to the reaction pathway in FIG. 26 was obtained. Of the six combinations of ($M_1$-$M_2$), a simulation result of 1, (In—In) is shown in FIG. 27.

Figure 27:
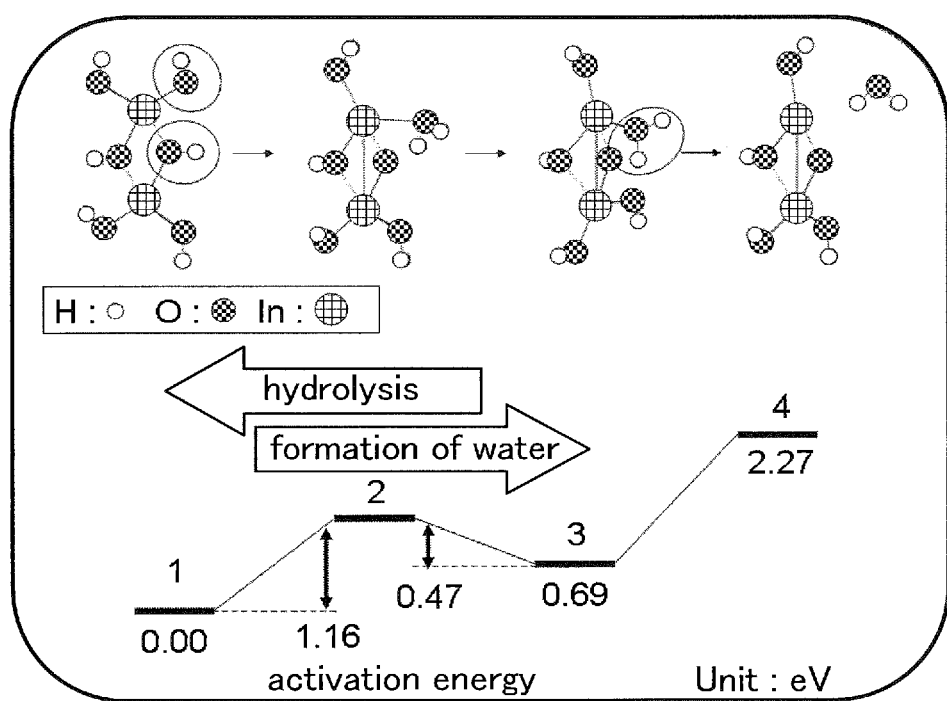
FIG. 27 illustrates results of simulation.

It was found from FIG. 27 that the activation energy for generating water was 1.16 eV. By elimination of the generated water molecule, the film is destabilized by 1.58 eV.

When looking at FIG. 27 in the opposite direction as a reaction from the right to the left, the reaction can be perceived as a reaction in which water enters the oxide semiconductor film. In that case, the activation energy at the time when water coordinated to the metal is hydrolyzed to produce two OH groups is 0.47 eV.

Similarly, the reaction pathways for the other combinations of ($M_1$-$M_2$) were analyzed. The activation energies (Ea [eV]) in the generation reaction of water in the cases 1 to 6 are shown in Table 1.

TABLE 1

| | the activation energy for generating water Ea [eV] | | | | | |
|---|---|---|---|---|---|---|
| | 1 | 2 | 3 | 4 | 5 | 6 |
| $M_1$—$M_2$ | In—In | Ga—Ga | Zn—Zn | In—Ga | In—Zn | Ga—Zn |
| Ea | 1.16 | 1.25 | 2.01 | 1.14 | 1.35 | 1.4 |

It can be seen from Table 1 that the generation reaction of water is more likely to be caused in the cases 1, (In—In) and 4, (In—Ga). On the contrary, the generation reaction of water is less likely to be caused in the case 3, (Zn—Zn). Accordingly, it can be assumed that the generation reaction of water using Zn atoms is less likely to be caused.

The heat treatment apparatus is not limited to the electric furnace, an apparatus for heating an object by thermal conduction or thermal radiation from a heating element such as a resistance heating element may be provided. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. GRTA enables high-temperature heat treatment by a short period of time.

In the first heat treatment, it is preferable that water, hydrogen, and the like be included as less as possible in nitrogen or the rare gas such as helium, neon, or argon. Alternatively, it is preferable that nitrogen or the rare gas such as helium, neon, or argon introduced into the heat treatment apparatus have a purity of 6N (99.9999%) or more, more preferably 7N (99.99999%) or more, that is, the impurity concentration be set to 1 ppm or less, more preferably 0.1 ppm or less.

Further, the oxide semiconductor film may be crystallized to be a micro crystal film or a polycrystalline film depending on the condition of the first heat treatment or a material of the oxide semiconductor layer. For example, the oxide semiconductor layer may be crystallized to be a microcrystalline oxide semiconductor layer having a degree of crystallization of 90% or more, or 80% or more. The oxide semiconductor layer may become an amorphous oxide semiconductor layer containing no crystalline component depending on the condition of the first heat treatment or a material of the oxide semiconductor layer. The oxide semiconductor layer may become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor. A needle-like crystal in a longitudinal direction (the film-thickness direction) may be generated on the surface side of the oxide semiconductor film in the case where heat treatment at a high temperature is performed using RTA (e.g., GRTA or LRTA).

The first heat treatment of the oxide semiconductor layer can be performed on the oxide semiconductor film 440 before it is processed into the island-shaped oxide semiconductor layer. In that case, after the first heat treatment, the substrate is taken out of the heat apparatus and a photolithography step is performed thereon.

The heat treatment for dehydration or dehydrogenation of the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

Further, in the case where a contact hole is formed in the gate insulating layer 402, the formation of the contact hole may be performed before or after the dehydration or dehydrogenation of the oxide semiconductor film 440.

The oxide semiconductor layer preferably includes In, more preferably In and Ga. In order to make an oxide semiconductor layer i-type (intrinsic), dehydration or dehydrogenation is effective.

The etching of the oxide semiconductor film may be dry etching, without being limited to wet etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate RIE (reactive ion etching) method or an ICP (inductively coupled plasma) etching method can be used. In order to etch into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. ITO07N (produced by KANTO CHEMICAL CO., INC.) may be used.

The etchant used in the wet etching is removed together with the material which is etched off, by cleaning. The waste liquid including the etchant and the material etched off may be purified and the material may be reused. A material such as indium included in the oxide semiconductor layer may be collected from the waste liquid after the etching and reused, thereby efficiently using resources and reducing the cost.

The etching conditions (such as an etchant, etching time, and temperature) are adjusted as appropriate depending on the material in order to etch into an appropriate shape.

Next, a metal conductive film is formed over the gate insulating layer 402 and the oxide semiconductor layer 441. After that, a resist mask is formed by a third photolithography step, the metal conductive film is selectively etched to form the source electrode layer 415a and the drain electrode layer 415b, and then, the resist mask is removed (see FIG. 2C).

Note that each material and etching conditions are adjusted as appropriate so that the oxide semiconductor layer 441 is not removed by the etching of the metal conductive film.

In this embodiment, a Ti film is used as the metal conductive film, and an In—Ga—Zn—O-based oxide is used for the oxide semiconductor layer 441; and an ammonia hydrogen peroxide mixture (a mixed solution of ammonia, water, and a hydrogen peroxide solution) is used as an etchant.

It is preferable that the source and drain electrode layers are as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced.

It is preferable that the source and drain electrode layers are formed using a material including a metal with high oxygen affinity. It is preferable that the metal with high oxygen affinity be one or more materials selected from titanium, aluminum, manganese, magnesium, zirconium, beryllium, and thorium. In this embodiment, a titanium film is used as each of the source and drain electrode layers.

When thermal treatment is performed while the oxide semiconductor layer and the metal layer with high oxygen affinity are in contact with each other, oxygen atoms move from the oxide semiconductor layer to the metal layer, so that the carrier density in the vicinity of the interface therebetween is increased. A low-resistance region is formed in the vicinity of the interface therebetween, thereby reducing the contact resistance between the oxide semiconductor layer and the source and drain electrode layers.

A heat-resistant conductive material may be used in the source and drain electrode layers. By using the heat-resistant conductive material, the change of properties or degradation of the source and drain electrode layers can be prevented even when thermal treatment is performed after the formation of the source and drain electrode layers.

As the heat-resistant conductive material, an element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. A conductive film having heat resistance in which a low-resistant conductive material such as aluminum (Al) or copper (Cu) is combined with the above-described heat-resistant conductive material may be used.

The source and drain electrode layers may include a metal oxide layer. For example, a structure in which a titanium oxide film is provided between an oxide semiconductor layer and a titanium film, or a structure in which a titanium oxide film (for example, having a thickness greater than or equal to 1 nm and less than or equal to 20 nm) is provided between a titanium film (for example, having a thickness greater than or equal to 0.1 nm and less than or equal to 5 nm) and an oxide insulating layer may be employed.

When the source and drain electrode layers are as thin as light is transmitted, the source and drain electrode layers have light-transmitting properties.

In the third photolithography step, only part of the oxide semiconductor layer 441 may be etched off, whereby an oxide semiconductor layer having a groove (a depressed portion) may be formed. A resist mask for forming the source electrode layer 415a and the drain electrode layer 415b may be formed by an ink jet method. A photomask is not used when the resist mask is formed by an inkjet method, which results in reducing manufacturing costs.

In order to reduce the number of photomasks and steps in the photolithography step, the etching step may be performed using a resist mask formed by a multi-tone mask that is a mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding at least two kinds of different patterns can be formed by one multi-tone mask. In this manner, the number of light-exposure masks can be reduced and the number of corresponding photolithography steps can also be reduced, whereby simplification of a process can be realized.

Next, plasma treatment is performed thereon, using a gas such as $N_2O$, $N_2$, or Ar. By this plasma treatment, absorbed water and the like attached to an exposed surface of the oxide semiconductor layer are removed. Plasma treatment may be performed using a mixture gas of oxygen and argon as well.

After the plasma treatment, the oxide insulating layer 407 which functions as a protective insulating film which is in contact with part of the oxide semiconductor layer is formed without exposure to air.

The oxide insulating layer 407 has a thickness of at least 1 nm and can be formed by a method by which impurities such as water and hydrogen are mixed into the oxide insulating layer 407 as less as possible such as a sputtering method, as appropriate. When hydrogen is contained in the oxide insulating layer 407, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel is formed. Therefore, it is important that a formation method in which hydrogen is used as less as possible is employed such that the oxide insulating layer 407 contains hydrogen as less as possible.

In this embodiment, a 200-nm-thick silicon oxide film is deposited as the oxide insulating layer 407 by a sputtering method. The substrate temperature in the film deposition may be greater than or equal to room temperature and less than or equal to 300° C.; in this embodiment, the temperature is 100° C. The silicon oxide film can be deposited by a sputtering method in a rare gas (typically argon) atmosphere, an oxygen atmosphere, or an atmosphere including a rare gas (typically argon) and oxygen. A silicon oxide target or a silicon target can be used as a target. For example, with use of a silicon target, a silicon oxide film can be formed by a sputtering method in an atmosphere including oxygen and nitrogen. As the oxide insulating layer 407 formed in contact with the oxide semiconductor layer whose resistance is reduced, an inorganic insulating film that includes impurities such as moisture, a hydrogen ion, and OH⁻ as less as possible and blocks entry of these from the outside may be used; typically, a silicon oxide film, a silicon nitride oxide film, an aluminum oxide film, an aluminum oxynitride film, or the like is used.

Next, second heat treatment is performed in an inert gas atmosphere or an oxygen gas atmosphere (at a temperature higher than or equal to 200° C. and lower than or equal to 400° C., for example a temperature higher than or equal to 250° C. and lower than or equal to 350° C.). For example, the second heat treatment is performed at 250° C. for one hour in a nitrogen atmosphere. The second heat treatment performs heating while part (a channel formation region) of the oxide semiconductor layer is in contact with the oxide insulating layer 407.

Through the above-described steps, the heat treatment for dehydration or dehydrogenation is performed on the oxide semiconductor film to reduce the resistance, and then, part of the oxide semiconductor film is selectively made into an oxygen-excess state. As a result, the channel formation region 413 overlapping the gate electrode layer 411 becomes I-type, and the high-resistance source region 414a which overlaps the source electrode layer 415a and the high-resistance drain region 414b which overlaps the drain electrode layer 415b are formed in a self-aligned manner. Through the above process, the thin film transistor 410 is formed.

Further, heat treatment may be performed at a temperature higher than or equal to 100° C. and lower than or equal to 200° C. for a period longer than or equal to one hour and shorter than or equal to 30 hours in air. In this embodiment, the heat treatment is performed at 150° C. for 10 hours. This heat treatment may be performed at a fixed heating temperature; alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed before the formation of the oxide insulating film under a reduced pressure. The reduced pressure enables the heat treatment time to be short. With this heat treatment, hydrogen is introduced from the oxide semiconductor layer to the oxide insulating layer; thus, a normally-off thin film transistor can be obtained. Therefore, reliability of the semiconductor device can be improved.

By the formation of the high-resistance drain region 414b (and the high-resistance source region 414a) in part(s) of the oxide semiconductor layer, which overlaps/overlap the drain electrode layer 415b (and the source electrode layer 415a), reliability of the thin film transistor can be improved. Specifically, by the formation of the high-resistance drain region 414b, the conductivity can be gradually changed from the drain electrode layer 415b to the high-resistance drain region 414b and the channel formation region in this order. Thus, when the transistor operates with the drain electrode layer 415b connected to a wiring that supplies a high power supply potential VDD, the transistor can have increased withstand voltage because the high-resistance drain region serves as a buffer even when a high electric field is applied between the gate electrode layer 411 and the drain electrode layer 415b so that a localized high electric field is not applied to the transistor.

The high-resistance source region and the high-resistance drain region may be formed at all depths in the film thickness direction in the oxide semiconductor layer in the case where the oxide semiconductor layer is as thin as 15 nm or less; whereas in the case where the oxide semiconductor layer is as thick as a thickness greater than or equal to 30 nm and less than or equal to 50 nm, parts of the oxide semiconductor layer, that is, regions of the oxide semiconductor layer, which are in contact with the source and drain electrode layers and the vicinity thereof may be reduced in the resistance, so that the high-resistance source region and the high-resistance drain region are formed and a region of the oxide semiconductor layer, near the gate insulating layer can be made to be I-type.

A protective insulating layer may be formed over the oxide insulating layer 407. For example, a silicon nitride film is formed by an RF sputtering method. An RF sputtering method is preferable as the formation method of the protective insulating layer because of high productivity. The protective insulating layer is formed using an inorganic insulating film which includes impurities such as moisture, a hydrogen ion, and OH⁻ as less as possible and blocks entry of these from the outside; for example, a silicon nitride film, an aluminum nitride film, a silicon nitride oxide film, an aluminum oxynitride film, or the like is used. In this embodiment, the protective insulating layer 408 is formed using a silicon nitride film as the protective insulating layer (see FIG. 2D).

Next, a fourth photolithography step is performed to form a resist mask, and etching is selectively performed to remove parts of the oxide insulating layer 407 and the protective insulating layer 408, so that openings 442a and 442b reaching the source electrode layer 415a and the drain electrode layer 415b are formed (see FIG. 2E).

A stacked-layer conductive layer is formed in the openings 442a and 442b so as to be in contact with the source electrode layer 415a and the drain electrode layer 415b by a sputtering method or a vacuum evaporation method, and a resist mask is formed by a fifth photolithography step. The stacked-layer conductive layer is selectively etched to form the wiring layers 417a, 417b, 418a, and 418b, and the source wiring layers 422 and 423 in the intersection (see FIG. 2F).

The wiring layers 417a, 417b, 418a, and 418b are formed using conductive films having resistances lower than that of the source and drain electrode layers. In particular, the wiring layers can be formed to have a single-layer or stacked-layer structure using a metal material such as aluminum, copper, chromium, tantalum, molybdenum, tungsten, titanium, neodymium, or scandium, or an alloy material which contains any of these materials as its main component. In this embodiment, an aluminum film is used as each of the wiring layers 417a and 417b which are first wiring layers and a titanium film is used as each of the wiring layers 418a and 418b which are second wiring layers.

Figure 6A:
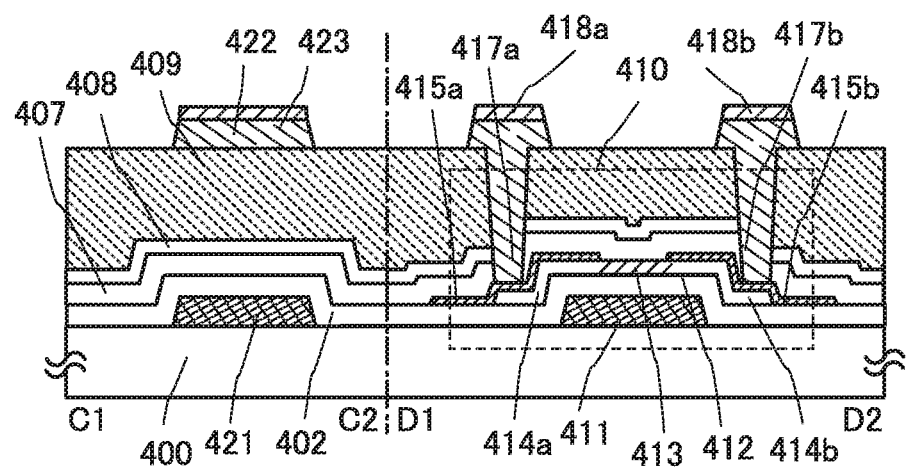
FIGS. 6A and 6B illustrate semiconductor devices.

A planarization insulating layer for planarization may be provided over the protective insulating layer 408. An example in which a planarization insulating layer is provided is shown in FIG. 6A. In FIG. 6A, a planarization insulating layer 409 is formed over the protective insulating layer 408, and the wiring layers 417a, 417b, 418a, and 418b are formed in the openings provided in the oxide insulating layer 407, the protective insulating layer 408, and the planarization insulating layer 409. The source wiring layers 422 and 423 are formed over the planarization insulating layer 409. The provision of the planarization insulating layer 409 further distances the gate wiring layer 421 and the source wiring layers 422 and 423 from each other, by which the parasitic capacitance can be further decreased.

The planarization insulating layer 409 can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarization insulating layer 409 may be formed by stacking a plurality of insulating films formed using these materials.

The siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the planarization insulating layer 409, and any of the following can be used depending on a material thereof: a sputtering method, a spin coating method, a dipping method, a spray coating method, or a droplet discharging method (e.g., an inkjet method, screen printing, or offset printing), a roll coating method, a curtain coating method, or a knife coating method, and the like.

Figure 6B:
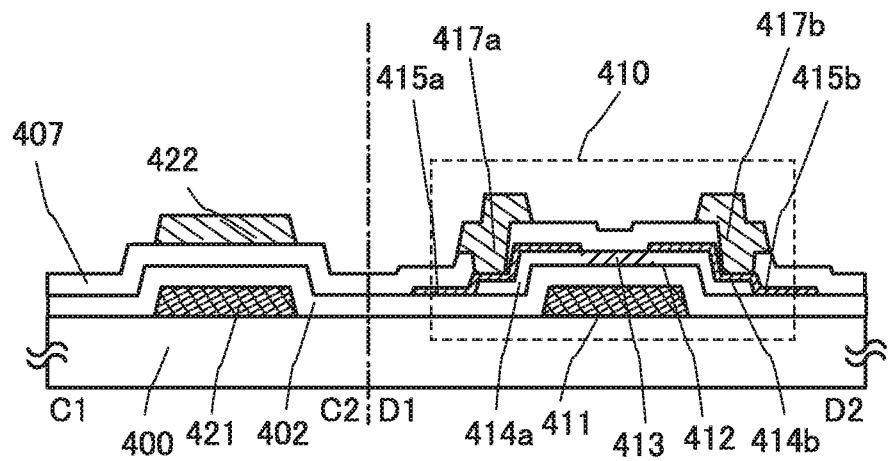

Alternatively, as shown in FIG. 6B, the wiring layer and the source wiring layer may be formed over the oxide insulating layer 407 without providing a protective insulating layer. In FIG. 6B, the source wiring layer 422 is provided over the oxide insulating layer 407, and the wiring layers 417a and 417b are provided in openings formed in the oxide insulating layer 407. As described above, the wiring layer may have a single-layer structure.

In this manner, a semiconductor device with less parasitic capacitance and low power consumption can be provided as a semiconductor device including a thin film transistor using an oxide semiconductor layer.

A semiconductor device with high reliability can be provided as a semiconductor device including a thin film transistor using an oxide semiconductor layer.

Embodiment 2

In Embodiment 2, an example of a semiconductor device including a thin film transistor having a structure different from that of Embodiment 1 will be described below.

FIGS. 3A1 and 3A2 illustrate an example of a plane surface structure of a semiconductor device, and FIG. 3B illustrates an example of a cross-sectional structure of the same. A thin film transistor 450 shown in FIGS. 3A2 and 3B is a kind of bottom-gate structure called a channel-protective type (channel-stop type) and is also called an inverted staggered thin film transistor.

FIG. 3A1 is a plane view of an intersection between a gate wiring layer (formed by the same step as a gate electrode layer) and a source wiring layer (formed by the same step as a wiring layer); FIG. 3A2 is a plane view of the channel-protective type thin film transistor 450; and FIG. 3B is a cross-sectional view along line C3-C4 and line D3-D4 in FIGS. 3A1 and 3A2.

The thin film transistor 450, which is a channel-protective type thin film transistor, includes a gate electrode layer 451, a gate insulating layer 402, an oxide semiconductor layer 452 including at least a channel formation region 453, a high-resistance source region 454a, and a high-resistance drain region 454b, a source electrode layer 455a, and a drain electrode layer 455b over a substrate 400 having an insulating surface. Further, an oxide insulating layer 456 which covers the thin film transistor 450, is in contact with the channel formation region 413, and functions as a channel protective layer is provided, and a protective insulating layer 408 is provided thereover.

Openings (Contact holes) are formed to reach the source electrode layer 455a and the drain electrode layer 455b, in the protective insulating layer 408. Wiring layers 457a and 458a are formed in one of the openings and wiring layers 457b and 458b are formed in the other of the openings. In the intersection, a gate wiring layer 421 and source wiring layers 422 and 423 are stacked with the gate insulating layer 402, an oxide insulating layer 459, and the protective insulating layer 408 interposed therebetween.

The oxide insulating layer 459 is not necessarily provided in the intersection; however, the provision of the oxide insulating layer 459 further distances the gate wiring layer 421 and the source wiring layers 422 and 423 from each other, by which the parasitic capacitance can be further decreased.

The oxide insulating layers 456 and 459 can be formed by etching an oxide insulating layer, and can be formed by a manufacturing method and a material which are the same as those of the oxide insulating layer 407 described in Embodiment 1. In this embodiment, the oxide insulating layer is formed by a sputtering method and is processed into the oxide insulating layers 456 and 459 by a photolithography step.

In this manner, the gate electrode layer (gate wiring layer) intersects with the wiring layer which is electrically connected to the source electrode layer or the drain electrode layer, with the protective insulating layer which covers the thin film transistor and the gate insulating layer interposed therebetween. Except that the gate electrode layer of the thin film transistor partly overlaps the source and drain electrode layers over the oxide semiconductor layer, a stacked-layer structure of the gate electrode layer, the gate insulating layer, and the source or drain electrode layer is not formed.

Accordingly, the parasitic capacitance formed by the stacked-layer structure of the gate electrode layer, the gate insulating layer, and the source or drain electrode layer can be reduced, so that low power consumption of the semiconductor device can be realized.

Although the thin film transistor 450 is described as a single-gate thin film transistor, a multi-gate thin film transistor including a plurality of channel formation regions can be formed when needed.

A process for forming the thin film transistor 450 over a substrate is described below with reference to FIGS. 4A to 4F.

First, a conductive film is formed over the substrate 400 having an insulating surface, and a first photolithography step is performed thereon, so that the gate electrode layer 451 and the gate wiring layer 421 are formed. A resist mask may be formed by an inkjet method. A photomask is not used when the resist mask is formed by an inkjet method, which results in reducing manufacturing costs.

The gate electrode layer 451 and the gate wiring layer 421 can be formed to have a single-layer structure or a stacked-layer structure using a metal material such as molybdenum, titanium, chromium, tantalum, tungsten, aluminum, copper, neodymium, or scandium, or an alloy material which contains any of these materials as its main component.

Next, the gate insulating layer 402 is formed over the gate electrode layer 451 and the gate wiring layer 421.

In this embodiment, a silicon nitride layer having a thickness of less than or equal to 200 nm is formed as the gate insulating layer 402 by a plasma CVD method.

Next, an oxide semiconductor film is formed to a thickness greater than or equal to 2 nm and less than or equal to 200 nm over the gate insulating layer 402, and then, the oxide semiconductor film is processed into an island-shaped oxide semiconductor layer by a second photolithography step. In this embodiment, the oxide semiconductor film is formed by a sputtering method with the use of an In—Ga—Zn—O-based oxide semiconductor target.

Next, the oxide semiconductor layer is subjected to dehydration or dehydrogenation. The temperature of the first heat treatment for dehydration or dehydrogenation is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In this manner, an oxide semiconductor layer 441 is obtained (see FIG. 4A).

Next, plasma treatment is performed thereon, using a gas such as $N_2O$, $N_2$, or Ar. By this plasma treatment, absorbed water and the like attached to an exposed surface of the oxide semiconductor layer are removed. Plasma treatment may be performed using a mixture gas of oxygen and argon as well.

Next, an oxide insulating layer is formed over the gate insulating layer 402 and the oxide semiconductor layer 441. After that, a resist mask is formed by a third photolithography step, the oxide insulating layer is selectively etched to form the oxide insulating layer 456 and the oxide insulating layer 459, and then, the resist mask is removed.

In this embodiment, a 200-nm-thick silicon oxide film is deposited as each of the oxide insulating layer 456 and the oxide insulating layer 459 by a sputtering method. The substrate temperature in the film deposition may be greater than or equal to room temperature and less than or equal to 300° C.; in this embodiment, the temperature is 100° C. The silicon oxide film can be deposited by a sputtering method in a rare gas (typically argon) atmosphere, an oxygen atmosphere, or an atmosphere including a rare gas (typically argon) and oxygen. A silicon oxide target or a silicon target can be used as a target. For example, with use of a silicon target, a silicon oxide film can be formed by a sputtering method in an atmosphere including oxygen and nitrogen. As the oxide insulating layer 456 formed in contact with the oxide semiconductor layer whose resistance is reduced, an inorganic insulating film that includes impurities such as moisture, a hydrogen ion, and $OH^-$ as less as possible and blocks entry of these from the outside may be used; typically, a silicon oxide film, a silicon nitride oxide film, an aluminum oxide film, an aluminum oxynitride film, or the like is used.

Next, second heat treatment may be performed in an inert gas atmosphere or an oxygen gas atmosphere (preferably at a temperature higher than or equal to 200° C. and lower than or equal to 400° C., for example a temperature higher than or equal to 250° C. and lower than or equal to 350° C.). For example, the second heat treatment is performed at 250° C. for one hour in a nitrogen atmosphere. The second heat treatment performs heating while part (a channel formation region) of the oxide semiconductor layer is in contact with the oxide insulating layer 456.

In this embodiment, the oxide semiconductor layer 441 which is provided with the oxide insulating layer 456 and is partly exposed is further subjected to heat treatment in a nitrogen atmosphere or an inert gas atmosphere or under a reduced pressure. By the heat treatment in a nitrogen atmosphere or an inert gas atmosphere or under a reduced pressure, the resistance of the exposed region of the oxide semiconductor layer 441, which is not covered by the oxide insulating layer 456 can be reduced. For example, heat treatment is performed in a nitrogen atmosphere at 250° C. for one hour.

With the heat treatment on the oxide semiconductor layer 441 provided with the oxide insulating layer 456 in a nitrogen atmosphere, the resistance of the exposed region of the oxide semiconductor layer 441 is reduced, so that an oxide semiconductor layer 452 including regions with different resistances (indicated as a shaded region and a white region in FIG. 4B) is formed.

Next, a metal conductive film is formed over the gate insulating layer 402, the oxide semiconductor layer 452m and the oxide insulating layer 456. After that, a resist mask is formed by a fourth photolithography step, the metal conductive film is selectively etched to form the source electrode layer 455a and the drain electrode layer 455b, and then, the resist mask is removed (see FIG. 4C).

It is preferable that the source electrode layer 455a and the drain electrode layer 455b are as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced.

It is preferable that the source electrode layer 455a and the drain electrode layer 455b are formed using a material including a metal with a high oxygen affinity. It is preferable that the metal with a high oxygen affinity be one or more materials selected from titanium, aluminum, manganese, magnesium, zirconium, beryllium, and thorium. In this embodiment, a titanium film is used as each of the source electrode layer 455*a* and the drain electrode layer 455*b*.

When thermal treatment is performed while the oxide semiconductor layer and the metal layer with a high oxygen affinity are in contact with each other, oxygen atoms move from the oxide semiconductor layer to the metal layer, so that the carrier density in the vicinity of the interface therebetween is increased. Therefore, a low-resistance region is formed in the vicinity of the interface therebetween, thereby reducing the contact resistance between the oxide semiconductor layer and the source and drain electrode layers.

A heat-resistant conductive material may be used in the source electrode layer 455*a* and the drain electrode layer 455*b*. By using the heat-resistant conductive material, the change of properties or degradation of the source electrode layer 455*a* and the drain electrode layer 455*b* can be prevented even when thermal treatment is performed after the formation of the source electrode layer 455*a* and the drain electrode layer 455*b*.

As the heat-resistant conductive material, an element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. A conductive film having heat resistance in which a low-resistant conductive material such as aluminum (Al) or copper (Cu) is combined with the above-described heat-resistant conductive material may be used.

The source electrode layer 455*a* and the drain electrode layer 455*b* may include a metal oxide layer. For example, a structure in which a titanium oxide film is provided between an oxide semiconductor layer and a titanium film, or a structure in which a titanium oxide film (for example, having a thickness greater than or equal to 1 nm and less than or equal to 20 nm) is provided between a titanium film (for example, having a thickness greater than or equal to 0.1 nm and less than or equal to 5 nm) and an oxide insulating layer may be employed.

When the source electrode layer 455*a* and the drain electrode layer 455*b* are as thin as light is transmitted, the source electrode layer 455*a* and the drain electrode layer 455*b* have light-transmitting properties.

Through the above-described steps, the heat treatment for dehydration or dehydrogenation is performed on the oxide semiconductor film to reduce the resistance, and then, part of the oxide semiconductor film is selectively made into an oxygen-excess state. As a result, the channel formation region 453 overlapping the gate electrode layer 451 becomes I-type, and the high-resistance source region 454*a* which overlaps the source electrode layer 455*a* and the high-resistance drain region 454*b* which overlaps the drain electrode layer 455*b* are formed in a self-aligned manner. Through the above process, the thin film transistor 450 is formed.

Further, heat treatment may be performed at a temperature higher than or equal to 100° C. and lower than or equal to 200° C. for a period longer than or equal to one hour and shorter than or equal to 30 hours in air. In this embodiment, the heat treatment is performed at 150° C. for 10 hours. This heat treatment may be performed at a fixed heating temperature; alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed before the formation of the oxide insulating film under a reduced pressure. The reduced pressure enables the heat treatment time to be short. With this heat treatment, hydrogen is introduced from the oxide semiconductor layer to the oxide insulating layer; thus, a normally-off thin film transistor can be obtained. Therefore, reliability of the semiconductor device can be improved.

By the formation of the high-resistance drain region 454*b* (and the high-resistance source region 454*a*) in part(s) of the oxide semiconductor layer, which overlaps/overlap the drain electrode layer 455*b* (and the source electrode layer 455*a*), reliability of the thin film transistor can be improved. Specifically, by the formation of the high-resistance drain region 454*b*, the conductivity can be gradually changed from the drain electrode layer 455*b* to the high-resistance drain region 454*b* and the channel formation region in this order. Thus, when the transistor operates with the drain electrode layer 455*b* connected to a wiring that supplies a high power supply potential VDD, the transistor can have increased withstand voltage because the high-resistance drain region serves as a buffer even when a high electric field is applied between the gate electrode layer 451 and the drain electrode layer 455*b* so that a localized high electric field is not applied to the transistor.

The protective insulating layer 408 is formed over the source electrode layer 455*a*, the drain electrode layer 455*b*, the oxide insulating layer 456, and the oxide insulating layer 459. For example, a silicon nitride film is formed by an RF sputtering method. An RF sputtering method is preferable as the formation method of the protective insulating layer 408 because of high productivity. The protective insulating layer 408 is formed using an inorganic insulating film which includes impurities such as moisture, a hydrogen ion, and OH⁻ as less as possible and blocks entry of these from the outside; for example, a silicon nitride film, an aluminum nitride film, a silicon nitride oxide film, an aluminum oxynitride film, or the like is used. In this embodiment, the protective insulating layer 408 is formed using a silicon nitride film (see FIG. 4D).

An oxide insulating layer may be formed over the source electrode layer 455*a*, the drain electrode layer 455*b*, the oxide insulating layer 456, and the oxide insulating layer 459, and the protective insulating layer 408 may be stacked over the oxide insulating layer 408. A planarization insulating layer 409 as shown in FIG. 6A may be provided. The provision of the planarization insulating layer 409 further distances the gate wiring layer 421 and the source wiring layers 422 and 423 from each other, by which the parasitic capacitance can be further decreased.

Figure 4E:
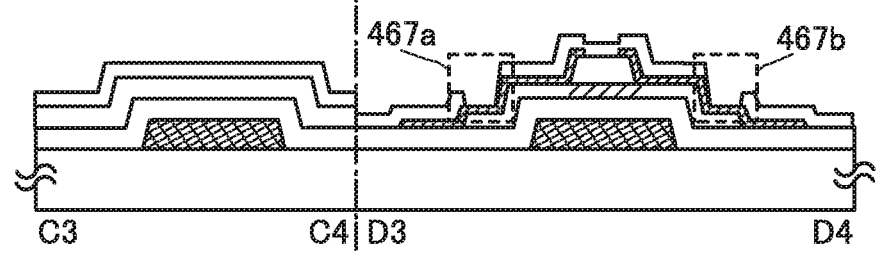
Figure 4F:
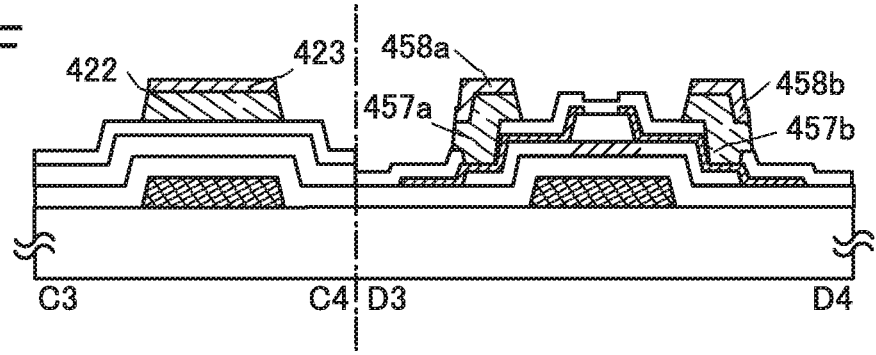

Next, a fifth photolithography step is performed to form a resist mask, and etching is selectively performed to remove parts of the protective insulating layer 408, so that openings 467*a* and 467*b* reaching the source electrode layer 455*a* and the drain electrode layer 455*b* are formed (see FIG. 4E).

A stacked-layer conductive layer is formed in the openings 467*a* and 467*b* so as to be in contact with the source electrode layer 455*a* and the drain electrode layer 455*b* by a sputtering method or a vacuum evaporation method, and a resist mask is formed by a sixth photolithography step. The stacked-layer conductive layer is selectively etched to form the wiring layers 457*a*, 457*b*, 458*a*, and 458*b*, and the source wiring layers 422 and 423 in the intersection (see FIG. 4F).

The wiring layers 457*a*, 457*b*, 458*a*, and 458*b* are formed using conductive films having resistances lower than that of the source and drain electrode layers. In particular, the wiring layers can be formed to have a single-layer or stacked-layer structure using a metal material such as aluminum, copper, chromium, tantalum, molybdenum, tungsten, titanium, neodymium, or scandium, or an alloy material which contains any of these materials as its main component. In this embodiment, an aluminum film is used as each of the wiring layers 457a and 457b which are first wiring layers and a titanium film is used as each of the wiring layers 458a and 458b which are second wiring layers.

In this manner, a semiconductor device with less parasitic capacitance and low power consumption can be provided as a semiconductor device including a thin film transistor using an oxide semiconductor layer.

A semiconductor device with high reliability can be provided as a semiconductor device including a thin film transistor using an oxide semiconductor layer.

Embodiment 3

In Embodiment 3, another example which is different from Embodiment 1 in the manufacturing process of a semiconductor device including a thin film transistor will be described with reference to FIGS. 5A to 5F. FIGS. 5A to 5F are the same as FIGS. 1A1, 1A2, and FIG. 1B and FIGS. 2A to 2F except that there is a difference in part of the process; therefore, the same portions are denoted by the same reference numerals, and detailed description of the same portions is omitted. In this embodiment, a mask layer formed using a multi-tone mask is used in a photolithography step.

Since a mask layer formed with the use of a multi-tone mask has a plurality of film thicknesses and further can be changed in shape by performing etching on the mask layer, the mask layer can be used in a plurality of etching steps for processing into different patterns. Therefore, a mask layer corresponding at least two kinds of different patterns can be formed by one multi-tone mask. Thus, the number of light-exposure masks can be reduced and the number of photolithography steps can be also reduced accordingly, whereby simplification of a process can be realized.

In accordance with Embodiment 1, a gate wiring layer 421 and a gate electrode layer 481 are formed over a substrate 400 by a first photolithography step, and a gate insulating layer 402 is stacked thereover. An oxide semiconductor film is formed over the gate insulating layer 402. In this embodiment, the oxide semiconductor film is formed by a sputtering method with the use of an In—Ga—Zn—O-based oxide semiconductor target.

The substrate is put in an electric furnace which is a kind of heat treatment apparatus and heat treatment is performed on the oxide semiconductor layer in a nitrogen atmosphere at 450° C. for one hour in order for dehydration or dehydrogenation, and then water and hydrogen are prevented from entering the oxide semiconductor layer with the oxide semiconductor layer not exposed to air. In this manner, an oxide semiconductor film 465 is obtained Next, a metal conductive film 466 is formed over the oxide semiconductor film 465 by a sputtering method or a vacuum evaporation method (see FIG. 5A).

The metal conductive film 466 is a conductive film which forms a source and drain electrode layers. It is preferable that the source and drain electrode layers are as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced.

It is preferable that the source and drain electrode layers are formed using a material including a metal with a high oxygen affinity. It is preferable that the metal with a high oxygen affinity be one or more materials selected from titanium, aluminum, manganese, magnesium, zirconium, beryllium, and thorium. In this embodiment, a titanium film is used as each of the source and drain electrode layers.

When thermal treatment is performed while the oxide semiconductor layer and the metal layer with a high oxygen affinity are in contact with each other, oxygen atoms move from the oxide semiconductor layer to the metal layer, so that the carrier density in the vicinity of the interface therebetween is increased. A low-resistance region is formed in the vicinity of the interface therebetween, thereby reducing the contact resistance between the oxide semiconductor layer and the source and drain electrode layers.

A heat-resistant conductive material may be used in the source and drain electrode layers. By using the heat-resistant conductive material, the change of properties or degradation of the source and drain electrode layers can be prevented even when thermal treatment is performed after the formation of the source and drain electrode layers.

As the heat-resistant conductive material, an element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. A conductive film having heat resistance in which a low-resistant conductive material such as aluminum (Al) or copper (Cu) is combined with the above-described heat-resistant conductive material may be used.

The source and drain electrode layers may include a metal oxide layer. For example, a structure in which a titanium oxide film is provided between an oxide semiconductor layer and a titanium film, or a structure in which a titanium oxide film (for example, having a thickness greater than or equal to 1 nm and less than or equal to 20 nm) is provided between a titanium film (for example, having a thickness greater than or equal to 0.1 nm and less than or equal to 5 nm) and an oxide insulating layer may be employed.

When the source and drain electrode layers are as thin as light is transmitted, the source and drain electrode layers have light-transmitting properties.

A second photolithography step is performed, so that a resist mask 460 is formed over the oxide semiconductor film 465 and the metal conductive film 466.

In this embodiment, an example is shown in which a high-tone mask is used for light exposure to form the resist mask 460. A resist is formed in order to form the resist mask 460. As the resist, a positive type resist or a negative type resist can be used. In this embodiment, a positive type resist is used. The resist may be formed by a spin coating method or may be selectively formed by an inkjet method. When the resist is selectively formed by an inkjet method, a resist can be prevented from being formed in an unintended portion, which results in reducing waste of the material.

Next, the resist is irradiated with light with the use of a multi-tone mask 81 as a light-exposure mask, so that the resist is exposed to light.

Here, light exposure using the multi-tone mask 81 is described with reference to FIGS. 25A to 25D.

A multi-tone mask enables three levels of light exposure to form an exposed portion, a half-exposed portion, and an unexposed portion: a multi-tone mask is a photomask through which light is transmitted to have a plurality of intensities. With one-time light exposure and development process, a resist mask with regions of plural thicknesses (typically, two kinds of thicknesses) can be formed. Accordingly, by using a multi-tone mask, the number of photomasks can be reduced.

Typical examples of the multi-tone mask are a gray-tone mask 81a shown in FIG. 25A and a half-tone mask 81b shown in FIG. 25C.

As shown in FIG. 25A, the gray-tone mask 81a includes a light-transmitting substrate 83, and a light-blocking portion 84 and a diffraction grating 85 that are formed on the light-transmitting substrate 83. The light transmittance of the light-blocking portion 84 is 0%. The diffraction grating 85 has a light-transmitting portion in a slit form, a dot form, a mesh form, or the like with intervals that are less than or equal to the resolution limit of light used for the exposure, whereby the light transmittance can be controlled. The diffraction grating 85 can be in a slit form, a dot form, or a mesh form with regular intervals; or in a slit form, a dot form, or a mesh form with irregular intervals.

As the light-transmitting substrate 83, a light-transmitting substrate such as a quartz substrate can be used. The light-blocking portion 84 and the diffraction grating 85 can be formed using a light-blocking material that absorbs light, such as chromium or chromium oxide.

When the gray-tone mask 81a is irradiated with light for exposure, a light transmittance 86 of the light-blocking portion 84 is 0% and the light transmittance 86 of a region where none of the light-blocking portion 84 and the diffraction grating 85 are provided is 100% as shown in FIG. 25B. The light transmittance 86 of the diffraction grating 85 can be controlled in the range of 10% to 70%. The light transmittance of the diffraction grating 85 can be controlled by adjusting the interval or pitch of slits, dots, or meshes of the diffraction grating.

As shown in FIG. 25C, the half-tone mask 81b includes a light-transmitting substrate 83, and a semi-light-transmitting portion 87 and a light-blocking portion 88 that are formed on the light-transmitting substrate 83. The semi-light-transmitting portion 87 can be formed using MoSiN, MoSi, MoSiO, MoSiON, CrSi, or the like. The light-blocking portion 88 can be formed using a light-blocking material that absorbs light, such as chromium or chromium oxide.

When the half-tone mask 81b is irradiated with light for exposure, a light transmittance 89 of the light-blocking portion 88 is 0% and the light transmittance 89 of a region where none of the light-blocking portion 88 and the semi-light-transmitting portion 87 are provided is 100% as shown in FIG. 25D. The light transmittance 89 of the semi-light-transmitting portion 87 can be controlled in the range of 10% to 70%. The light transmittance of the semi-light-transmitting portion 87 can be controlled by a material of the semi-light-transmitting portion 87.

Figure 5A:
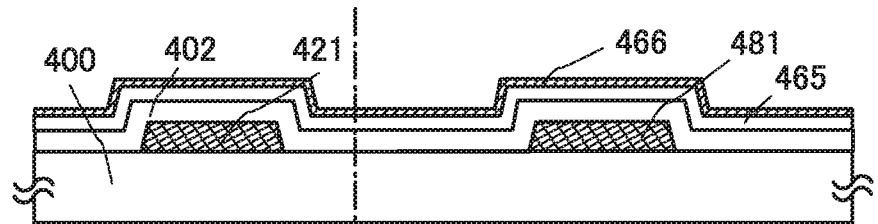
FIGS. 5A to 5F illustrate a method for manufacturing a semiconductor device.
Figure 5B:
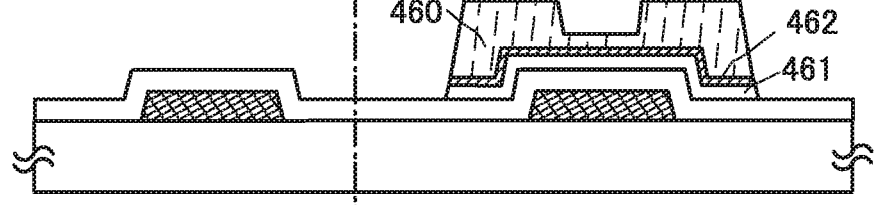

After the light exposure using the multi-tone mask, development is carried out, whereby the resist mask 460 with regions having different thicknesses can be formed as shown in FIG. 5B.

Next, a first etching step is performed using the resist mask 460, so that the oxide semiconductor film 465 and the metal conductive film 466 are etched into island shapes. As a result, an oxide semiconductor layer 461 and a metal conductive layer 462 can be formed (see FIG. 5B).

Next, ashing is performed on the resist mask 460. Consequently, the area (the volume when considering three dimensions) of the resist mask is reduced and the thickness is reduced. Through this step, the resist of the resist mask in a region with a small thickness (a region overlapping with part of the gate electrode layer 481) is removed, so that resist masks 463a and 436b which are separated from each other can be formed.

Figure 5C:
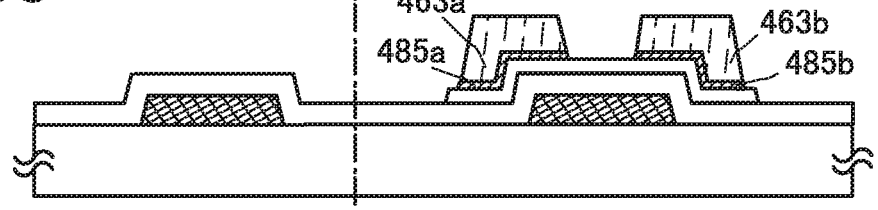
Figure 5D:
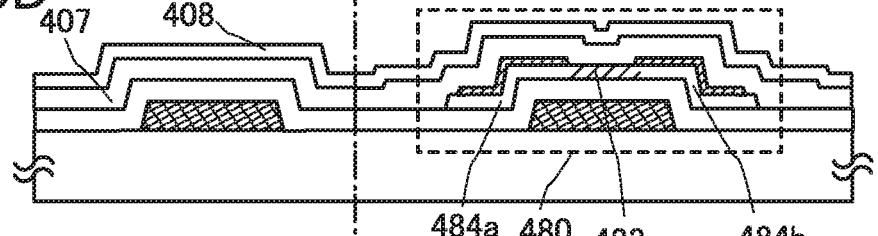

With the resist masks 463a and 436b, an unnecessary portion is removed by etching, so that a source electrode layer 485a and a drain electrode layer 485b are formed (see FIG. 5C).

Each material and etching conditions of the etching on the metal conductive layer 462 are adjusted as appropriate such that the oxide semiconductor layer 461 is not removed by the etching.

In this embodiment, a Ti film is used as the metal conductive layer 462; an In—Ga—Zn—O-based oxide is used for the oxide semiconductor layer 461; and an ammonia hydrogen peroxide solution (a mixed solution of ammonia, water, and a hydrogen peroxide solution) is used as an etchant.

The etching of the metal conductive film and the oxide semiconductor film may be dry etching, without being limited to wet etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, the following can be used: a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like.

As a dry etching method, a parallel plate RIE (reactive ion etching) method or an ICP (inductively coupled plasma) etching method can be used. In order to etch into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. ITO07N (produced by KANTO CHEMICAL CO., INC.) may be used.

The etchant used in the wet etching is removed together with the material which is etched off, by cleaning. The waste liquid including the etchant and the material etched off may be purified and the material may be reused. A material such as indium included in the oxide semiconductor layer may be collected from the waste liquid after the etching and reused, thereby efficiently using resources and reducing the cost.

The etching conditions (such as an etchant, etching time, and temperature) are adjusted as appropriate depending on the material in order to etch into an appropriate shape.

Next, the resist masks 463a and 436b are removed, and an oxide insulating layer 407 which functions as a protective insulating film which is in contact with part of the oxide semiconductor layer 461 is formed. In this embodiment, a 200-nm-thick silicon oxide film is deposited as the oxide insulating layer 407 by a sputtering method.

Next, second heat treatment is performed in an inert gas atmosphere or an oxygen gas atmosphere (preferably at a temperature higher than or equal to 200° C. and lower than or equal to 400° C., for example a temperature higher than or equal to 250° C. and lower than or equal to 350° C.). For example, the second heat treatment is performed at 250° C. for one hour in a nitrogen atmosphere. The second heat treatment performs heating while part (a channel formation region) of the oxide semiconductor layer is in contact with the oxide insulating layer 407.

Through the above-described steps, the heat treatment for dehydration or dehydrogenation is performed on the oxide semiconductor film to reduce the resistance, and then, part of the oxide semiconductor film is selectively made into an oxygen-excess state. As a result, a channel formation region 483 overlapping the gate electrode layer 481 becomes I-type, and a high-resistance source region 484a which overlaps the source electrode layer 485a and a high-resistance drain region 484b which overlaps the drain electrode layer 485b are formed in a self-aligned manner. Through the above process, a thin film transistor 480 is formed.

Further, heat treatment may be performed at a temperature higher than or equal to 100° C. and lower than or equal to 200° C. for a period longer than or equal to one hour and shorter than or equal to 30 hours in air. In this embodiment, the heat treatment is performed at 150° C. for 10 hours. This heat treatment may be performed at a fixed heating temperature; alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed before the formation of the oxide insulating film under a reduced pressure. The reduced pressure enables the heat treatment time to be short. With this heat treatment, hydrogen is introduced from the oxide semiconductor layer to the oxide insulating layer; thus, a normally-off thin film transistor can be obtained. Therefore, reliability of the semiconductor device can be improved.

Next, a protective insulating layer 408 is formed over the oxide insulating layer 407. In this embodiment, the protective insulating layer 408 is formed using a silicon nitride film as the protective insulating layer (see FIG. 5D).

Figure 5E:
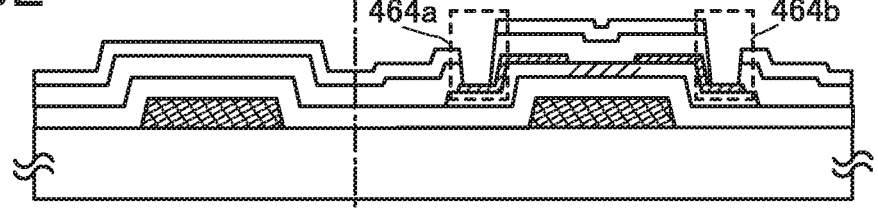
Figure 5F:
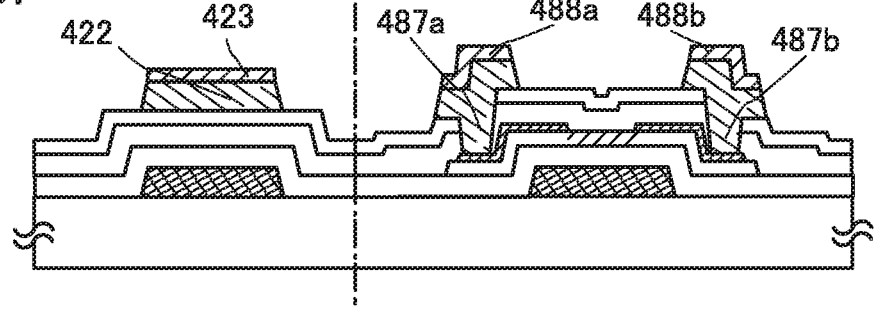

Next, a third photolithography step is performed to form a resist mask, and etching is selectively performed to remove parts of the oxide insulating layer 407 and the protective insulating layer 408, so that openings 464a and 464b reaching the source electrode layer 485a and the drain electrode layer 485b are formed (see FIG. 5E).

A stacked-layer conductive layer is formed in the openings 464a and 464b so as to be in contact with the source electrode layer 485a and the drain electrode layer 485b by a sputtering method or a vacuum evaporation method, and a resist mask is formed by a fourth photolithography step. The stacked-layer conductive layer is selectively etched to form wiring layers 487a, 487b, 488a, and 488b, and source wiring layers 422 and 423 in the intersection (see FIG. 5F).

The wiring layers 487a, 487b, 488a, and 488b are formed using conductive films having resistances lower than that of the source and drain electrode layers. In particular, the wiring layers can be formed to have a single-layer or stacked-layer structure using a metal material such as aluminum, copper, chromium, tantalum, molybdenum, tungsten, titanium, neodymium, or scandium, or an alloy material which contains any of these materials as its main component. In this embodiment, an aluminum film is used as each of the wiring layers 487a and 487b which are first wiring layers and a titanium film is used as each of the wiring layers 488a and 488b which are second wiring layers.

In this manner, a semiconductor device with less parasitic capacitance and low power consumption can be provided as a semiconductor device including a thin film transistor using an oxide semiconductor layer.

A semiconductor device with high reliability can be provided as a semiconductor device including a thin film transistor using an oxide semiconductor layer.

This embodiment can be implemented combining with another embodiment as appropriate.

Embodiment 4

Figure 7:
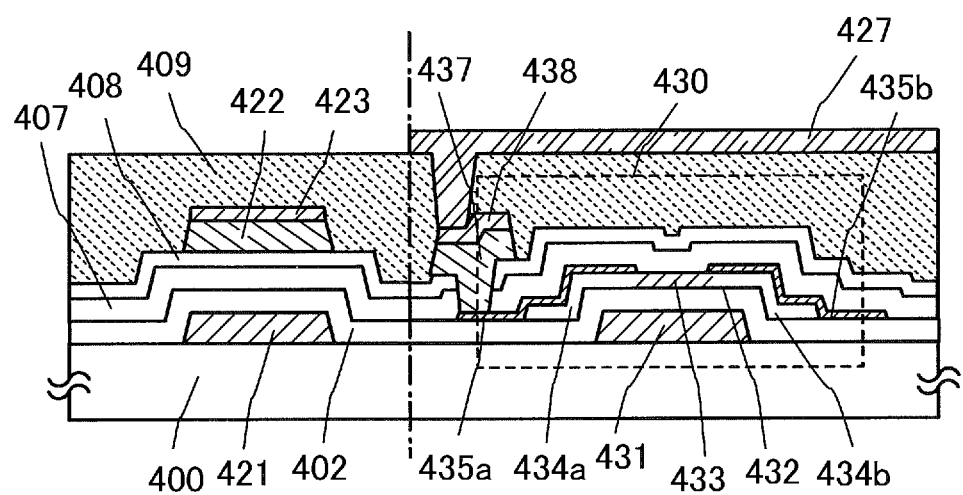
FIG. 7 illustrates a semiconductor device.

In Embodiment 4, an example in which a gate electrode layer is formed using a light-transmitting conductive material in Embodiment 1 will be described with reference to FIG. 7. Therefore, the same as Embodiment 1 can be applied, and the description of the same portions as Embodiment 1 and portions and steps having similar functions to Embodiment 1 are omitted. FIG. 7 is the same as FIGS. 1A1, 1A2, and FIG. 1B and FIGS. 2A to 2F except that there is a difference in part of the process; therefore, the same portions are denoted by the same reference numerals, and detailed description of the same portions is omitted.

A thin film transistor 430 shown in FIG. 7 is a channel-etched thin film transistor, and includes a gate electrode layer 431, a gate insulating layer 402, an oxide semiconductor layer 432 including at least a channel formation region 433, a high-resistance source region 434a, and a high-resistance drain region 434b, a source electrode layer 435a, and a drain electrode layer 435b over a substrate 400 having an insulating surface. Further, an oxide insulating layer 407 which covers the thin film transistor 430 and is in contact with the channel formation region 433 is provided, and a protective insulating layer 408 is provided thereover.

An opening (a contact hole) is formed to reach the source electrode layer 435a, in the oxide insulating layer 407 and the protective insulating layer 408. Wiring layers 437 and 438 are formed in the opening. In the intersection, a gate wiring layer 421 and source wiring layers 422 and 423 are stacked with the gate insulating layer 402, the oxide insulating layer 407, and the protective insulating layer 408 interposed therebetween. As the opening reaching the source electrode layer 435a and the wiring layers 437 and 438 formed in the opening shown in FIG. 7, the opening and the wiring layer may be provided in a region which does not overlap the oxide semiconductor layer 432.

In this manner, the gate electrode layer (gate wiring layer) intersects with the wiring layer which is electrically connected to the source electrode layer or the drain electrode layer, with the insulating layer which covers the oxide semiconductor layer of the thin film transistor and the gate insulating layer interposed therebetween. Except that the gate electrode layer of the thin film transistor partly overlaps the source and drain electrode layers over the oxide semiconductor layer, a stacked-layer structure of the gate electrode layer, the gate insulating layer, and the source or drain electrode layer is not formed.

Accordingly, the parasitic capacitance formed by the stacked-layer structure of the gate electrode layer, the gate insulating layer, and the source or drain electrode layer can be reduced, so that low power consumption of the semiconductor device can be realized.

A planarization insulating layer 409 is provided over the wiring layer 438, the source wiring layer 423, and the protective insulating layer 408, and a pixel electrode layer 427 is provided over the planarization insulating layer 409. The pixel electrode layer 427 is in contact with the wiring layer 438 through the opening formed in the planarization insulating layer 409, and the thin film transistor 430 is electrically connected to the pixel electrode layer 427 through the wiring layers 437 and 438.

The source electrode layer 435*a* and the drain electrode layer 435*b* each can be formed as a light-transmitting conductive film by using a thin metal conductive film.

Further, in FIG. 7, the gate electrode layer 431 in the thin film transistor 430 is also formed using a light-transmitting conductive film.

As a material of the gate electrode layer 431, a conductive material that transmits visible light can be used. For example, any of the following metal oxides can be used: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof is set in the range of greater than or equal to 50 nm and less than or equal to 300 nm as appropriate. As a deposition method of the metal oxide used for the gate electrode layer 431, a sputtering method, a vacuum evaporation method (an electron beam evaporation method or the like), an arc discharge ion plating method, or a spray method is used. When a sputtering method is employed, it is preferable that deposition be performed using a target containing $SiO_2$ at 2 wt % to 10 wt % both inclusive and SiOx (x>0) which inhibits crystallization be contained in the light-transmitting conductive film so as to prevent crystallization at the time of heat treatment for dehydration or dehydrogenation in a later step.

In this manner, the thin film transistor 430 can be formed as a light-transmitting thin film transistor.

In a pixel provided with the thin film transistor 430, the pixel electrode layer 427, another electrode layer (such as a capacitor electrode layer), or a wiring layer (such as a capacitor wiring layer) is formed using a conductive film that transmits visible light, so that a display device having a high aperture ratio is realized. Needless to say, it is preferable to use films that transmit visible light to form the gate insulating layer 402, the oxide insulating layer 407, and the protective insulating layer 408.

In this specification, a film that transmits visible light means a film having a thickness at which the transmittance of visible light is 75% to 100%. In the case where the film has conductivity, the film is also referred to as a transparent conductive film. Further, a conductive film that is semi-transparent to visible light may be used as a metal oxide applied to the gate electrode layer, the source electrode layer, the drain electrode layer, the pixel electrode layer, or another electrode layer or another wiring layer. Semi-transparency to visible light means that the transmittance of visible light is 50% to 75%.

Since the thin film transistor 430 has light-transmitting properties, the aperture ratio can be improved. Particularly for small liquid crystal display panels of 10 inches or smaller, a high aperture ratio can be achieved even when the size of a pixel is decreased in order to realize higher definition of display images by increasing the number of gate wirings, for example. Further, by using a light-transmitting film for a component in the thin film transistor 430, a high aperture ratio can be achieved even when one pixel is divided into a plurality of sub-pixels in order to realize a wide viewing angle. That is, a high aperture ratio can be maintained even when a group of high-density thin film transistors is arranged, and the display region can have a sufficient area. For example, in the case where one pixel includes two to four sub-pixels, the aperture ratio can be improved because the thin film transistor has light-transmitting properties. Further, a storage capacitor may be formed using the same material by the same step as the component in the thin film transistor so that the storage capacitor can have light-transmitting properties, by which the aperture ratio can be further improved.

This embodiment can be implemented combining with another embodiment as appropriate.

Embodiment 5

Figure 8:
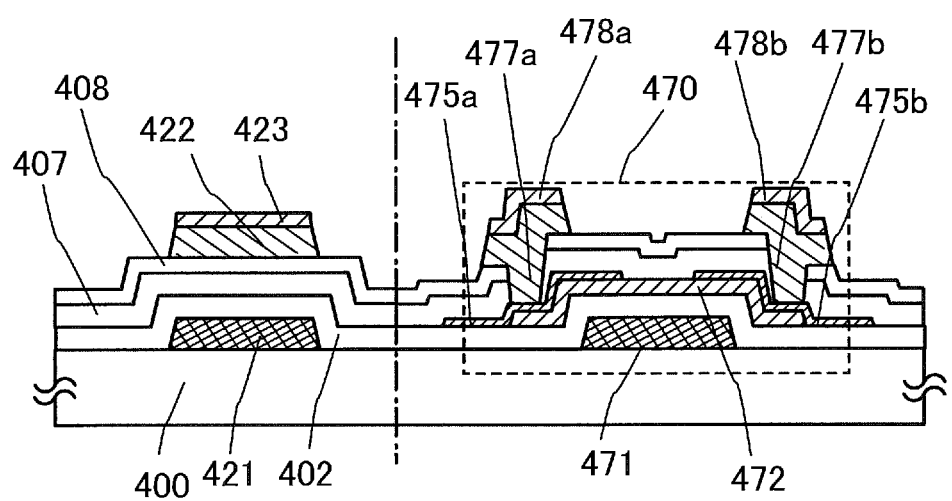
FIG. 8 illustrates a semiconductor device.

In Embodiment 5, an example which is different from Embodiment 1 in the manufacturing process of a thin film transistor will be described with reference to FIG. 8. FIG. 8 is the same as FIGS. 1A1, 1A2, and FIG. 1B and FIGS. 2A to 2F except that there is a difference in part of the process; therefore, the same portions are denoted by the same reference numerals, and detailed description of the same portions is omitted.

In accordance with Embodiment 1, a gate wiring layer 421 and a gate electrode layer 471 are formed over a substrate 400, and a gate insulating layer 402 is stacked thereover.

Next, an oxide semiconductor film is formed, and is processed into an island-shaped oxide semiconductor layer by a photolithography step.

Next, the oxide semiconductor layer is subjected to dehydration or dehydrogenation. The temperature of the first heat treatment for dehydration or dehydrogenation is higher than or equal to 400° C. and lower than or equal to 750° C., preferably higher than or equal to 425° C. Note that in the case where the temperature is 425° C. or higher, the heat treatment time may be one hour or less, whereas in the case where the temperature is lower than 425° C., the heat treatment time is longer than one hour. In this embodiment, the substrate is put in an electric furnace which is a kind of heat treatment apparatus and heat treatment is performed on the oxide semiconductor layer in a nitrogen atmosphere, and then water and hydrogen are prevented from entering the oxide semiconductor layer with the oxide semiconductor layer not exposed to air. In this manner, an oxide semiconductor layer is obtained. After that, a high-purity oxygen gas, a high-purity $N_2O$ gas, or an ultra-dry air (with a dew point of −40° C. or less, preferably −60° C. or less) is introduced into the same furnace and cooling is performed. It is preferable that water, hydrogen, and the like be included as less as possible in the oxygen gas or the $N_2O$ gas. Alternatively, it is preferable that the oxygen gas or the $N_2O$ gas introduced into the heat treatment apparatus have a purity of 6N (99.9999%) or more, more preferably 7N (99.99999%) or more (that is, the impurity concentration in the oxygen gas or the $N_2O$ gas be set to 1 ppm or less, more preferably 0.1 ppm or less).

The heat treatment apparatus is not limited to the electric furnace, an RTA (rapid thermal anneal) apparatus such as a GRTA (gas rapid thermal anneal) apparatus or an LRTA (lamp rapid thermal anneal) apparatus can be used, for example. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The LRTA apparatus may be provided with a device that heats an object to be processed by heat conduction or heat radiation from not only a lamp but also a heater such as a resistance heater. A GRTA is a method for performing heat treatment using a high-temperature gas. As the gas, an inert gas which does not react with an object to be processed by heat treatment, such as nitrogen or a rare gas such as argon is used. Heat treatment may be performed at 600° C. to 750° C. for several minutes using an RTA method.

After the first heat treatment for dehydration or dehydrogenation, heat treatment may be performed at a temperature higher than or equal to 200° C. and lower than or equal to 400° C., preferably at a temperature higher than or equal to 200° C. and lower than or equal to 300° C., in an oxygen gas atmosphere or a $N_2O$ gas atmosphere.

The first heat treatment of the oxide semiconductor layer can be performed on the oxide semiconductor film before it is processed into the island-shaped oxide semiconductor layer. In that case, after the first heat treatment, the substrate is taken out of the heat apparatus and a photolithography step is performed thereon.

Through the above process, the whole oxide semiconductor film is made into an oxygen-excess state to have higher resistance, that is, become an I-type oxide semiconductor film. Accordingly, an oxide semiconductor layer 472 whose entire region has I-type conductivity is formed.

Next, a resist mask is formed by a photolithography step over the oxide semiconductor layer 472, and is selectively etched to form a source electrode layer 475a and a drain electrode layer 475b, and then, an oxide insulating layer 407 is formed by a sputtering method.

Next, in order to reduce variation in electric characteristics of the thin film transistor, heat treatment may be performed in an inert gas atmosphere or a nitrogen gas atmosphere (preferably at a temperature higher than or equal to 150° C. and lower than 350° C.). For example, heat treatment is performed in a nitrogen atmosphere at 250° C. for one hour.

Further, heat treatment may be performed at a temperature higher than or equal to 100° C. and lower than or equal to 200° C. for a period longer than or equal to one hour and shorter than or equal to 30 hours in air. In this embodiment, the heat treatment is performed at 150° C. for 10 hours. This heat treatment may be performed at a fixed heating temperature; alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed before the formation of the oxide insulating film under a reduced pressure. The reduced pressure enables the heat treatment time to be short. With this heat treatment, hydrogen is introduced from the oxide semiconductor layer to the oxide insulating layer; thus, a normally-off thin film transistor can be obtained. Therefore, reliability of the semiconductor device can be improved.

Next, a protective insulating layer 408 is formed over the oxide insulating layer 407.

Next, a photolithography step is performed to form a resist mask, and etching is selectively performed to remove parts of the oxide insulating layer 407 and the protective insulating layer 408, so that openings reaching the source electrode layer 475a and the drain electrode layer 475b are formed.

A stacked-layer conductive layer is formed in the openings so as to be in contact with the source electrode layer 475a and the drain electrode layer 475b by a sputtering method or a vacuum evaporation method, and a resist mask is formed by a photolithography step. The stacked-layer conductive layer is selectively etched to form wiring layers 477a, 477b, 478a, and 478b, and source wiring layers 422 and 423 in the intersection (see FIG. 8).

In this manner, a semiconductor device with less parasitic capacitance and low power consumption can be provided as a semiconductor device including a thin film transistor using an oxide semiconductor layer.

A semiconductor device with high reliability can be provided as a semiconductor device including a thin film transistor using an oxide semiconductor layer.

This embodiment can be implemented combining with another embodiment as appropriate.

Embodiment 6

Figure 9:
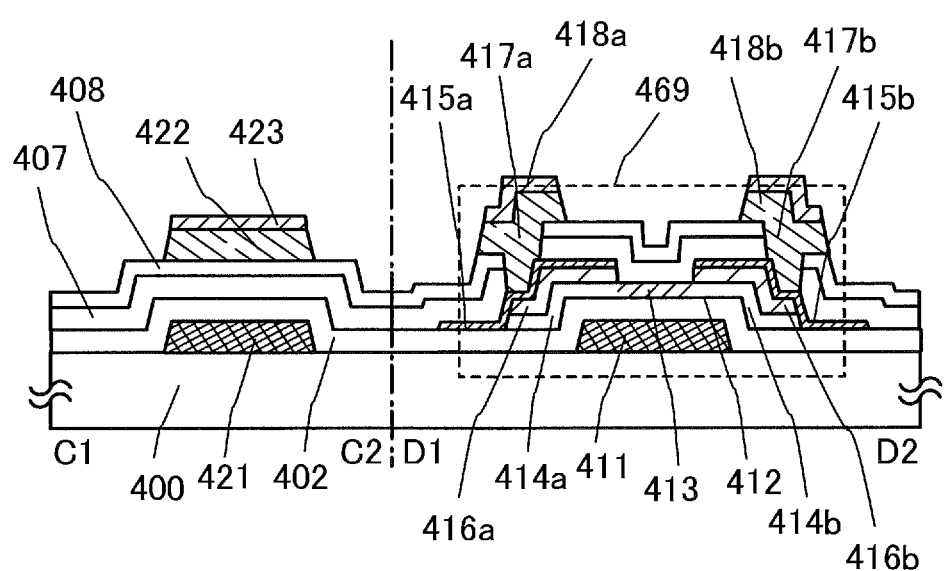
FIG. 9 illustrates a semiconductor device.

In Embodiment 6, an example in which oxide conductive layers serving as a source and drain regions are provided between an oxide semiconductor layer and a source and drain electrode layers in Embodiment 1 will be described with reference to FIG. 9. Therefore, the same as Embodiment 1 can be applied, and the description of the same portions as Embodiment 1 and portions and steps having similar functions to Embodiment 1 are omitted. FIG. 9 is the same as FIGS. 1A1, 1A2, and FIG. 1B and FIGS. 2A to 2F except that there is a difference in part of the process; therefore, the same portions are denoted by the same reference numerals, and detailed description of the same portions is omitted.

A thin film transistor 469 shown in FIG. 9 is a channel-etched thin film transistor, and includes a gate electrode layer 411, a gate insulating layer 402, an oxide semiconductor layer 412 including at least a channel formation region 413, a high-resistance source region 414a, and a high-resistance drain region 414b, oxide conductive layers 416a and 416b, a source electrode layer 415a, and a drain electrode layer 415b over a substrate 400 having an insulating surface. Further, an oxide insulating layer 407 which covers the thin film transistor 469 and is in contact with the channel formation region 413 is provided, and a protective insulating layer 408 is provided thereover.

In accordance with Embodiment 1, a gate wiring layer 421 and the gate electrode layer 411 are formed over the substrate 400, and the gate insulating layer 402 is stacked thereover. An oxide semiconductor film is formed over the gate insulating layer 402 to form an oxide semiconductor layer which is dehydrated or dehydrogenated.

The oxide conductive layers 416a and 416b are formed over the dehydrated or dehydrogenated oxide semiconductor layer. Described in this embodiment is an example in which the oxide conductive layers 416a and 416b is processed into appropriate shapes by the same photolithography step as the oxide semiconductor layer; however, the oxide conductive layers 416a and 416b may be processed into the appropriate shapes by the same photolithography step as the source electrode layer and the drain electrode layer.

As the formation method of the oxide conductive layers 416a and 416b, a sputtering method, a vacuum evaporation method (an electron beam evaporation method or the like), an arc discharge ion plating method, or a spray method can be used. It is preferable that a material of each of the oxide conductive layers 416a and 416b contain zinc oxide as a component and does not contain indium oxide. As such a material for the oxide conductive layers 416a and 416b, zinc oxide, zinc aluminum oxide, zinc aluminum oxynitride, gallium zinc oxide, or the like can be used. The thickness of each of the oxide conductive layers is set as appropriate in a range greater than or equal to 50 nm and less than or equal to 300 nm. In the case of using a sputtering method, it is preferable to use a target including $SiO_2$ at 2 wt % to 10 wt % both inclusive and make $SiO_x$ (x>0) which inhibits crystallization be contained in the oxide conductive film in order to suppress crystallization at the time of heat treatment for dehydration or dehydrogenation in a later step.

In this embodiment, the oxide conductive layers 416a and 416b are formed as follows: processing into an appropriate shape is performed by the same photolithography step as the oxide semiconductor layer; and etching is performed using the source electrode layer 415a and the drain electrode layer 415b as masks. The oxide conductive layers 416a and 416b containing zinc oxide as a component can be easily etched with an alkaline solution such as a resist stripping solution, for example.

Etching treatment for dividing the oxide conductive layer to form a channel formation region is performed by utilizing the difference in etching rates between the oxide semiconductor layer and the oxide conductive layer. The oxide conductive layer over the oxide semiconductor layer is selectively etched utilizing a higher etching rate of the oxide conductive layer as compared with the oxide semiconductor layer.

Therefore, it is preferable that a resist mask used for forming the source electrode layer 415a and the drain electrode layer 415b be removed by an ashing step. In the case of etching with a stripping solution, etching conditions (such as the kind of the etchant, the concentration, and the etching time) are adjusted as appropriate so that the oxide conductive layers and the oxide semiconductor layer are not etched off too much.

The oxide conductive layer 416b which is provided between the oxide semiconductor layer 412 and the drain electrode layer 415b which is formed using a metal material also functions as a low-resistance drain (LRD, also referred to as an LRN (low-resistance n-type conductivity)) region. Similarly, the oxide conductive layer 416a which is provided between the oxide semiconductor layer 412 and the source electrode layer 415a which is formed using a metal material also functions as a low-resistance source (LRS, also referred to as an LRN (low-resistance n-type conductivity)) region. With the structure of the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (HRD region), and is preferably in the range of $1\times10^{20}/cm^3$ to $1\times10^{21}/cm^3$ both inclusive.

When the oxide conductive layers are provided as the source region and the drain region between the oxide semiconductor layer and the source and drain electrode layers, the resistance of the source region and the drain region can be decreased and high-speed operation of the transistor can be realized. It is effective to use the oxide conductive layers as the source and drain regions in order to improve the frequency characteristics of a peripheral circuit (driver circuit). This is because the contact between a metal electrode (e.g., Ti) and an oxide conductive layer can reduce the contact resistance as compared with the contact between a metal electrode (e.g., Ti) and an oxide semiconductor layer.

Further, there has been a problem in that molybdenum (Mo) which is used as a part of a wiring material (e.g., Mo/Al/Mo) in a semiconductor device has high contact resistance with an oxide semiconductor layer. This is because Mo is less likely to be oxidized and has a weaker effect of extracting oxygen from the oxide semiconductor layer as compared with Ti, and a contact interface between Mo and the oxide semiconductor layer is not changed to have n-type conductivity. However, even in such a case, the contact resistance can be reduced by interposing an oxide conductive layer between the oxide semiconductor layer and the source and drain electrode layers; accordingly, the frequency characteristics of a peripheral circuit (driver circuit) can be improved.

The channel length of the thin film transistor is determined at the time of etching of the oxide conductive layer; accordingly, the channel length can be further shortened. For example, the channel length (L) can be set as small as 0.1 μm to 2 μm both inclusive; in this manner, operation speed can be increased.

This embodiment can be implemented combining with any another embodiment as appropriate.

In this manner, a semiconductor device with less parasitic capacitance and low power consumption can be provided as a semiconductor device including a thin film transistor using an oxide semiconductor layer.

A semiconductor device with high reliability can be provided as a semiconductor device including a thin film transistor using an oxide semiconductor layer.

Embodiment 7

Figure 10:
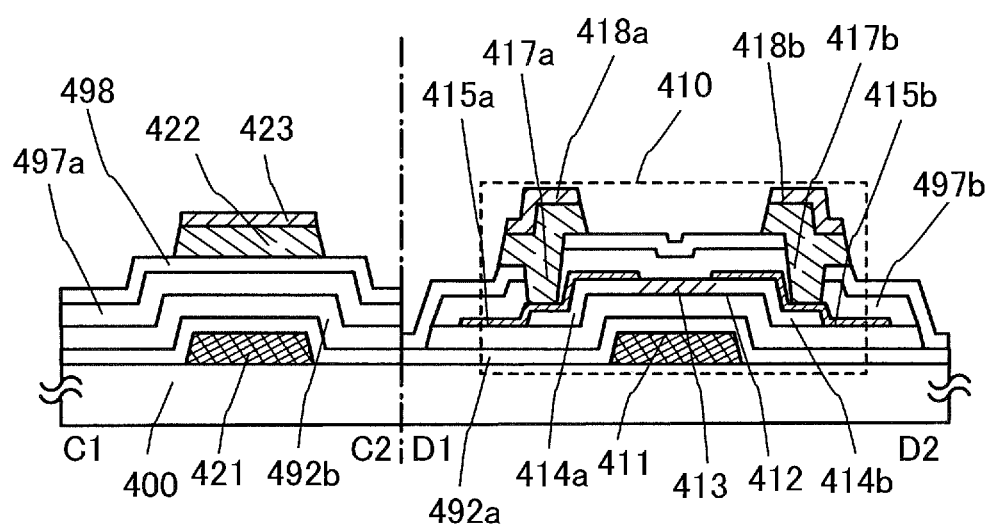
FIG. 10 illustrates a semiconductor device.

In Embodiment 7, FIG. 10 illustrates an example in which an oxide semiconductor layer is surrounded by a nitride insulating film when seen in a cross section thereof. FIG. 10 is the same as FIGS. 1A1, 1A2, and FIG. 1B except that there is differences in the top surface shape and the position of the end portion of an oxide insulating layer and in the structure of a gate insulating layer; therefore, the same portions are denoted by the same reference numerals, and detailed description of the same portions is omitted.

A thin film transistor 410 shown in FIG. 10 is a channel-etched thin film transistor, and includes a gate electrode layer 411, a first gate insulating layer 492a which is formed using a nitride insulating film, a second gate insulating layer 492b which is formed using an oxide insulating film, an oxide semiconductor layer 412 including at least a channel formation region 413, a high-resistance source region 414a, and a high-resistance drain region 414b, a source electrode layer 415a, and a drain electrode layer 415b over a substrate 400 having an insulating surface. Further, an oxide insulating layer 497b which covers the thin film transistor 410 and is in contact with the channel formation region of the oxide semiconductor layer 412 is provided. A protective insulating layer 498 is provided over the oxide insulating layer 497b.

Openings (Contact holes) are formed to reach the source electrode layer 415a and the drain electrode layer 415b, in the oxide insulating layer 487b and the protective insulating layer 498. Wiring layers 417a and 418a are formed in one of the openings and wiring layers 417b and 418b are formed in the other of the openings. In the intersection, a gate wiring layer 421 and source wiring layers 422 and 423 are stacked with the gate insulating layer 402, the oxide insulating layer 497a, and the protective insulating layer 498 interposed therebetween.

In the thin film transistor 410 in this embodiment, the gate insulating layer has a stacked-layer structure in which the nitride insulating film and the oxide insulating film are stacked on the gate electrode layer side. At the time of forming the openings in the oxide insulating layer, the oxide insulating film of the second gate insulating layer is also selectively removed to expose part of the nitride insulating film.

It is preferable that as seen from above, at least the oxide semiconductor layer 412 is inside of the oxide insulating layer 497b and the second gate insulating layer 492b, and the oxide insulating layer 497b and the second gate insulating layer 492b cover the thin film transistor.

Further, the protective insulating layer 498 formed using the nitride insulating film is formed so as to cover the top surface and side surface of the oxide insulating layer 497b and be in contact with the nitride insulating film of the first gate insulating layer 492a.

As each of the protective insulating layer 498 and the first gate insulating layer 492a which are each formed using a nitride insulating film, an inorganic insulating film which contains impurities such as moisture, a hydrogen ion, and OH⁻ as less as possible and blocks entry of the impurities from the outside is used: for example, a silicon nitride film, a silicon oxynitride film, an aluminum nitride film, or an aluminum oxynitride film obtained by a sputtering method or a plasma CVD method is used.

In this embodiment, as the protective insulating layer 498 formed using the nitride insulating film, a silicon nitride film with a thickness of 100 nm is provided by an RF sputtering method so as to cover the top surface and side surface of the oxide semiconductor layer 412. In addition, the protective insulating layer 498 is in contact with the first gate insulating layer 492a formed using the nitride insulating film.

With the structure illustrated in FIG. 10, entry of moisture from the outside can be prevented in a manufacturing process after the formation of the protective insulating layer 498 formed using the nitride insulating film. Further, even after a device is completed as a semiconductor device such as a liquid crystal display device, entry of moisture from the outside can be prevented in the long term; therefore, the long-term reliability of the device can be improved.

In this embodiment, one thin film transistor is surrounded by the nitride insulating film; however, the present invention is not particularly limited: a plurality of thin film transistors may be surrounded by a nitride insulating film, or a plurality of thin film transistors in a pixel portion may be collectively surrounded by a nitride insulating film. A region where the protective insulating layer 498 and the first gate insulating layer 492a are in contact with each other is formed so as to surround at least a pixel portion of an active matrix substrate.

This embodiment can be implemented combining with another embodiment as appropriate.

Embodiment 8

In Embodiment 8, an example of manufacturing an active matrix light-emitting display device using a thin film transistor and a light-emitting element using electroluminescence, according to any of Embodiments 1 to 7 will be described.

Light-emitting elements using electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. Owing to such a mechanism, this light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. In this embodiment, an organic EL element is used as a light-emitting element for description.

Figure 11:
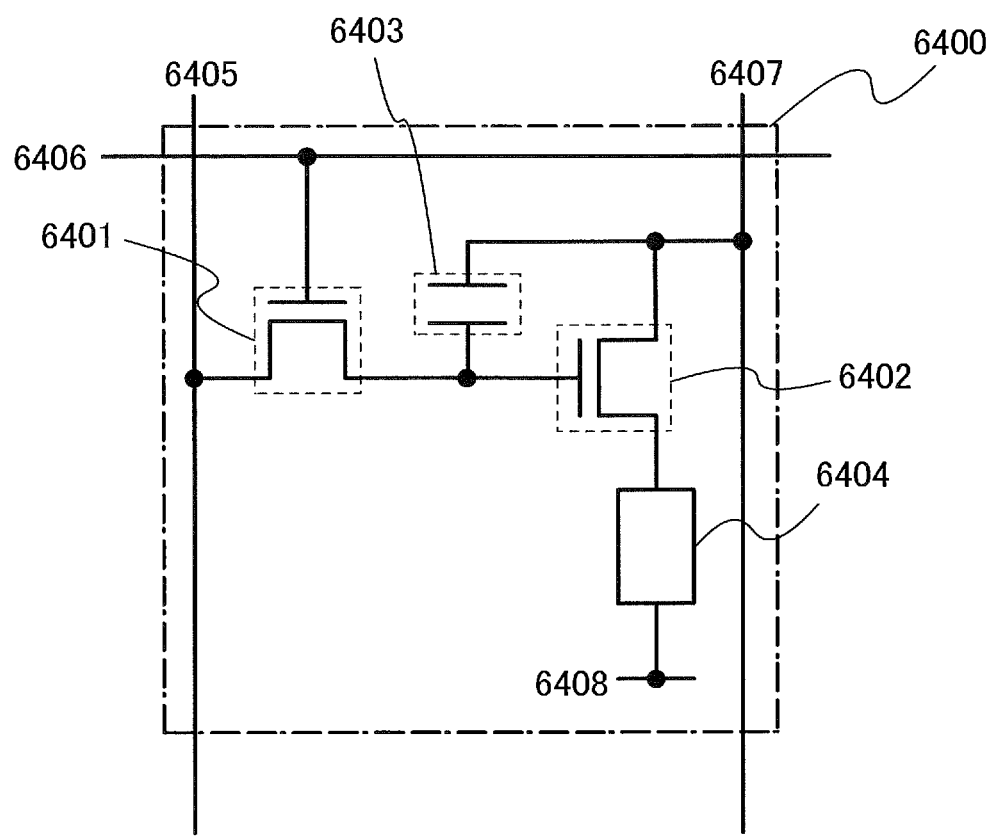
FIG. 11 illustrates an equivalent circuit of a pixel of a semiconductor device.

FIG. 11 illustrates an example of a pixel configuration to which digital time grayscale driving can be applied, as an example of a semiconductor device.

A configuration and operation of the pixel to which digital time grayscale driving can be applied are described. In this embodiment, one pixel includes two n-channel transistors each of which includes a channel formation region using an oxide semiconductor layer.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 via the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. In view of the above, each potential is set so that the potential difference between the high power supply potential and the low power supply potential is a forward threshold voltage or higher of the light-emitting element 6404.

The capacitor 6403 can be omitted by alternatively using the gate capacitance of the driving transistor 6402. The gate capacitance of the driving transistor 6402 may be formed between the channel region and the gate electrode.

In the case of a voltage-input voltage driving method, a video signal is input to the gate of the driving transistor 6402 so that the driving transistor 6402 is in either of two states of being sufficiently turned on or turned off. That is, the driving transistor 6402 operates in a linear region. Since the driving transistor 6402 operates in the linear region, a voltage higher than the voltage of the power supply line 6407 is applied to the gate of the driving transistor 6402. A voltage higher than or equal to (voltage of the power supply line+Vth of the driving transistor 6402) is applied to the signal line 6405.

In the case of performing analog grayscale driving instead of digital time grayscale driving, the same pixel configuration as FIG. 11 can be used by changing an input signal.

In the case of performing analog grayscale driving, a voltage higher than or equal to (forward voltage of the light-emitting element 6404+Vth of the driving transistor 6402) is applied to the gate of the driving transistor 6402. The forward voltage of the light-emitting element 6404 refers to a voltage at which a desired luminance is obtained, and includes at least a forward threshold voltage. A video signal by which the driving transistor 6402 operates in a saturation region is input, so that current can be supplied to the light-emitting element 6404. In order for the driving transistor 6402 to operate in the saturation region, the potential of the power supply line 6407 is set higher than the gate potential of the driving transistor 6402. When an analog video signal is used, it is possible to supply current to the light-emitting element 6404 in accordance with the video signal and perform analog grayscale driving.

The pixel configuration illustrated in FIG. 11 is not limited thereto. For example, a switch, a resistor, a capacitor, a transistor, a logic circuit, or the like may be added to the pixel illustrated in FIG. 11.

Next, structures of the light-emitting element are described with reference to FIGS. 12A to 12C. In this embodiment, a cross-sectional structure of a pixel will be described by taking an n-channel driving TFT as an example. Driving TFTs 7001, 7011, and 7021 used for semiconductor devices illustrated in FIGS. 12A, 12B, and 12C can be manufactured in a manner similar to that of the thin film transistor described in Embodiment 4 and are light-transmitting thin film transistors each including an oxide semiconductor layer.

In order to extract light emitted from the light-emitting element, at least one of an anode and a cathode transmits light. A thin film transistor and the light-emitting element are formed over a substrate. As structures of the light-emitting element, there are the following: a top emission structure in which light emission is extracted through the surface opposite to the substrate; a bottom emission structure in which light emission is extracted through the surface on the substrate side; and a dual emission structure in which light emission is extracted through the surface opposite to the substrate and the surface on the substrate side. The pixel configuration shown in FIG. 11 can be applied to a light-emitting element having any of these emission structures.

A light-emitting element having a bottom emission structure will be described with reference to FIG. 12A.

Figure 12A:
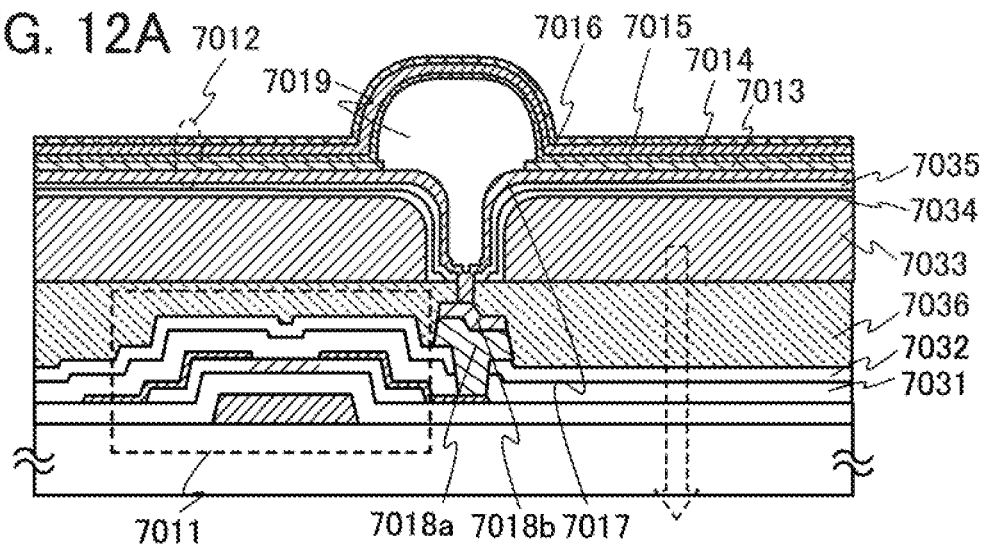
FIGS. 12A to 12C illustrate semiconductor devices.

FIG. 12A is a cross-sectional view of a pixel in the case where the driving TFT 7011 is an n-channel TFT and light is emitted from a light-emitting element 7012 to a first electrode 7013 side. In FIG. 12A, wiring layers 7018a and 7018b which are electrically connected to a drain electrode layer of the driving TFT 7011 are formed, and a planarization insulating layer 7036 is formed thereover. The wiring layer 7018b is in contact with a light-transmitting conductive film 7017 in an opening formed in the planarization insulating layer 7036 and electrically connects the driving TFT 7011 and the light-transmitting conductive film 7017. A first electrode 7013 of a light-emitting element 7012 is formed over the light-transmitting conductive film 7017, and an EL layer 7014 and a second electrode 7015 are stacked over the first electrode 7013 in this order.

As the light-transmitting conductive film 7017, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

The first electrode 7013 of the light-emitting element can be formed using a variety of materials. For example, in the case where the first electrode 7013 is used as a cathode, it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er. In FIG. 12A, the thickness of the first electrode 7013 is a thickness that can transmit light (preferably, about 5 nm to 30 nm). For example, a 20-nm-thick aluminum film is used as the first electrode 7013.

Note that the light-transmitting conductive film and the aluminum film may be stacked and then selectively etched, so that the light-transmitting conductive film 7017 and the first electrode 7013 may be formed. In that case, etching can be performed with the use of the same mask, which is preferable.

The periphery of the first electrode 7013 is covered with a partition wall 7019. The partition wall 7019 is formed using an organic resin film of polyimide, acrylic, polyamide, epoxy, or the like, an inorganic insulating film, or organic polysiloxane. It is particularly preferable that the partition wall 7019 be formed using a photosensitive resin material to have an opening over the first electrode 7013 so that a sidewall of the opening is formed as an inclined surface with continuous curvature. In the case where a photosensitive resin material is used as the partition wall 7019, a step of forming a resist mask can be omitted.

The EL layer 7014 formed over the first electrode 7013 and the partition wall 7019 may include at least a light-emitting layer and be formed as either a single layer or a plurality of layers stacked. When the EL layer 7014 is formed as a plurality of layers, the EL layer 7014 may be formed by stacking an electron-injection layer, an electron-transport layer, a light-emitting layer, a hole-transport layer, and a hole-injection layer in this order over the first electrode 7013 which serves as a cathode. Not all of these layers need to be provided.

The stacking order is not limited to the above; a hole-injection layer, a hole-transport layer, a light-emitting layer, an electron-transport layer, and an electron-injection layer may be stacked in this order over the first electrode 7013 which serves as an anode. However, considering power consumption, it is preferable that the first electrode 7013 serve as a cathode and an electron-injection layer, an electron-transport layer, a light-emitting layer, a hole-transport layer, and a hole-injection layer be stacked in this order over the first electrode 7013 because a voltage increase in a driver circuit portion can be suppressed and power consumption can be reduced.

As the second electrode 7015 formed over the EL layer 7014, various materials can be used. For example, in the case where the second electrode 7015 is used as an anode, it is preferable to use a material having a high work function, such as ZrN, Ti, W, Ni, Pt, Cr, or a light-transmitting conductive material of ITO, IZO, or ZnO. Further, a shielding film 7016, for example, a metal which shields light, a metal which reflects light, or the like is provided over the second electrode 7015. In this embodiment, an ITO film is used as the second electrode 7015, and a Ti film is used as the shielding film 7016.

The light-emitting element 7012 corresponds to a region where the EL layer 7014 including the light-emitting layer is sandwiched between the first electrode 7013 and the second electrode 7015. In the case of the element structure illustrated in FIG. 12A, light emitted from the light-emitting element 7012 is ejected from the first electrode 7013 side as indicated by an arrow.

In the example shown in FIG. 12A, a light-transmitting conductive film is used as a gate electrode layer, and light emitted from the light-emitting element 7012 passes through a color filter layer 7033 to be ejected through the substrate.

The color filter layer 7033 is formed by a droplet discharge method such as an inkjet method, a printing method, an etching method using a photolithography technique, or the like.

The color filter layer 7033 is covered with an overcoat layer 7034, and also covered with a protective insulating layer 7035. The overcoat layer 7034 with a thin thickness is shown in FIG. 12A; however, the overcoat layer 7034 has a function to planarize roughness due to the color filter layer 7033.

A contact hole which is formed in the protective insulating layer 7035, an insulating layer 7032, and an insulating layer 7031 and which reaches the drain electrode layer is provided so as to overlap the partition wall 7019.

Next, a light-emitting element having a dual emission structure will be described with reference to FIG. 12B.

Figure 12B:
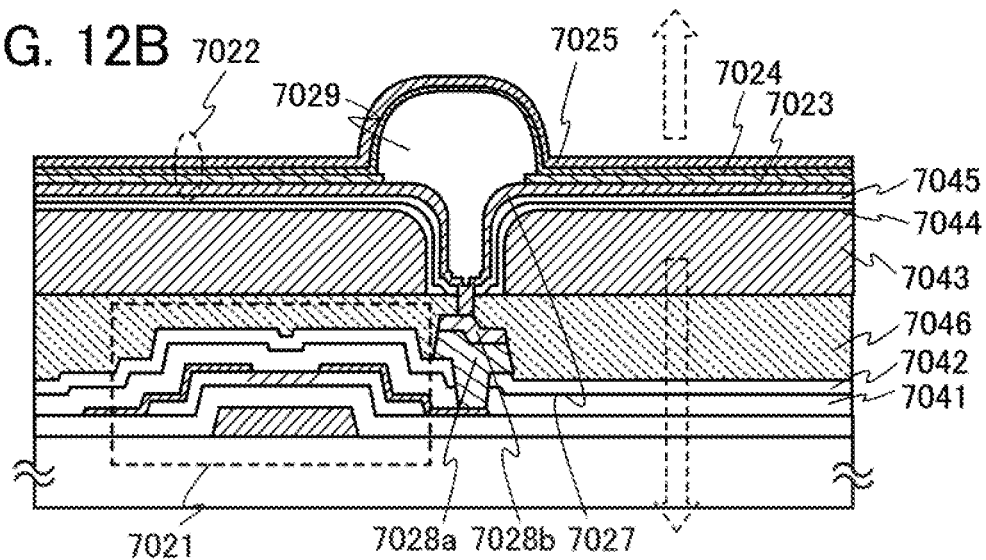

In FIG. 12B, wiring layers 7028a and 7028b which are electrically connected to a drain electrode layer of a driving TFT 7021 are formed, and a planarization insulating layer 7046 is formed thereover. The wiring layer 7028b is in contact with a light-transmitting conductive film 7027 in an opening formed in the planarization insulating layer 7046 and electrically connects the driving TFT 7021 and the light-transmitting conductive film 7027. A first electrode 7023 of a light-emitting element 7022 is formed over the light-transmitting conductive film 7027, and an EL layer 7024 and a second electrode 7025 are stacked over the first electrode 7023 in this order.

As the light-transmitting conductive film 7027, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

The first electrode 7023 can be formed using a variety of materials. For example, in the case where the first electrode 7023 is used as a cathode, it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er. In this embodiment, the first electrode 7023 serves as a cathode and the thickness of the first electrode 7023 is a thickness that can transmit light (preferably, about 5 nm to 30 nm). For example, a 20-nm-thick aluminum film is used as the first electrode 7023.

Note that the light-transmitting conductive film and the aluminum film may be stacked and then selectively etched, so that the light-transmitting conductive film 7027 and the first electrode 7023 may be formed. In that case, etching can be performed with the use of the same mask, which is preferable.

The periphery of the first electrode 7023 is covered with a partition wall 7029. The partition wall 7029 is formed using an organic resin film of polyimide, acrylic, polyamide, epoxy, or the like, an inorganic insulating film, or organic polysiloxane. It is particularly preferable that the partition wall 7029 be formed using a photosensitive resin material to have an opening over the first electrode 7023 so that a sidewall of the opening is formed as an inclined surface with continuous curvature. In the case where a photosensitive resin material is used as the partition wall 7029, a step of forming a resist mask can be omitted.

The EL layer 7024 formed over the first electrode 7023 and the partition wall 7029 may include at least a light-emitting layer and be formed as either a single layer or a plurality of layers stacked. When the EL layer 7024 is formed as a plurality of layers, the EL layer 7024 may be formed by stacking an electron-injection layer, an electron-transport layer, a light-emitting layer, a hole-transport layer, and a hole-injection layer in this order over the first electrode 7023 which serves as a cathode. Not all of these layers need to be provided.

The stacking order is not limited to the above; a hole-injection layer, a hole-transport layer, a light-emitting layer, an electron-transport layer, and an electron-injection layer may be stacked in this order over the first electrode 7023 which serves an anode. However, considering power consumption, it is preferable that the first electrode 7023 serve as a cathode and an electron-injection layer, an electron-transport layer, a light-emitting layer, a hole-transport layer, and a hole-injection layer be stacked in this order over the first electrode 7023 because of lower power consumption.

As the second electrode 7025 formed over the EL layer 7024, various materials can be used. For example, in the case where the second electrode 7025 is used as an anode, it is preferable to use a material having a high work function, such as a light-transmitting conductive material of ITO, IZO, or ZnO. In this embodiment, an ITO film including silicon oxide is used as the second electrode 7025 which serves as an anode.

The light-emitting element 7022 corresponds to a region where the EL layer 7024 including the light-emitting layer is sandwiched between the first electrode 7023 and the second electrode 7025. In the case of the element structure illustrated in FIG. 12B, light emitted from the light-emitting element 7022 is ejected from both the second electrode 7025 side and the first electrode 7023 side as indicated by arrows.

In the example shown in FIG. 12B, a light-transmitting conductive film is used as a gate electrode layer and light-transmitting thin films are used as the source electrode layer and the drain electrode layer, and light emitted from the light-emitting element 7022 to the first electrode 7023 side can pass through a color filter layer 7043 to be ejected though a substrate.

The color filter layer 7043 is formed by a droplet discharge method such as an inkjet method, a printing method, an etching method using a photolithography technique, or the like.

The color filter layer 7043 is covered with an overcoat layer 7044, and also covered with a protective insulating layer 7045.

A contact hole which is formed in a protective insulating layer 7045, an insulating layer 7042, and an insulating layer 7041 and which reaches the drain electrode layer is provided so as to overlap the partition wall 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided over the second electrode 7025.

Next, a light-emitting element having a top emission structure will be described with reference to FIG. 12C.

Figure 12C:
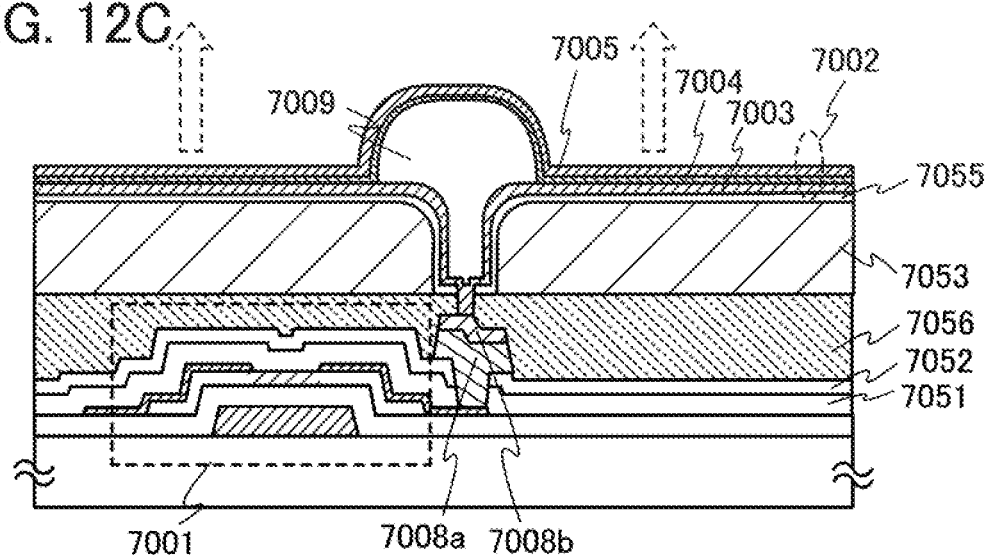

FIG. 12C is a cross-sectional view of a pixel in the case where a driving TFT 7001 is an n-channel TFT and light is emitted from a light-emitting element 7002 to a second electrode 7005 side. In FIG. 12C, wiring layers 7008a and 7008b which are electrically connected to a drain electrode layer of the driving TFT 7001 are formed, and a planarization insulating layer 7056 is formed thereover. The wiring layer 7008b is in contact with a first electrode 7003 of the light-emitting element 7002 in an opening formed in the planarization insulating layer 7056 and electrically connects the driving TFT 7001 and the first electrode 7003 of the light-emitting element 7002. An EL layer 7004 and a second electrode 7005 are stacked over the first electrode 7003 in this order.

The first electrode 7003 can be formed using a variety of materials. For example, in the case where the first electrode 7003 is used as a cathode, it is preferable to use a material having a low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er.

The periphery of the first electrode 7003 is covered with a partition wall 7009. The partition wall 7009 is formed using an organic resin film of polyimide, acrylic, polyamide, epoxy, or the like, an inorganic insulating film, or organic polysiloxane. It is particularly preferable that the partition wall 7009 be formed using a photosensitive resin material to have an opening over the first electrode 7003 so that a sidewall of the opening is formed as an inclined surface with continuous curvature. In the case where a photosensitive resin material is used as the partition wall 7009, a step of forming a resist mask can be omitted.

The EL layer 7004 formed over the first electrode 7003 and the partition wall 7009 may include at least a light-emitting layer and be formed as either a single layer or a plurality of layers stacked. When the EL layer 7004 is formed as a plurality of layers, the EL layer 7004 may be formed by stacking an electron-injection layer, an electron-transport layer, a light-emitting layer, a hole-transport layer, and a hole-injection layer in this order over the first electrode 7003 which serves as a cathode. Not all of these layers need to be provided.

The stacking order is not limited to the above; a hole-injection layer, a hole-transport layer, a light-emitting layer, an electron-transport layer, and an electron-injection layer may be stacked in this order over the first electrode 7003 in the case where the first electrode 7003 is used as an anode.

In FIG. 12C, a hole-injection layer, a hole-transport layer, a light-emitting layer, an electron-transport layer, and an electron-injection layer are stacked in this order over a stacked film in which a Ti film, an aluminum film, and a Ti film are stacked in this order, and thereover, a stacked layer of a Mg:Ag alloy thin film and ITO is formed.

However, in the case where the driving TFT 7001 is an n-channel TFT, it is preferable that an electron-injection layer, an electron-transport layer, a light-emitting layer, a hole-transport layer, and a hole-injection layer be stacked in this order over the first electrode 7003 because a voltage increase in a driver circuit can be suppressed and power consumption can be reduced.

The second electrode 7005 is formed using a light-transmitting conductive material; for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 including the light-emitting layer is sandwiched between the first electrode 7003 and the second electrode 7005. In the case of the element structure illustrated in FIG. 12C, light emitted from the light-emitting element 7002 is ejected from the second electrode 7005 side as indicated by an arrow.

In FIG. 12C, the drain electrode layer of the TFT 7001 is electrically connected to the first electrode 7003 through a contact hole formed in an oxide insulating layer 7051, a protective insulating layer 7052, the planarization insulating layer 7056, a planarization insulating layer 7053, and an insulting layer 7055. The planarization insulating layer 7036, 7046, 7053, and 7056 are formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarization insulating layer 7036, 7046, 7053, and 7056 may be formed by stacking a plurality of insulating films formed of these materials. There is no particular limitation on the method for forming the planarization insulating layer 7036, 7046, 7053, and 7056, and the planarization insulating layer 7036, 7046, 7053, and 7056 can be formed, depending on the material, by any method such as a sputtering method, a spin coating method, a dipping method, a spray coating method, a droplet discharge method (such as an inkjet method, screen printing, offset printing, or the like), a roll coating method, a curtain coating method, or a knife coating method.

The partition wall 7009 is provided so as to insulate the first electrode 7003 and a first electrode of an adjacent pixel. The partition wall 7009 is formed using an organic resin film such as polyimide, acrylic, polyamide, or epoxy; an inorganic insulating film; or organic polysiloxane. It is particularly preferable that the partition wall 7009 be formed using a photosensitive resin material to have an opening over the first electrode 7003 so that a sidewall of the opening is formed as an inclined surface with continuous curvature. In the case where a photosensitive resin material is used for the partition wall 7009, a step of forming a resist mask can be omitted.

In the structure of FIG. 12C, in the case where full color display is performed, for example, the light-emitting element 7001 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

Further alternatively, in the structure of FIG. 12C, all of a plurality of light-emitting elements which is arranged may be white light-emitting elements and a sealing substrate having a color filter or the like may be arranged over the light-emitting element 7002, so that a light-emitting display device capable of full color display may be manufactured. A material which exhibits a single color such as white is formed and combined with a color filter or a color conversion layer, whereby full color display can be performed.

The step and materials for forming the source electrode layer 415a and the drain electrode layer 415b described in Embodiment 1 can be applied to each source electrode layer and each drain electrode layer. The step and materials for forming the wiring layers 417a and 418a or the wiring layers 417b and 418b described in Embodiment 1 can be applied to any of the wiring layers 7018a and 7018b, the wiring layers 7028a and 7028b, and the wiring layers 7008a and 7008b.

It is preferable that the source electrode layer and the drain electrode layer are each as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced. Accordingly, a semiconductor device with low power consumption, including a thin film transistor using an oxide semiconductor layer can be provided.

Needless to say, display of monochromatic light can be performed. For example, a lighting system may be formed with the use of white light emission, or an area-color light-emitting device may be formed with the use of a single color light emission.

If necessary, an optical film such as a polarizing film including a circularly polarizing plate may be provided.

Although organic EL elements are described as the light-emitting elements in this embodiment, an inorganic EL element can be provided as a light-emitting element as well.

Although the example is described in which a thin film transistor (a driving TFT) which controls the driving of a light-emitting element is electrically connected to a light-emitting element, a TFT for current control may be connected between the driving TFT and the light-emitting element.

This embodiment can be implemented combining with another embodiment as appropriate.

Embodiment 9

Figure 13A:
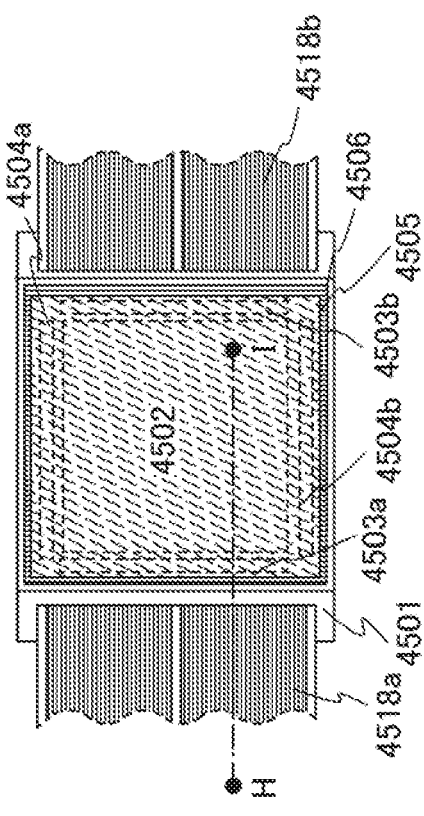
FIGS. 13A and 13B illustrate a semiconductor device.
Figure 13B:
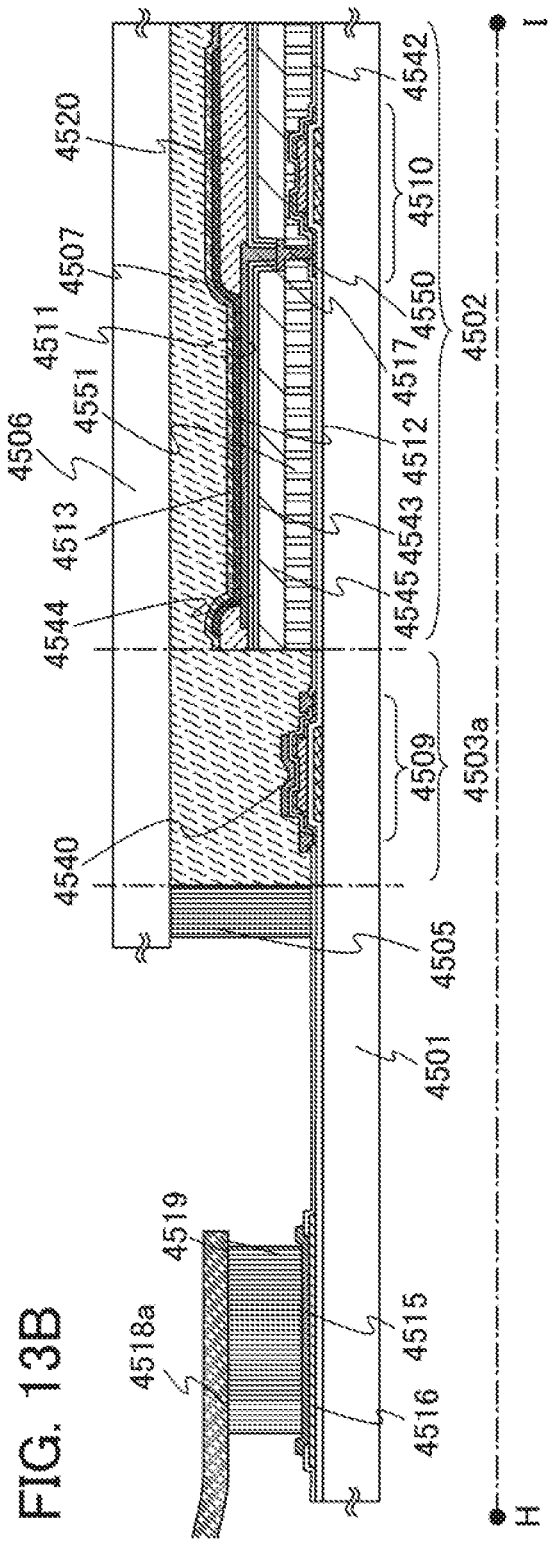

In Embodiment 9, the appearance and a cross section of a light-emitting display panel (also referred to as a light-emitting panel) will be described with reference to FIGS. 13A and 13B. FIG. 13A is a plan view of a panel in which a thin film transistor and a light-emitting element that are formed over a first substrate are sealed between the first substrate and a second substrate with a sealant. FIG. 13B is a cross-sectional view along H-I in FIG. 13A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b, which are provided over the first substrate 4501, each include a plurality of thin film transistors. A thin film transistor 4510 included in the pixel portion 4502 and a thin film transistor 4509 included in the signal line driver circuit 4503a are illustrated as an example in FIG. 13B.

The highly reliable thin film transistor including an oxide semiconductor layer which is described in any of Embodiments 1 to 7 can be used as the thin film transistor 4510 in the pixel. The thin film transistor 4509 in the driver circuit has the structure in which a conductive layer is provided so as to overlap a channel formation region of an oxide semiconductor layer of the thin film transistor described in Embodiment 1. In this embodiment, the thin film transistors 4509 and 4510 are n-channel thin film transistors.

A conductive layer 4540 is provided over an oxide insulating layer 4542, so as to overlap a channel formation region of an oxide semiconductor layer in the thin film transistor 4509 in the driver circuit. The conductive layer 4540 is provided so as to overlap the channel formation region of the oxide semiconductor layer, whereby the amount of change in threshold voltage of the thin film transistor 4509 by the BT test can be reduced. The potential of the conductive layer 4540 may be the same as or different from that of a gate electrode layer of the thin film transistor 4509, and the conductive layer 4540 can also function as a second gate electrode layer. The potential of the conductive layer 4540 may be GND or 0 V, or the conductive layer 4540 may be in a floating state.

The oxide insulating layer 4542 which covers the oxide semiconductor layer of the thin film transistor 4510 is formed. A source electrode layer or a drain electrode layer of the thin film transistor 4510 is electrically connected to a wiring layer 4550 in an opening formed in the oxide insulating layer 4542 and an insulating layer 4551 which are provided over the thin film transistor. The wiring layer 4550 is formed in contact with a first electrode 4517, and the thin film transistor 4510 is electrically connected to the first electrode 4517 via the wiring layer 4550.

The step and materials for forming the source electrode layer 415a and the drain electrode layer 415b described in Embodiment 1 can be applied to the source electrode layer and the drain electrode layer. The step and any material/materials for forming the wiring layers 417a and 418a or the wiring layers 417b and 418b described in Embodiment 1 can be applied to the wiring layer 4550.

It is preferable that the source electrode layer and the drain electrode layer are each as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced. Accordingly, a semiconductor device with low power consumption, including a thin film transistor using an oxide semiconductor layer can be provided.

The step and material for forming the oxide insulating layer 407 described in Embodiment 1 can be applied to the oxide insulating layer 4542.

A color filter layer 4545 is formed over the insulating layer 4551 so as to overlap a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 may be formed by a similar manner to the manner for forming the protective insulating layer 408 described in Embodiment 1; for example, a silicon nitride film may be formed by a sputtering method.

The first electrode 4517 which is a pixel electrode included in the light-emitting element 4511 is electrically connected to the source electrode layer or the drain electrode layer of the thin film transistor 4510 via the wiring layer 4550. Note that the light-emitting element 4511 has a stacked-layer structure of the first electrode layer 4517, an electroluminescent layer 4512, and a second electrode layer 4513; however, there is no limitation on the structure. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening over the first electrode 4517 so that a sidewall of the opening is formed as a tilted surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, and the pixel portion 4502 from FPCs 4518*a* and 4518*b*.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518*a* via an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used as the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate for a light-emitting surface of the light-emitting element. Further, the polarizing plate or the circularly polarizing plate may be provided with an anti-reflection film. For example, anti-glare treatment by which reflected light can be diffused by roughness on the surface so as to reduce the glare can be performed.

The signal line driver circuits 4503*a* and 4503*b* and the scanning line driver circuits 4504*a* and 4504*b* may be mounted as driver circuits formed using a single crystal semiconductor film or a polycrystalline semiconductor film over a substrate separately prepared. Alternatively, only the signal line driver circuits or a part thereof, or only the scan line driver circuits or a part thereof may be separately formed and mounted. The present invention is not limited to the structure illustrated in FIGS. 13A and 13B.

Through the above process, a highly reliable light-emitting display device (display panel) as a semiconductor device can be manufactured.

This embodiment can be implemented combining with another embodiment as appropriate.

Embodiment 10

Figures 14A, 14B, 14C:
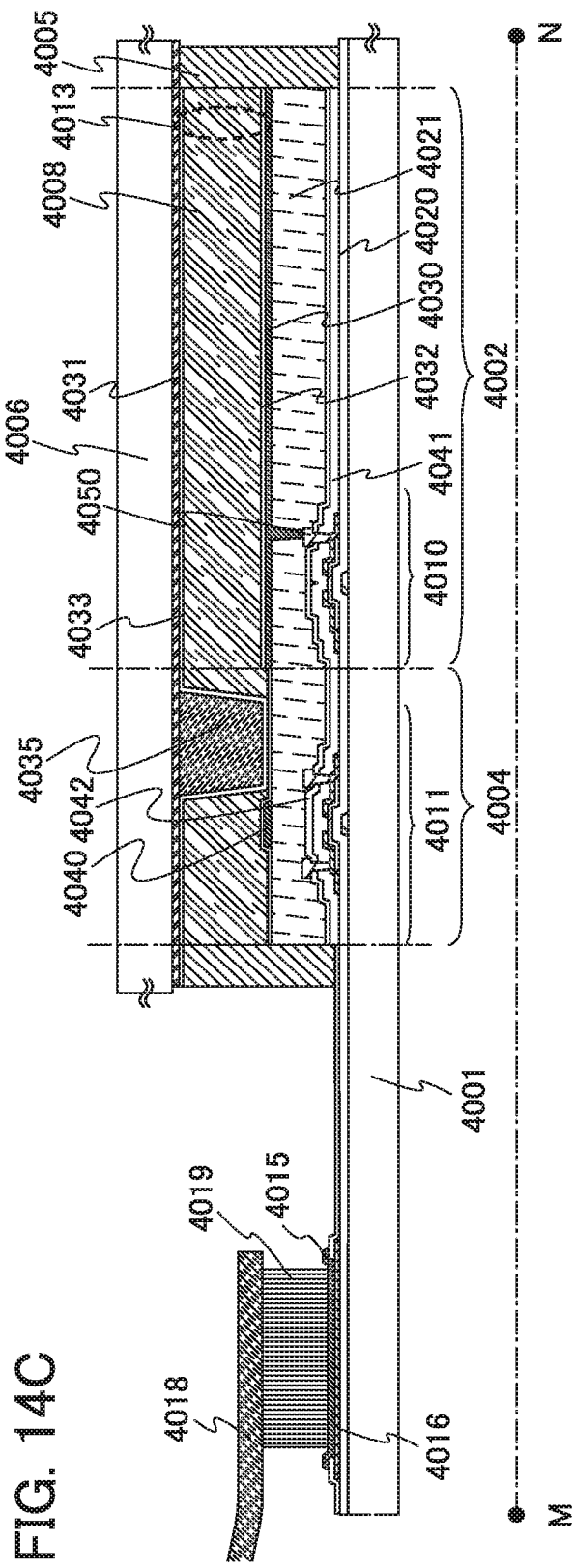
FIGS. 14A to 14C each illustrate a semiconductor device.

The appearance and a cross section of a liquid crystal display panel, which is an embodiment of a semiconductor device, will be described with reference to FIGS. 14A to 14C. FIGS. 14A and 14B are each a plan view of a panel in which thin film transistors 4010 and 4011 and a liquid crystal element 4013 are sealed between a first substrate 4001 and a second substrate 4006 with a sealant 4005. FIG. 14B is a cross-sectional view taken along line M-N of FIG. 14A or 14C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

The connection method of a driver circuit which is separately formed is not particularly limited; a COG method, a wire bonding method, a TAB method, or the like can be used. FIG. 14A illustrates an example of mounting the signal line driver circuit 4003 by a COG method, and FIG. 14C illustrates an example of mounting the signal line driver circuit 4003 by a TAB method.

The pixel portion 4002 and the scan line driver circuit 4004 provided over the first substrate 4001 each include a plurality of thin film transistors. FIG. 14B illustrates, as an example, the thin film transistor 4010 included in the pixel portion 4002 and the thin film transistor 4011 included in the scan line driver circuit 4004. Insulating layers 4041, 4042, 4020, and 4021 are provided over the thin film transistors 4010 and 4011.

As the thin film transistor 4011 in the driver circuit and the thin film transistor 4010 in the pixel, the highly reliable thin film transistors each including an oxide semiconductor layer described in any of Embodiments 1 to 7 can be employed. In this embodiment, the thin film transistors 4010 and 4011 are n-channel thin film transistors.

A conductive layer 4040 is provided over the insulating layer 4021, so as to overlap a channel formation region of the oxide semiconductor layer in the thin film transistor 4011 in the driver circuit. The conductive layer 4040 is provided so as to overlap the channel formation region of the oxide semiconductor layer, whereby the amount of change in threshold voltage of the thin film transistor 4011 by the BT test can be reduced. The potential of the conductive layer 4040 may be the same as or different from that of a gate electrode layer of the thin film transistor 4011, and the conductive layer 4040 can also function as a second gate electrode layer. The potential of the conductive layer 4040 may be GND or 0 V, or the conductive layer 4040 may be in a floating state.

In addition, a pixel electrode 4030 of a liquid crystal element 4013 is electrically connected to a source electrode layer or a drain electrode layer of the thin film transistor 4010 via a wiring layer 4050. A counter electrode layer 4031 of the liquid crystal element 4013 is provided for the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with insulating layers 4032 and 4033 interposed therebetween.

A light-transmitting substrate can be used as the first substrate 4001 and the second substrate 4006; glass, ceramics, or plastics can be used. As plastics, a fiberglass-reinforced plastics (FRP) plate, a polyvinyl fluoride (PVF) film, a polyester film, or an acrylic resin film can be used.

Reference numeral 4035 denotes a columnar spacer obtained by selectively etching an insulating film and is provided to control the distance between the pixel electrode layer 4030 and the counter electrode layer 4031 (the cell gap). Alternatively, a spherical spacer may be used. In addition, the counter electrode layer 4031 is electrically connected to a common potential line formed over the same substrate as the thin film transistor 4010. With use of the common connection portion, the counter electrode layer 4031 and the common potential line can be electrically connected to each other by conductive particles arranged between a pair of substrates. The conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal exhibiting a blue phase and a chiral agent has a short response time of 1 msec or less, and has optical isotropy, which makes the alignment process unneeded, and has a small viewing angle dependence.

The present invention can also be applied to a transflective liquid crystal display device as well as a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of the manufacturing process. Further, a light-blocking film serving as a black matrix may be provided except in the display portion.

An insulating layer 4041 is formed so as to be in contact with each oxide semiconductor layer of the thin film transistors 4011 and 4010. The material and the method for forming the oxide insulating layer 407 described in Embodiment 1 can be applied to the insulating layer 4041. In this embodiment, a silicon oxide film is formed as the insulating layer 4041 by a sputtering method with the use of Embodiment 1. A protective insulating layer 4042 is formed on and in contact with the insulating layer 4041. The protective insulating layer 4042 can be formed in a similar manner to the manner for forming the protective insulating layer 408 described in Embodiment 1; for example, a silicon nitride film can be used. In addition, in order to reduce the surface roughness of the thin film transistors, the protective insulating layer 4042 is covered with an insulating layer 4021 functioning as a planarization insulating film.

The insulating layer 4021 is formed as the planarization insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. The insulating layer 4021 may be formed by stacking a plurality of insulating films formed using these materials.

There is no particular limitation on the method for forming the insulating layer 4021, and the insulating layer 4021 can be formed, depending on a material thereof, by a sputtering method, a spin coating method, a dipping method, a spray coating method, a droplet discharging method (e.g., an ink jet method, a screen printing method, or an offset printing method), a roll coating method, a curtain coating method, a knife coating method, or the like. The baking step of the insulating layer 4021 also serves as annealing of the semiconductor layer, whereby a semiconductor device can be manufactured efficiently.

The pixel electrode layer 4030 and the counter electrode layer 4031 each can be formed using a light-transmitting conductive material such as indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like.

Conductive compositions including a conductive high molecule (also referred to as a conductive polymer) can be used to form the pixel electrode layer 4030 and the counter electrode layer 4031. It is preferable that the pixel electrode formed using the conductive composition have a sheet resistance of less than or equal to 10000 ohms per square and a transmittance of greater than or equal to 70% at a wavelength of 550 nm. Further, it is preferable that the resistivity of the conductive high molecule included in the conductive composition be less than or equal to 0.1 Ω·cm.

As the conductive high molecule, a so-called 7c-electron conjugated conductive high molecule can be used. For example, polyaniline or a derivative thereof, polypyrrole or a derivative thereof, polythiophene or a derivative thereof, a copolymer of two or more kinds of them, and the like can be given.

A variety of signals and potentials are supplied to the signal line driver circuit 4003 which is formed separately, the scan line driver circuit 4004, and the pixel portion 4002 from an FPC 4018.

A connection terminal electrode 4015 is formed using the same conductive film as the pixel electrode layer 4030 included in the liquid crystal element 4013, and a terminal electrode 4016 is formed using the same conductive film as the source and drain electrode layers of the thin film transistors 4010 and 4011.

The connection terminal electrode 4015 is electrically connected to a terminal included in the FPC 4018 via an anisotropic conductive film 4019.

FIGS. 14A to 14C illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

For the liquid crystal display module, a twisted nematic (TN) mode, an In-Plane-Switching (IPS) mode, an fringe field switching (FFS) mode, a Multi-domain Vertical Alignment (MVA) mode, a patterned vertical alignment (PVA) mode, an Axially Symmetric aligned Micro-cell (ASM) mode, an optically compensated birefringence (OCB) mode, a ferroelectric liquid crystal (FLC) mode, an antiferroelectric liquid crystal (AFLC) mode, or the like can be used.

Further, an example of a VA liquid crystal display device is described below.

The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 15:
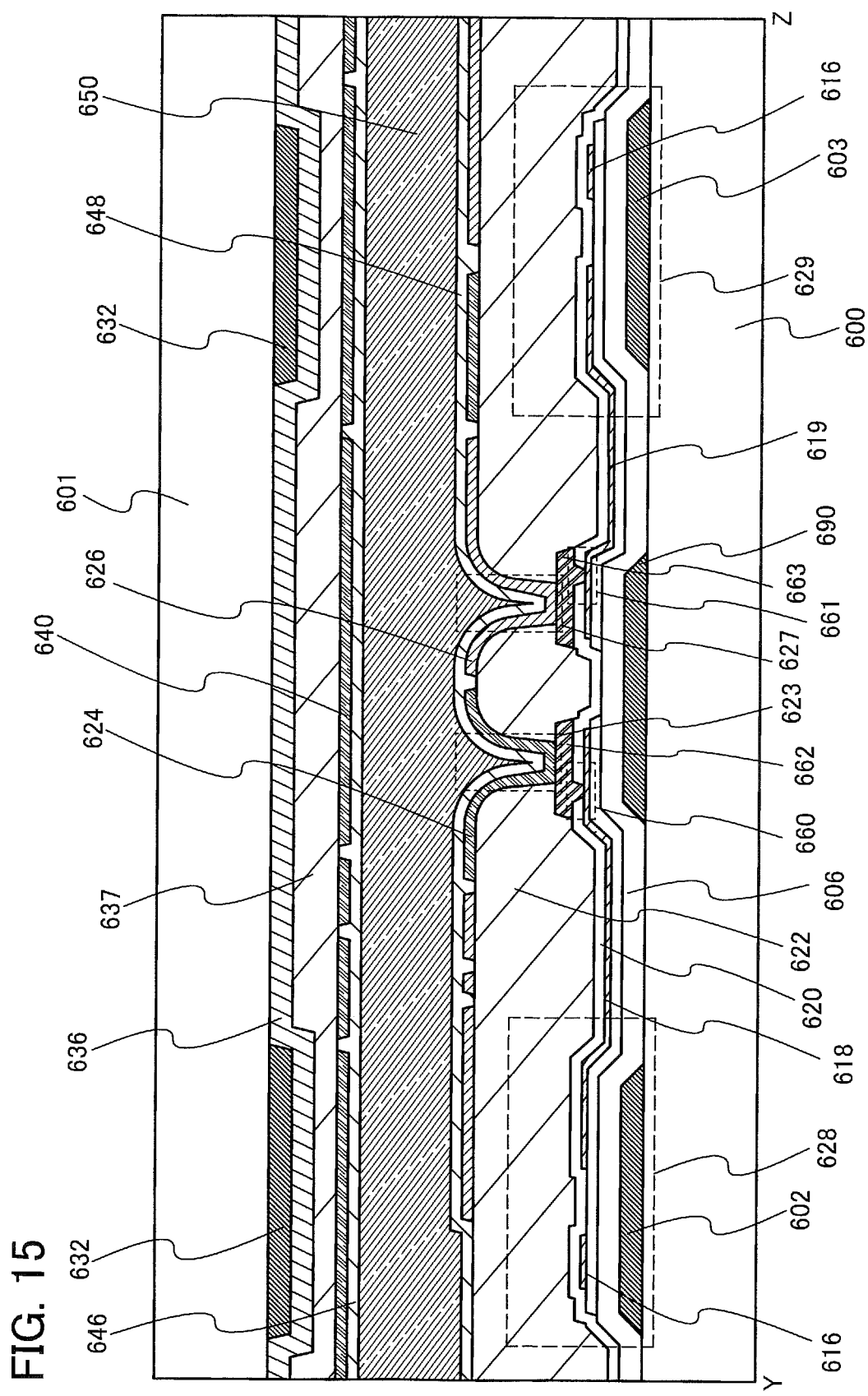
FIG. 15 illustrates a semiconductor device.
Figure 16:
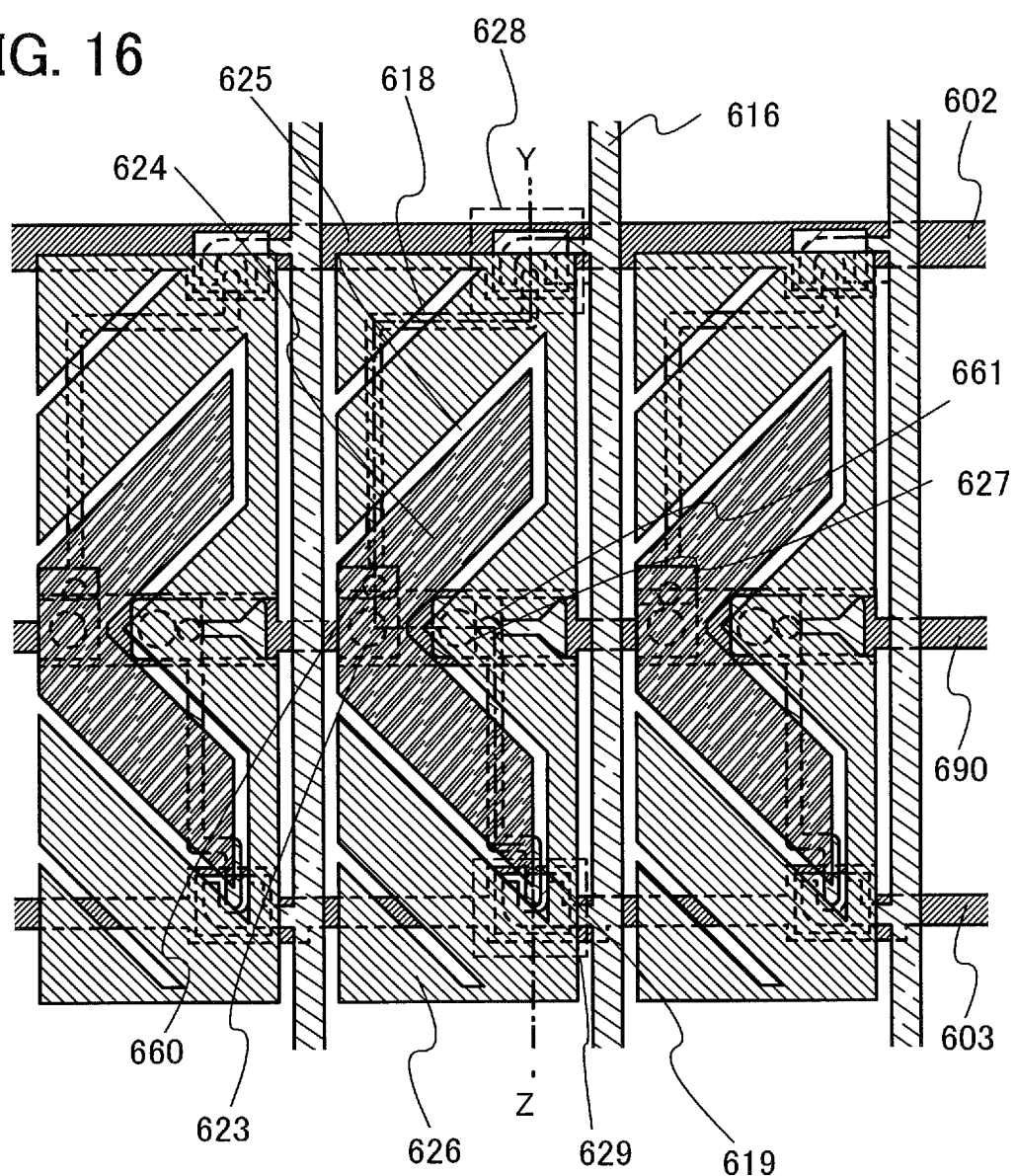
FIG. 16 illustrates a semiconductor device.

FIGS. 15 and 16 each show a pixel structure of a VA liquid crystal display panel. FIG. 16 is a plan view of a substrate 600. FIG. 15 shows a cross-sectional structure along line Y-Z in FIG. 16. Description below is given with reference to both the drawings.

In this pixel structure, a plurality of pixel electrodes are provided in one pixel, and a TFT is connected to each pixel electrode. The plurality of TFTs is constructed so as to be driven by different gate signals. That is, signals that are applied to individual pixel electrodes in multi-domain pixels are controlled independently each other.

A pixel electrode layer 624 is connected to a source or drain electrode layer 618 of a TFT 628 via a wiring 662 in contact holes 623 and 660. Further, a pixel electrode layer 626 is connected to a source or drain electrode layer 619 of a TFT 629 via a wiring 663 in contact holes 627 and 661 formed in an insulating layer 620 and an insulating layer 622 provided to cover the insulating layer 620. A gate wiring 602 of the TFT 628 is separated from a gate wiring 603 of the TFT 629 so that different gate signals can be supplied. On the other hand, the source or drain electrode layer 619 serving as a data line is shared by the TFTs 628 and 629. As each of the TFTs 628 and 629, any of the thin film transistors described in Embodiments 1 to 7 can be used as appropriate.

The step and materials for forming the source electrode layer 415a and the drain electrode layer 415b described in Embodiment 1 can be applied to the source or drain electrode layers 616, 618, and 619. The step and materials for forming the wiring layers 417a and 418a or the wiring layers 417b and 418b described in Embodiment 1 can be applied to any of the wiring 662 and 663.

It is preferable that the source electrode layer and the drain electrode layer are each as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced. Accordingly, a semiconductor device with low power consumption, including a thin film transistor using an oxide semiconductor layer can be provided.

Further, a capacitor wiring 690 is provided and a gate insulating layer 606 is stacked thereover, which is used as a dielectric in a storage capacitor using the pixel electrode or a capacitor electrode which is electrically connected to the pixel electrode.

Figure 18:
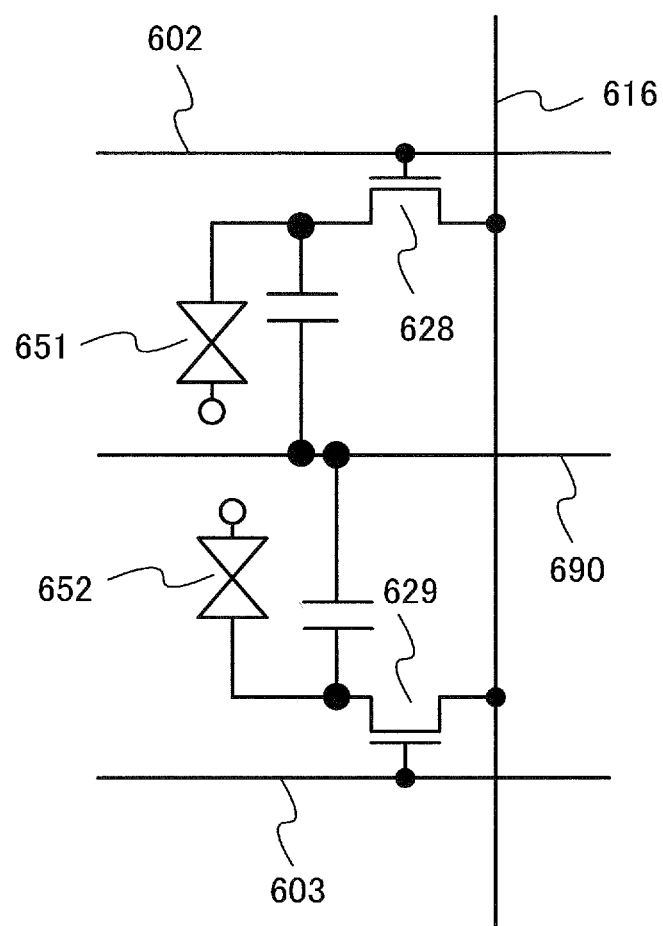
FIG. 18 illustrates an equivalent circuit of a pixel of a semiconductor device.

The shape of the pixel electrode layer 624 is different from that of the pixel electrode layer 626, and the pixel electrode layers are separated by slits 625. The pixel electrode layer 626 is formed so as to surround the pixel electrode layer 624 which has a V shape. Timing of voltage application to the pixel electrode layers 624 and 626 are made to be different by the TFTs 628 and 629, whereby alignment of liquid crystal is controlled. FIG. 18 shows an equivalent circuit of this pixel configuration. The TFT 628 is connected to the gate wiring 602, and the TFT 629 is connected to the gate wiring 603. By supplying different gate signals to the gate wirings 602 and 603, operation timing of the TFTs 628 and 629 can be different.

Figure 17:
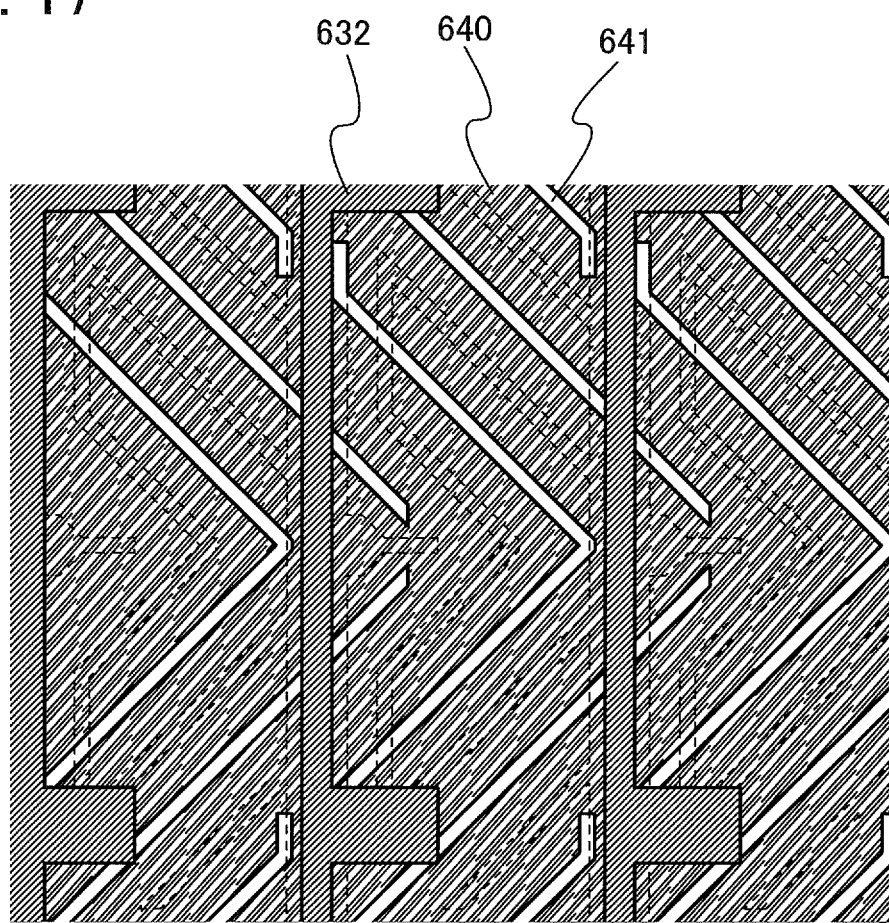
FIG. 17 illustrates a semiconductor device.

The counter substrate 601 is provided with a light-blocking film 632, a second coloring film 636, and a counter electrode layer 640. A planarization film 637 which is also called an overcoat film is formed between the second color film 636 and the counter electrode 640 to prevent alignment disorder of liquid crystals. FIG. 17 shows a structure on the counter substrate side. The counter electrode layer 640 is an electrode shared by plural pixels and provided with slits 641. The slit 641 and the slit 625 on the side of the pixel electrode layers 624 and 626 are alternately arranged in an engaging manner; thus, an oblique electric field is effectively generated, and the alignment of liquid crystals can be controlled. Accordingly, the orientation of the liquid crystals can be varied depending on the position, so that the viewing angle is widened.

Further, the pixel electrode layer 624, a liquid crystal layer 650, and the counter electrode layer 640 overlap each other, so that a first liquid crystal element is formed. Moreover, the pixel electrode layer 626, the liquid crystal layer 650, and the counter electrode layer 640 overlap each other to form a second liquid crystal element. Furthermore, the multi-domain structure is employed in which the first liquid crystal element and the second liquid crystal element are provided for one pixel.

This embodiment can be implemented combining with another embodiment as appropriate.

Embodiment 11

In Embodiment 11, an example of an electronic paper will be described as a semiconductor device of an embodiment of the present invention.

Figure 19:
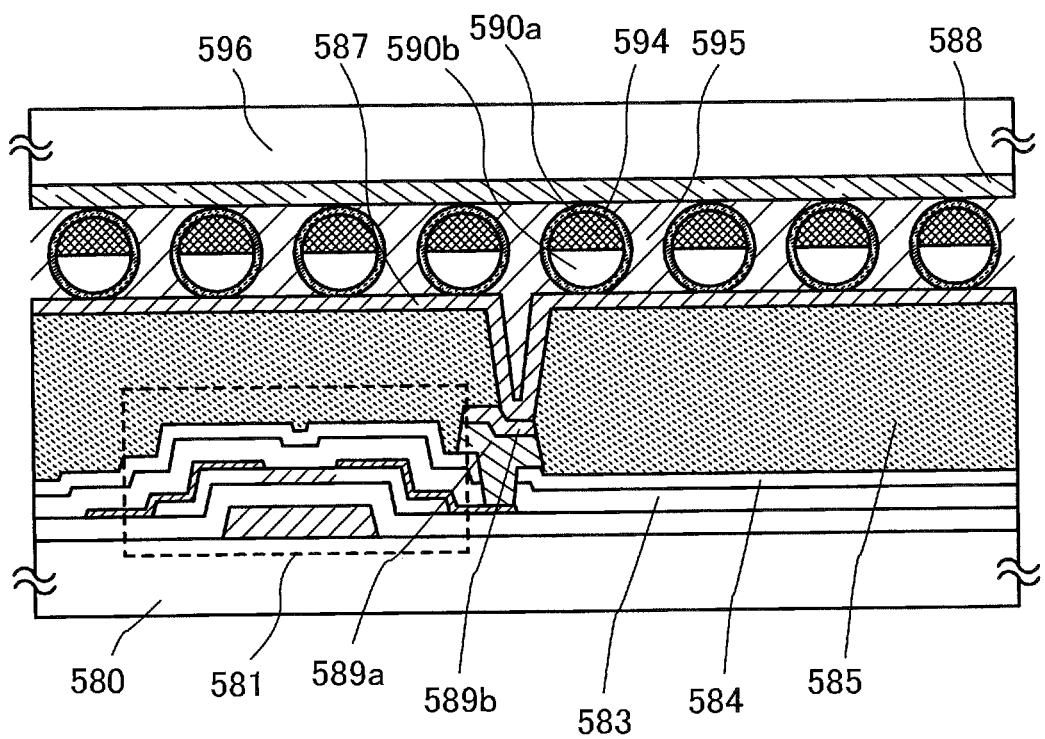
FIG. 19 illustrates a semiconductor device.

FIG. 19 illustrates an active matrix electronic paper as an example of a semiconductor device to which an embodiment of the present invention is applied. As a thin film transistor 581 used in the semiconductor device, the thin film transistor which is described in any one of Embodiments 1 to 7 can be used as appropriate.

The electronic paper in FIG. 19 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 provided over a substrate 580 is a bottom-gate thin film transistor, and a source or drain electrode layer thereof is electrically connected to wiring layers 589a and 589b in an opening formed in an oxide insulating layer 583 and a protective insulating layer 584. The wiring layer 589b is provided in contact with a first electrode layer 587 in an opening formed in an insulating layer 585 provided above the wiring layer 589b. The thin film transistor 581 is electrically connected to the first electrode layer 587 via the wiring layers 589a and 589b.

The step and materials for forming the source electrode layer 415a and the drain electrode layer 415b described in Embodiment 1 can be applied to the source or drain electrode layer. The step and materials for forming the wiring layers 417a and 418a or the wiring layers 417b and 418b described in Embodiment 1 can be applied to any of the wiring layers 589a and 589b.

It is preferable that the source electrode layer and the drain electrode layer are each as thin as a thickness greater than or equal to 0.1 nm and less than or equal to 50 nm; a film which is thinner than the wiring layer is used. Since each of the source and drain electrode layers are thin conductive films, the parasitic capacitance formed with the gate electrode layer can be reduced. Accordingly, a semiconductor device with low power consumption, including a thin film transistor using an oxide semiconductor layer can be provided.

Between the first electrode layer 587 and a second electrode layer 588, spherical particles are provided. Each spherical particle includes a black region 590a and a white region 590b, and a cavity 594 filled with liquid around the black region 590a and the white region 590b. The circumference of the spherical particle 589 is filled with filler 595 such as a resin (see FIG. 19). In this embodiment, the first electrode layer 587 corresponds to a pixel electrode and the second electrode layer 588 provided for a counter substrate 596 corresponds to a common electrode.

Further, instead of the twisting ball, an electrophoretic element can be used as well. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented combining with another embodiment as appropriate.

Embodiment 12

A semiconductor device disclosed in this specification can be applied to a variety of electronic appliances (including amusement machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 20A:
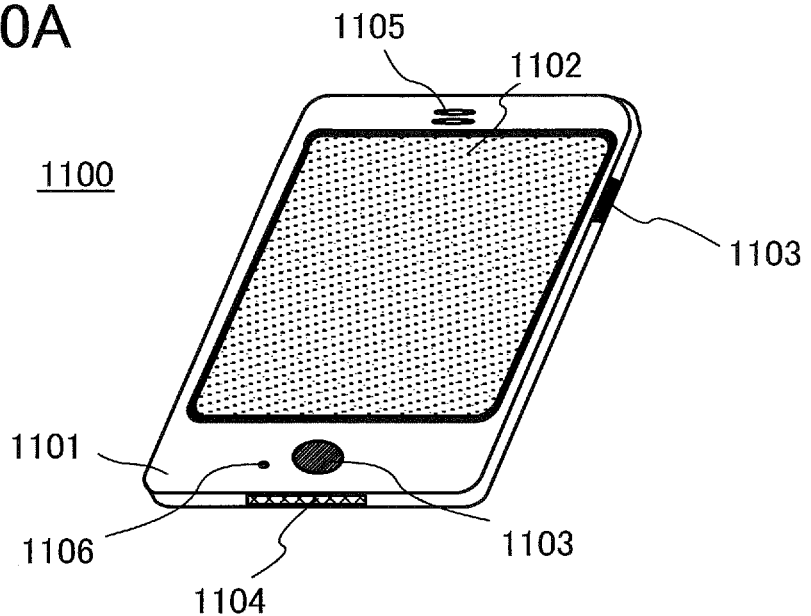
FIGS. 20A and 20B illustrate electronic appliances.

FIG. 20A illustrates an example of a mobile phone handset 1100. The mobile phone handset 1100 is provided with a display portion 1102 incorporated in a housing 1101, operation buttons 1103, an external connection port 1104, a speaker 1105, a microphone 1106, and the like.

The display portion 1102 of the mobile phone handset 1100 illustrated in FIG. 20A can be touched with a finger or the like, by which data can be input into the mobile phone handset 1100. Further, operations such as making calls, composing mails, or the like can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that text displayed on a screen can be input. In that case, it is preferable to display a keyboard or number buttons on almost all area of the screen of the display portion 1102.

When a detection device including a sensor for detecting inclination, such as a gyroscope or an acceleration sensor, is provided inside the mobile phone handset 1100, display on the screen of the display portion 1102 can be automatically switched by determining the direction of the mobile phone handset 1100 (whether the mobile phone handset 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of the image displayed on the display portion 1102. For example, when a signal of an image displayed on the display portion is a signal of moving image data, the screen mode is switched to the display mode; when the signal is a signal of text data, the screen mode is switched to the input mode.

Further, in the input mode, when input by touching the display portion 1102 is not performed for a certain period while a signal detected by the optical sensor in the display portion 1102 is detected, the screen mode may be controlled so as to be switched from the input mode to the display mode.

The display portion 1102 can also function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can be taken.

In the display portion 1102, the plurality of thin film transistors described in Embodiment 1 is provided as switching elements of pixels.

Figure 20B:
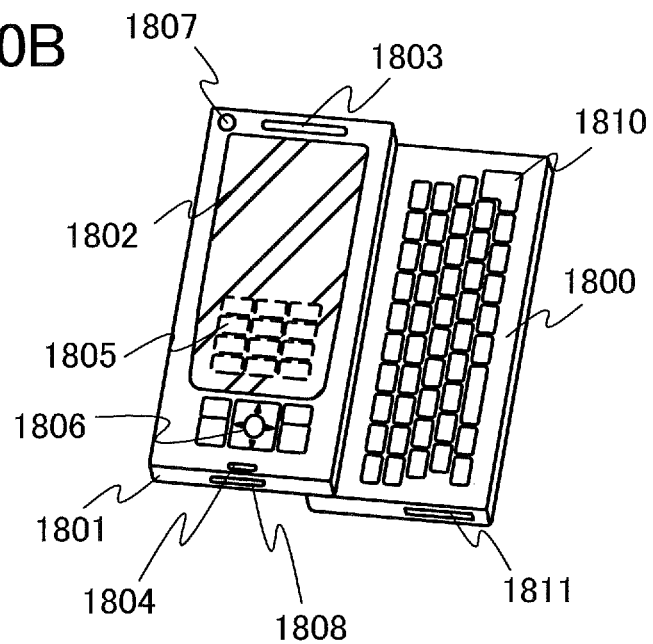

FIG. 20B illustrates another example of a mobile phone handset. A portable information terminal whose example is illustrated in FIG. 20B can have a plurality of functions. For example, in addition to a telephone function, such a portable information terminal can have a function of processing a variety of pieces of data by incorporating a computer.

The portable information terminal illustrated in FIG. 20B includes a housing 1800 and a housing 1801. The housing 1800 is provided with a display panel 1802, a speaker 1803, a microphone 1804, a pointing device 1806, a camera lens 1807, an external connection terminal 1808, and the like. The housing 1801 is provided with a keyboard 1810, an external memory slot 1811, and the like. In addition, an antenna is incorporated in the housing 1801.

The display panel 1802 is provided with a touch panel. A plurality of operation keys 1805 which is displayed as images is illustrated by dashed lines in FIG. 20B.

Further, in addition to the above structure, a contactless IC chip, a small memory device, or the like may be incorporated.

The light-emitting device of the present invention can be used for the display panel 1802 and the direction of display is changed appropriately depending on an application mode. Further, the display device is provided with the camera lens 1807 on the same surface as the display panel 1802, which enables videophone. The speaker 1803 and the microphone 1804 can be used for videophone calls, recording, and playing sound, etc. as well as voice calls. Moreover, the housings 1800 and 1801 in a state where they are developed as illustrated in FIG. 20B can be slided so that one is lapped over the other; therefore, the size of the portable information terminal can be reduced, which makes the portable information terminal suitable for being carried.

The external connection terminal 1808 can be connected to an AC adapter and various types of cables such as a USB cable, which enables charging and data communication with a personal computer or the like. Further, a storage medium can be inserted into the external memory slot 1811 so that a large amount of data can be stored and can be moved.

Further, in addition to the above functions, an infrared communication function, a television reception function, or the like may be provided.

Figure 21A:
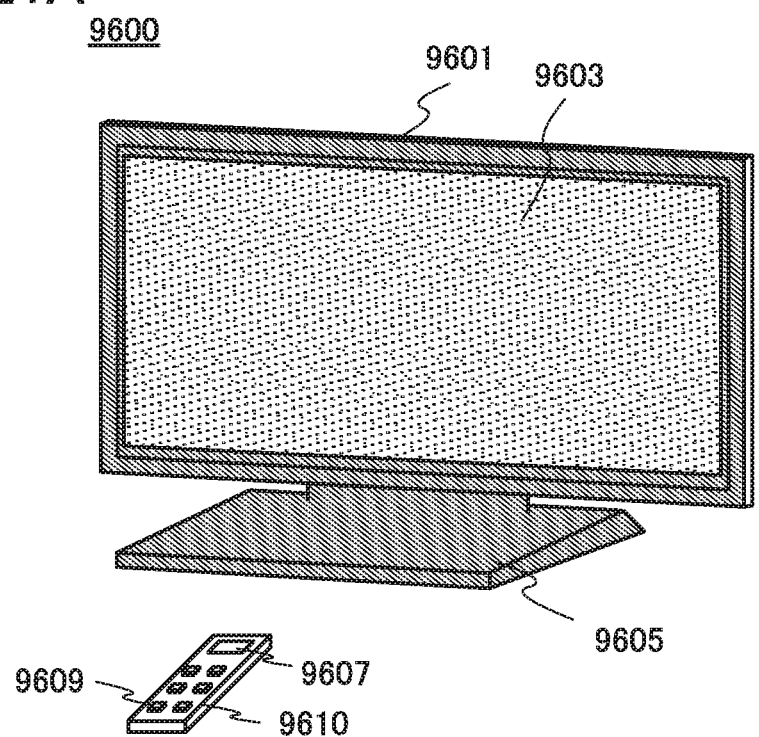
FIGS. 21A and 21B illustrate electronic appliances.

FIG. 21A illustrates an example of a television set 9600. In the television set 9600, a display portion 9603 is incorporated in a housing 9601. The display portion 9603 can display images. In this embodiment, the housing 9601 is supported by a stand 9605.

The television set 9600 can be operated with an operation switch of the housing 9601 or a separate remote controller 9610. Channels and volume can be controlled with an operation key 9609 provided for the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

In the display portion 9603, the plurality of thin film transistors described in Embodiment 1 is provided as switching elements of pixels.

Figure 21B:
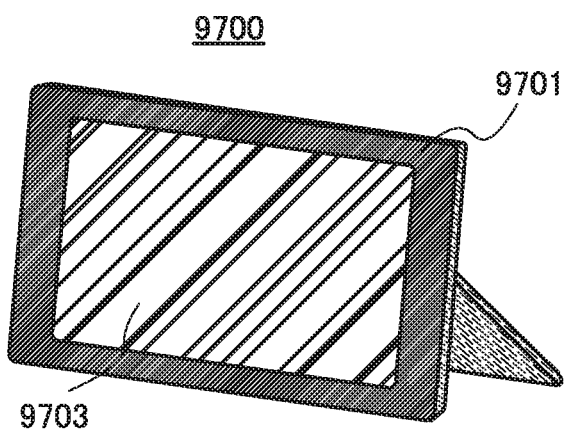

FIG. 21B illustrates an example of a digital photo frame 9700. For example, in the digital photo frame 9700, a display portion 9703 is incorporated in a housing 9701. The display portion 9703 can display a variety of images. For example, the display portion 9703 can display image data taken with a digital camera or the like and function as a normal photo frame In the display portion 9703, the plurality of thin film transistors described in Embodiment 1 is provided as switching elements of pixels.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 22:
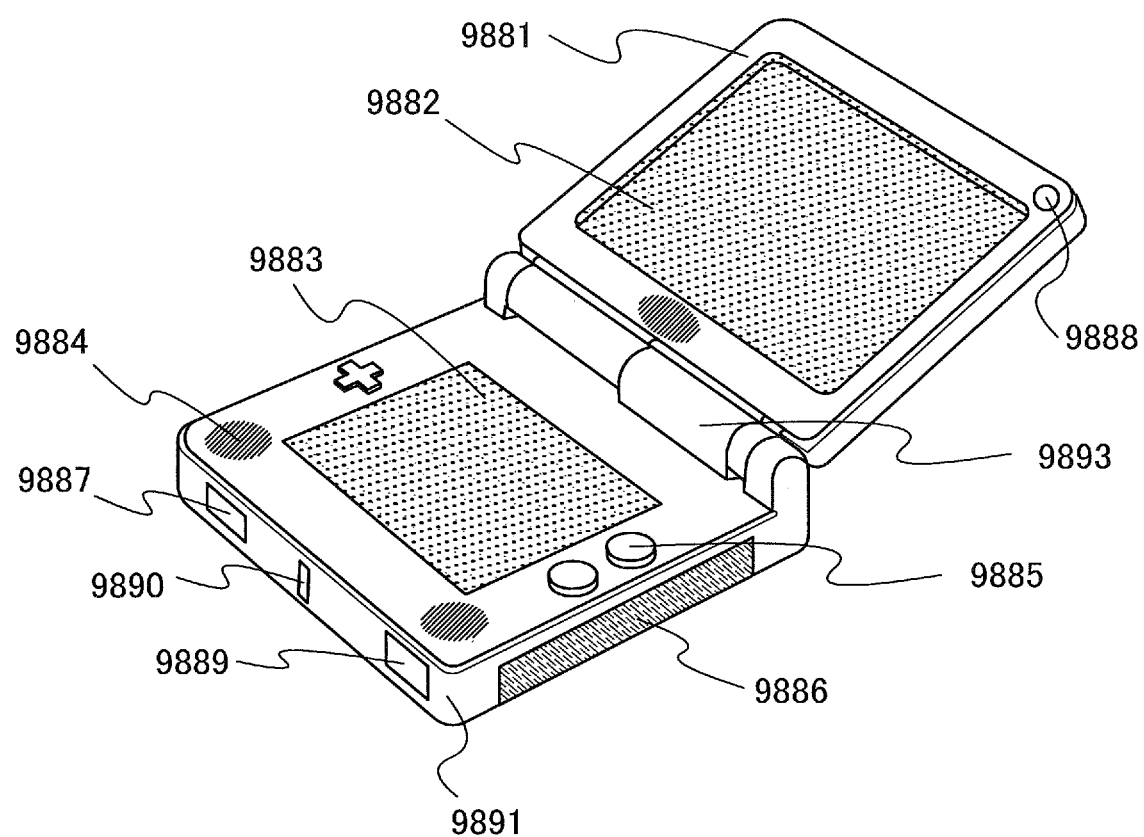
FIG. 22 illustrates an electronic appliance.

FIG. 22 is a portable amusement machine including two housings, a housing 9881 and a housing 9891, which are connected by a connection portion 9893 at which they can be folded. A display portion 9882 and a display portion 9883 are incorporated in the housing 9881 and the housing 9891, respectively.

In the display portion 9883, the plurality of thin film transistors described in Embodiment 1 is provided as switching elements of pixels.

In addition, the portable amusement machine illustrated in FIG. 22 further includes a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. It is needless to say that the structure of the portable amusement machine is not limited to the above and other structures provided with at least the thin film transistor disclosed in this specification can be employed. The portable amusement machine may include other accessory equipment as appropriate. The portable amusement machine illustrated in FIG. 22 has a function of reading a program or data stored in the recording medium to display on the display portion, and/or a function of sharing information with another portable amusement machine by wireless communication. The function of the portable amusement machine in FIG. 22 is not limited to those described above, and a variety of functions can be provided.

Figure 24:
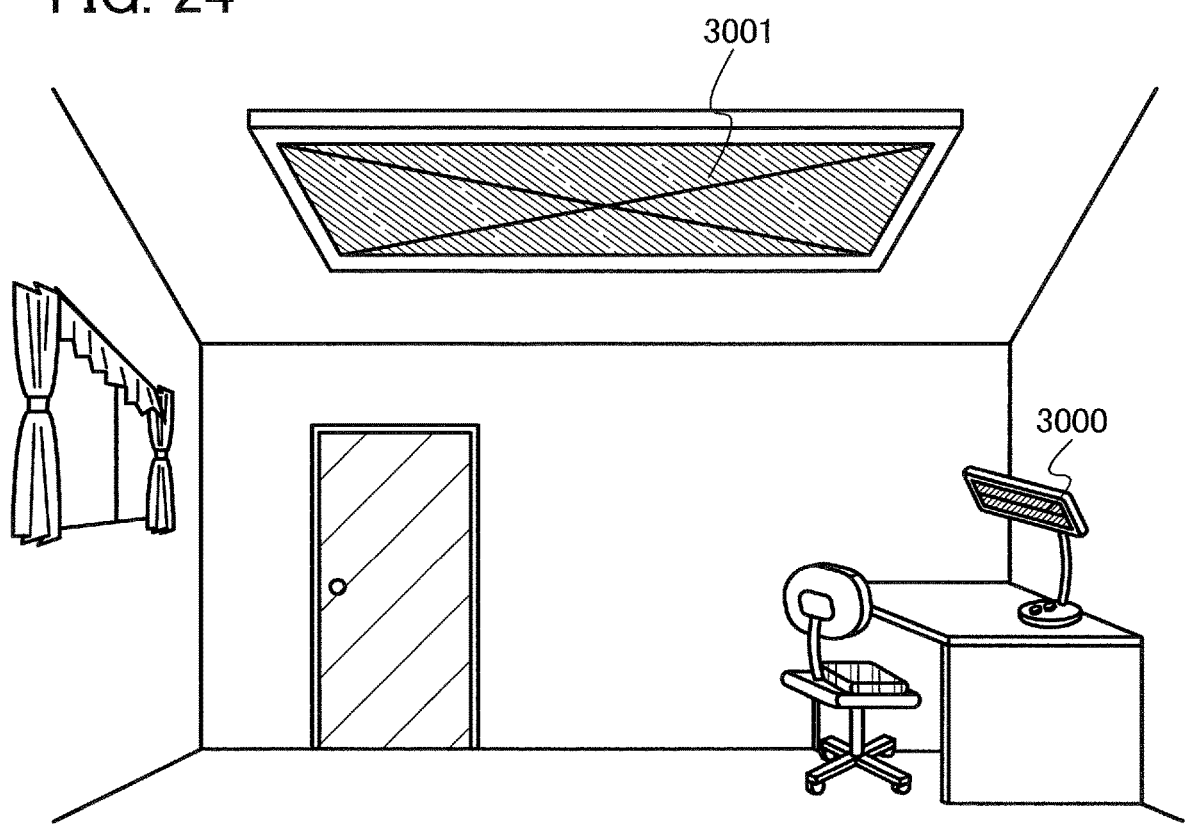
FIG. 24 illustrates electronic appliances.

FIG. 24 is an example in which the light-emitting device formed in accordance with the above embodiment is used as an indoor lighting device 3001. Since the light-emitting device described in Embodiment 4 or 5 can be increased in area, the light-emitting device can be used as a lighting device having a large area. Further, the light-emitting device described in the above embodiment can be used as a desk lamp 3000. Note that the lighting equipment includes in its category, a ceiling light, a desk lamp, a wall light, a lightning for an inside of a car, a guide light, and the like.

As described above, the thin film transistor described in any one of Embodiments 1 to 7 can be provided in display panels of such a variety of electronic appliances. A highly reliable electronic appliance can be provided by using the thin film transistor as a switching element of the display panel.

Embodiment 13

A semiconductor device disclosed in this specification can be applied as an electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. An example of such an electronic appliance is illustrated in FIG. 23.

Figure 23:
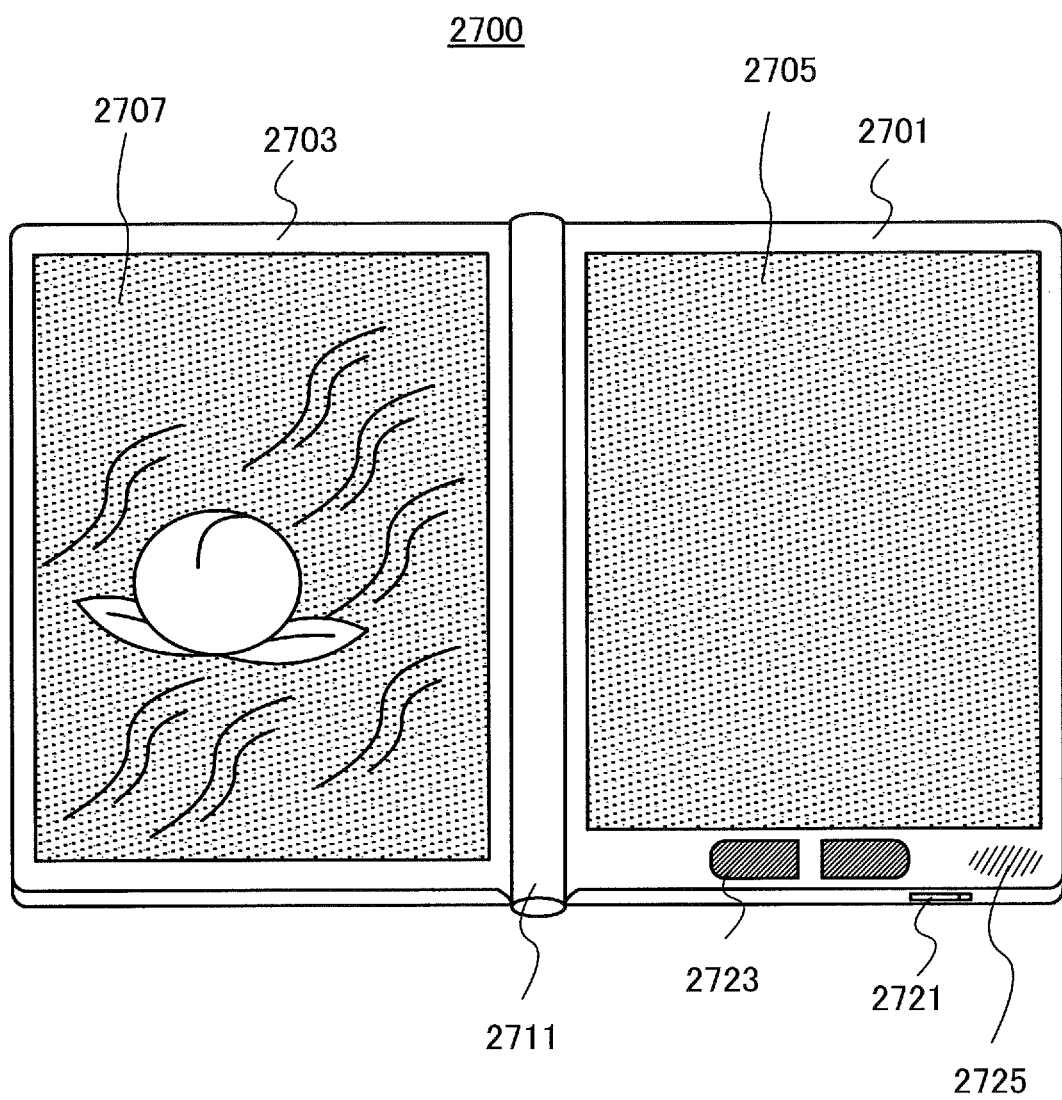
FIG. 23 illustrates an electronic appliance.

FIG. 23 illustrates an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where the display portions display different images from each other, for example, the right display portion (the display portion 2705 in FIG. 23) can display text and the left display portion (the display portion 2707 in FIG. 23) can display images.

FIG. 23 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function as an electronic dictionary.

The e-book reader 2700 may have a structure capable of wirelessly transmitting and receiving data. Through wireless communication, desired book data or the like can be purchased and downloaded from an electronic book server.

This embodiment can be implemented combining with another embodiment as appropriate.

This application is based on Japanese Patent Application serial No. 2009-214485 filed with Japan Patent Office on Sep. 16, 2009, the entire contents of which are hereby incorporated by reference.

EXPLANATION OF REFERENCE

81: multi-tone mask; 81*a*: gray-tone mask; 81*b*: half-tone mask; 83: light-transmitting substrate; 84: light-blocking portion; 85: diffraction grating; 86: light transmittance; 87: semi-light-transmitting portion; 88: light-blocking portion; 89: light transmittance; 400: substrate; 402: gate insulating layer; 403: protective insulating layer; 407: oxide insulating layer; 408: protective insulating layer; 409: planarization insulating layer; 410: thin film transistor; 411: gate electrode layer; 412: oxide semiconductor layer; 413: channel formation region; 421: gate wiring layer; 422: source wiring layer; 423: source wiring layer; 427: pixel electrode layer; 430: thin film transistor; 431: gate electrode layer; 432: oxide semiconductor layer; 433: channel formation region; 437: wiring layer; 438: wiring layer; 440: oxide semiconductor film; 441: oxide semiconductor layer; 450: thin film transistor; 451: gate electrode layer; 452: oxide semiconductor layer; 453: channel formation region; 456: oxide insulating layer; 459: oxide insulating layer; 460: resist mask; 461: oxide semiconductor layer; 462: metal conductive layer; 465: oxide semiconductor film; 466: metal conductive film; 469: thin film transistor; 471: gate electrode layer; 472: oxide semiconductor layer; 480: thin film transistor; 481: gate electrode layer; 483: channel formation region; 484*a*: high-resistance source region; 484*b*: high-resistance drain region; 485*a*: source electrode layer; 485*b*: drain electrode layer; 487*a*: wiring layer; 487*b*: wiring layer; 488*a*: wiring layer; 488*b*: wiring layer; 492*a*: gate insulating layer; 492*b*: gate insulating layer; 497*a*: oxide insulating layer; 497*b*: oxide insulating layer; 498: protective insulating layer; 580: substrate, 581: thin film transistor; 583: oxide insulating layer; 584: protective insulating layer; 585: insulating layer; 587: first electrode layer; 587: second electrode layer; 589*a*: wiring layer; 589*b*: wiring layer; 590*a*: black region; 590*b*: white region; 594: cavity; 595: filler; 596: counter substrate; 600: substrate; 601: counter substrate; 602: gate wiring; 603: gate wiring; 606: gate insulating layer; 616: drain electrode layer; 618: drain electrode layer; 619: drain electrode layer; 620: insulating layer; 622: insulating layer; 623: contact hole; 624: pixel electrode layer; 625: slit; 626: pixel electrode layer; 627: contact hole; 628: TFT; 629: TFT; 632: light-blocking film; 636: coloring film; 637: planarization film; 640: counter electrode layer; 641: slit; 650: liquid crustal layer; 660: contact hole; 661: contact hole; 662: wiring layer; 663: wiring layer; 690: capacitor wiring; 1100: mobile phone handset; 1101: housing; 1102: display portion; 1103: operation button; 1104: external connection port; 1105: speaker; 1106: microphone; 1800: housing; 1801: housing; 1802: display panel; 1803: speaker; 1804: microphone; 1805: operation key; 1806: pointing device; 1807: camera lens; 1808: external connection terminal; 1810: keyboard; 1811: external memory slot; 2700: e-book reader; 2701: housing; 2703: housing; 2705: display portion; 2707: display portion; 2711: hinge; 2721: power switch; 2723: operation key; 2725: speaker; 3000: desk lamp; 3001: lighting device; 4001: first substrate; 4002: pixel portion; 4003: signal line driver circuit; 4004: scan line driver circuit; 4005: sealant; 4006: second substrate; 4008: liquid crystal layer; 4010: thin film transistor; 4011: thin film transistor, 401.3:

liquid crystal element; 4015: connection terminal electrode; 4016: terminal electrode; 4018: FPC; 4019: anisotropic conductive film; 4021: insulating layer; 4030: pixel electrode layer; 4031: counter electrode layer, 4032: insulating layer; 4040: conductive layer; 4041: insulating layer; 4042: protective insulating layer; 4050: wiring layer, 4501: first substrate; 4502: pixel portion; 4503*a*: signal line driver circuit; 4503*b*: signal line driver circuit; 4504*a*: scan line driver circuit; 4504*b*: scan line driver circuit; 4505: sealant; 4506: second substrate; 4507: filler; 4509: thin film transistor; 4510: thin film transistor; 4511: light-emitting element; 4512: electroluminescent layer; 4513: second electrode; 4515: connection terminal electrode; 4516: terminal electrode; 4517: first electrode; 4518*a*: FPC; 4518*b*: FPC; 4519: anisotropic conductive film; 4520: partition wall; 4540: conductive layer; 4542: oxide insulating layer; 4543: overcoat layer; 4544: insulating layer; 4545: color filter layer; 4550: wiring layer; 4551: insulating layer; 6400: pixel; 6401: switching transistor; 6402: driving transistor; 6403: capacitor; 6404: light-emitting element; 6405: signal line; 6406: scan line; 6407: power supply line; 6408: common electrode; 7001: driving TFT; 7002: light-emitting element; 7003: first electrode; 7004: EL layer; 7005: second electrode; 7008*a*: wiring layer; 7008*b*: wiring layer; 7009: partition wall; 7011: driving ITT; 7012: light-emitting element; 7013: first electrode; 7014: EL layer; 7015: second electrode; 7016: shielding film; 7017: conductive film; 7018*a*: wiring layer; 7018*b*: wiring layer; 7019: partition wall; 7021: driving TFT; 7022: light-emitting element; 7023: first electrode; 7024: EL layer; 7025: second electrode; 7027: conductive film; 7028*a*: wiring layer; 7028*b*: wiring layer; 7029: partition wall; 7031: insulating layer; 7032: insulating layer; 7033: color filter layer; 7034: overcoat layer; 7035: protective insulating layer; 7036: planarization insulating layer; 7042: insulating layer; 7043: color filter layer; 7044: overcoat layer; 7045: protective insulating layer; 7046: planarization insulating layer; 7051: oxide insulating layer; 7052: protective insulating layer; 7053: planarization insulating layer; 7055: insulating layer; 7056: planarization insulating layer; 9600: television set; 9601: housing; 9603: display portion; 9605: stand; 9607: display portion; 9609: operation key; 9610: remote controller; 9700: digital photo frame; 9701: housing; 9703: display portion; 9881: housing; 9882: display portion; 9883: display portion; 9884: speaker portion; 9885: operation key; 9886: recording medium insertion portion; 9887: connection terminal; 9888: sensor; 9889: microphone; 9890: LED lamp; 9891: housing; 9893: connection portion

The invention claimed is:

1. A semiconductor device comprising:
a gate electrode;
an oxide semiconductor layer comprising a channel formation region;
a gate insulating layer between the gate electrode and the oxide semiconductor layer; and
source and drain electrodes in electrical contact with the oxide semiconductor layer,
wherein the oxide semiconductor layer comprises indium, gallium, zinc, and oxygen,
wherein the oxide semiconductor layer is over the gate electrode,
wherein the channel formation region of the oxide semiconductor layer comprises a crystalline portion with a grain diameter greater than or equal to 2 nm and less than or equal to 4 nm,
wherein each of the source and drain electrodes comprises copper, and
wherein the gate electrode comprises copper.

2. A semiconductor device comprising:
a gate electrode;
an oxide semiconductor layer;
a gate insulating layer between the gate electrode and the oxide semiconductor layer; and
source and drain electrodes in electrical contact with the oxide semiconductor layer,
wherein the oxide semiconductor layer comprises indium, gallium, zinc, and oxygen,
wherein the oxide semiconductor layer is over the gate electrode, and
wherein the oxide semiconductor layer comprises a crystalline portion with a grain diameter greater than or equal to 2 nm and less than or equal to 4 nm,
wherein each of the source and drain electrodes comprises copper, and
wherein the gate electrode comprises copper.

* * * * *